(12) United States Patent  
Tachibana et al.

(10) Patent No.: US 6,714,151 B2
(45) Date of Patent: Mar. 30, 2004

(54) A/D CONVERTER

(75) Inventors: Suguru Tachibana, Kawasaki (JP); Tatsuo Kato, Kawasaki (JP); Hideo Nunokawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/465,549

(22) Filed: Jun. 20, 2003

(65) Prior Publication Data

US 2003/0234736 A1 Dec. 25, 2003

(30) Foreign Application Priority Data

Jun. 21, 2002 (JP) .......................... 2002-181742
Aug. 9, 2002 (JP) .......................... 2002-233561

(51) Int. Cl.[7] .............................................. H03M 1/12
(52) U.S. Cl. ..................... 341/155; 341/144; 341/145; 341/172
(58) Field of Search ................. 341/156, 118, 341/172, 155, 144, 145, 150, 154

(56) References Cited

U.S. PATENT DOCUMENTS 4,200,863 A * 4/1980 Hodges et al. .............. 341/156
4,369,433 A * 1/1983 Yamakido .................. 341/150
4,388,612 A * 6/1983 Takagi et al. ............... 341/145
5,258,761 A * 11/1993 Fotouhi et al. ............. 341/172
5,416,485 A * 5/1995 Lee ............................ 341/172

FOREIGN PATENT DOCUMENTS

| JP | 57-055614 | 4/1982 |
|----|-----------|--------|
| JP | 59-163913 | 9/1984 |
| JP | 10-070463 | 3/1998 |

* cited by examiner

Primary Examiner—Brian Young
Assistant Examiner—John B Nguyen
(74) Attorney, Agent, or Firm—Arent Fox Kintner Plotkin & Kahn

(57) ABSTRACT

An A/D converter includes a capacitor type D/A conversion circuit including a capacitor array constituted of a plurality of capacitors for sampling an input potential and storing electric charge, a first resistor type D/A conversion circuit for generating a desired potential by potential division, a second resistor type D/A conversion circuit for generating a desired potential by potential division, a first signal path for adding an output of the first resistor type D/A conversion circuit to an output of the capacitor type D/A conversion circuit by capacity coupling; a second signal path for adding an output of the second resistor type D/A conversion circuit to an output of the capacitor type D/A conversion circuit by capacity coupling, and a comparing circuit for determining whether an output potential of the capacitor type D/A conversion circuit is higher or lower than an input potential, and thereby the circuit with processing time of A/D conversion being shortened can be provided.

26 Claims, 26 Drawing Sheets

FIG. 3
PRIOR ART

| INPUT CODE | | OUTPUT VOLTAGE (xVref/16) |
|---|---|---|
| DECIMAL | BINARY | |
| 0 | 0000 | 0 |
| 1 | 0001 | 1 |
| 2 | 0010 | 2 |
| 3 | 0011 | 3 |
| 4 | 0100 | 4 |
| 5 | 0101 | 5 |
| 6 | 0110 | 6 |
| 7 | 0111 | 7 |
| 8 | 1000 | 8 |
| 9 | 1001 | 9 |
| 10 | 1010 | 10 |
| 11 | 1011 | 11 |
| 12 | 1100 | 12 |
| 13 | 1101 | 13 |
| 14 | 1110 | 14 |
| 15 | 1111 | 15 |

F I G. 9
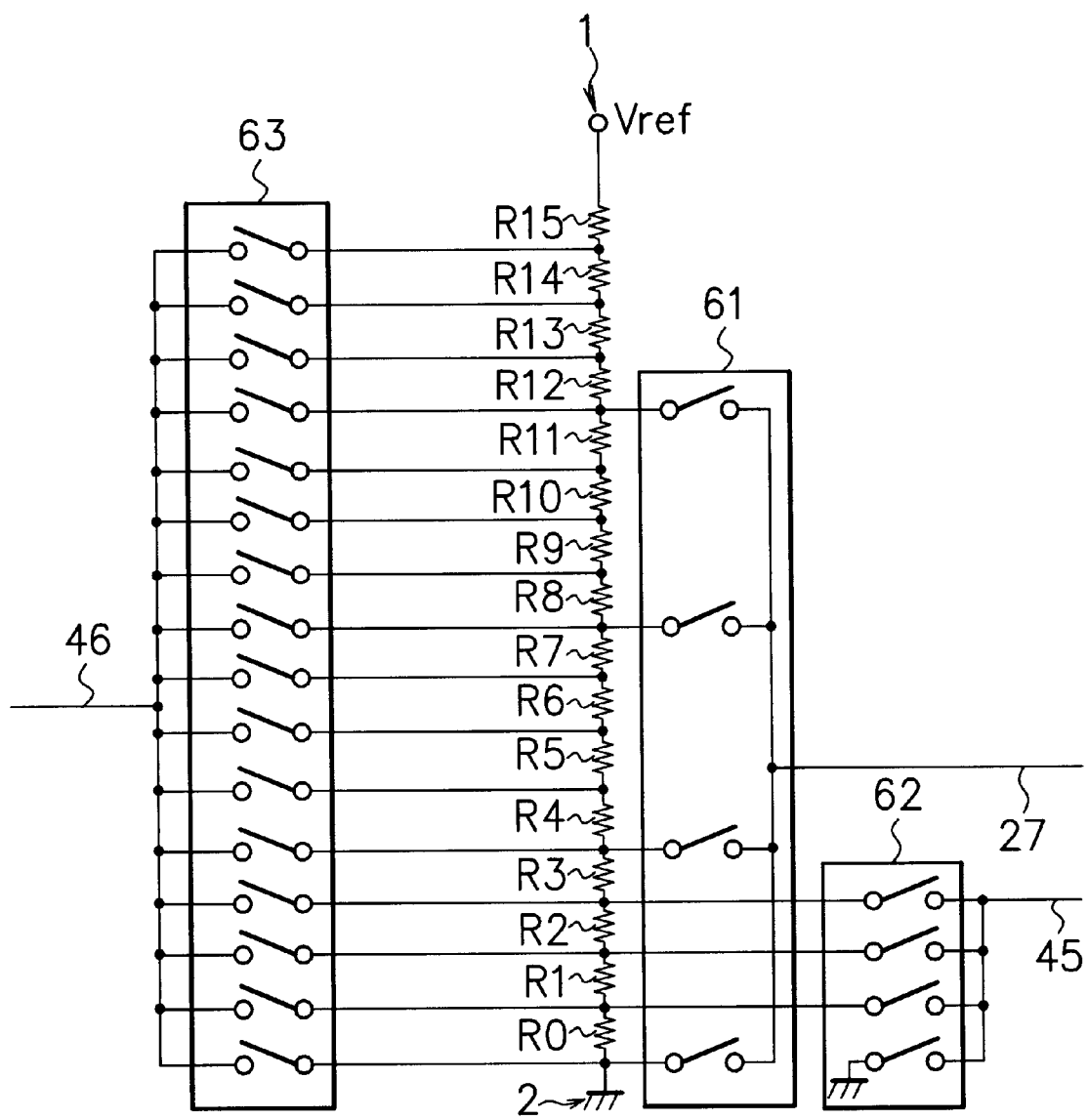

F I G. 10
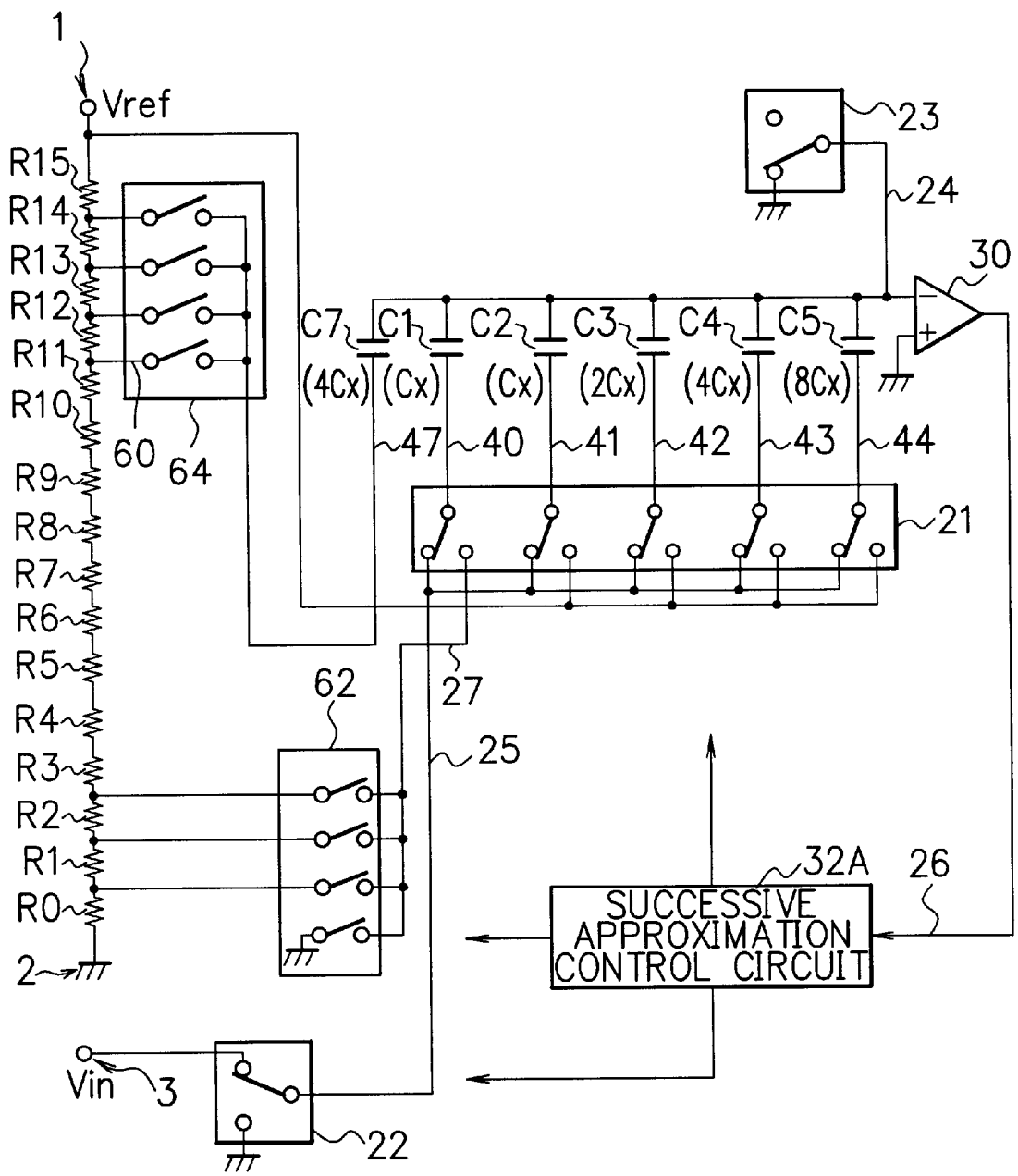

| INPUT CODE | | OUTPUT VOLTAGE (xVref/16) | | (L6+L8) |
|---|---|---|---|---|
| DECIMAL | BINARY (SAR) | OUTPUT L6 | OUTPUT L8 | |
| 0 | 0000 | 0 | 0 | 0 |
| 1 | 0001 | 1 | 0 | 1 |
| 2 | 0010 | 2 | 0 | 2 |
| 3 | 0011 | 3 | 0 | 3 |
| 4 | 0100 | 0 | 4 | 4 |
| 5 | 0101 | 1 | 4 | 5 |
| 6 | 0110 | 2 | 4 | 6 |
| 7 | 0111 | 3 | 4 | 7 |
| 8 | 1000 | 4 | 4 | 8 |
| 9 | 1001 | 5 | 4 | 9 |
| 10 | 1010 | 5 | 5 | 10 |
| 11 | 1011 | 0 | 11 | 11 |
| 12 | 1100 | 0 | 12 | 12 |
| 13 | 1101 | 1 | 12 | 13 |
| 14 | 1110 | 2 | 12 | 14 |
| 15 | 1111 | 3 | 12 | 15 |

F I G. 14
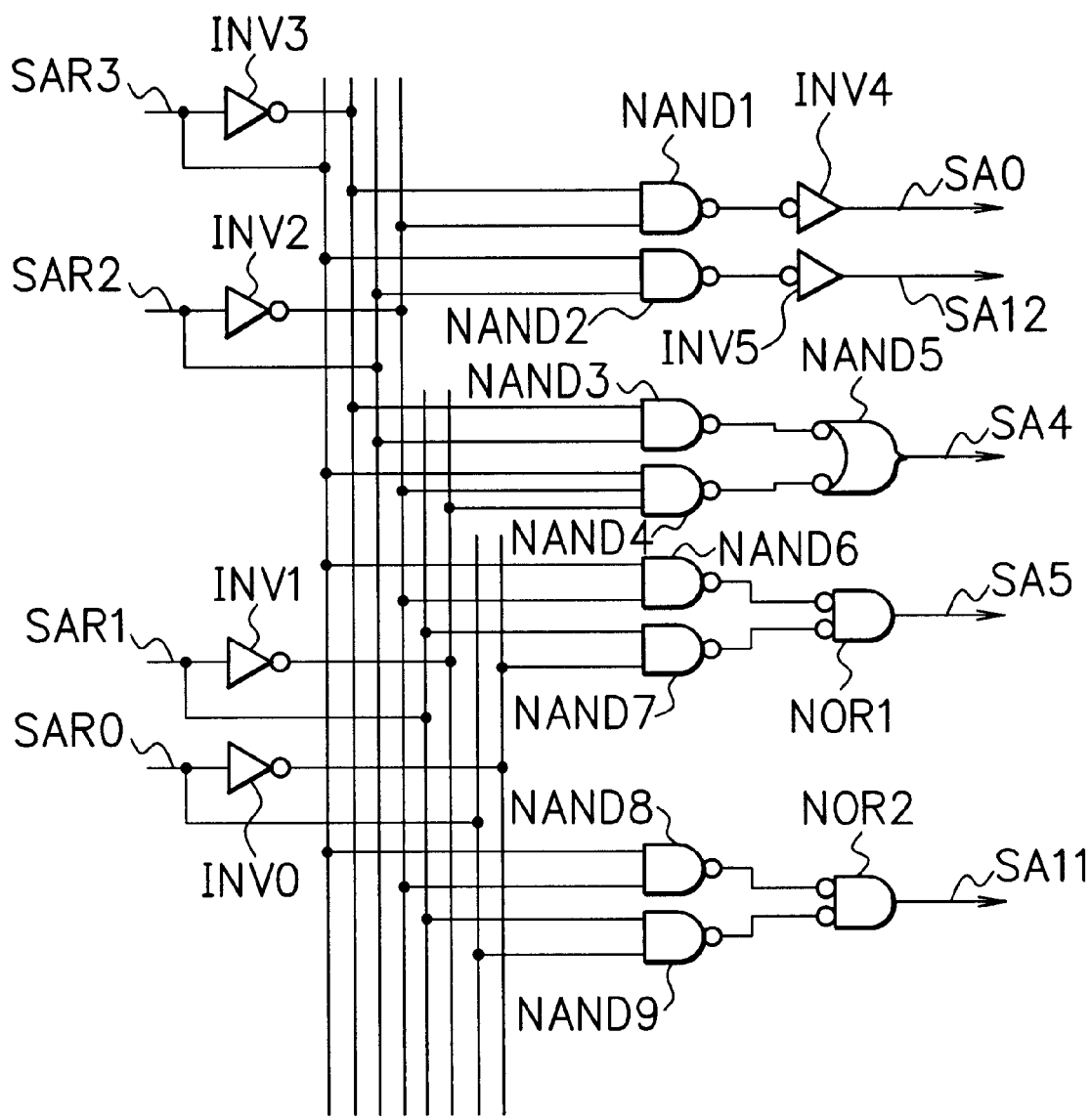

F I G. 15
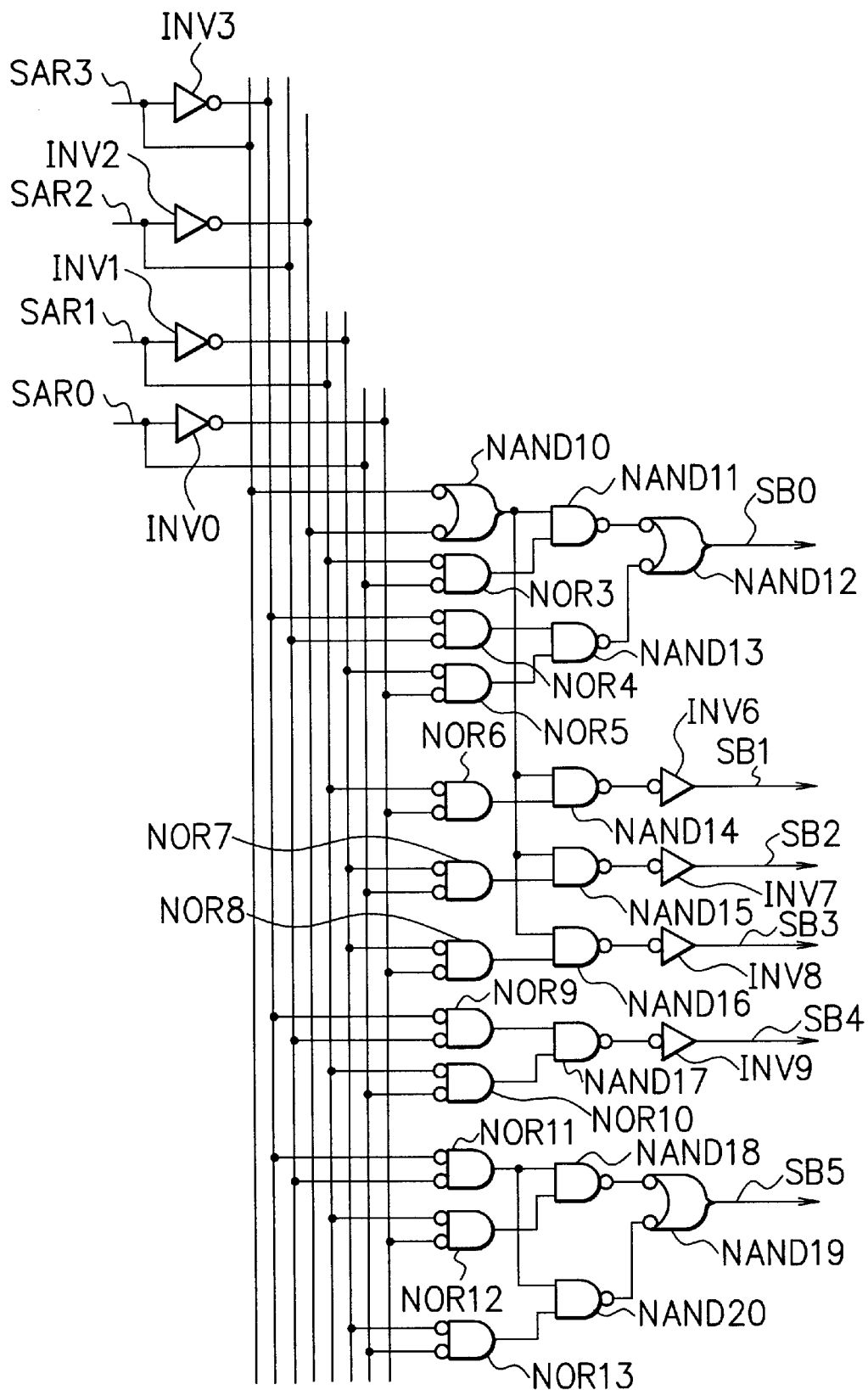

FIG. 17

| INPUT CODE | | OUTPUT VOLTAGE (xVref/16) | | (L11x2+L12) |
|---|---|---|---|---|
| DECIMAL | BINARY | OUTPUT L11 | OUTPUT L12 | |
| 0 | 0000 | 0 | 0 | 0 |
| 1 | 0001 | 0 | 1 | 1 |
| 2 | 0010 | 0 | 2 | 2 |
| 3 | 0011 | 0 | 3 | 3 |
| 4 | 0100 | 2 | 0 | 4 |
| 5 | 0101 | 2 | 1 | 5 |
| 6 | 0110 | 2 | 2 | 6 |
| 7 | 0111 | 2 | 3 | 7 |
| 8 | 1000 | 4 | 0 | 8 |
| 9 | 1001 | 4 | 1 | 9 |
| 10 | 1010 | 4 | 2 | 10 |
| 11 | 1011 | 4 | 3 | 11 |
| 12 | 1100 | 5 | 2 | 12 |
| 13 | 1101 | 5 | 3 | 13 |
| 14 | 1110 | 5 | 4 | 14 |
| 15 | 1111 | 5 | 5 | 15 |

FIG. 19

| INPUT CODE | | OUTPUT VOLTAGE (xVref/16) | | (L21×2+L22) |
|---|---|---|---|---|
| DECIMAL | BINARY | OUTPUT L21 | OUTPUT L22 | |
| 0 | 0000 | 0 | 0 | 0 |
| 1 | 0001 | 0 | 1 | 1 |
| 2 | 0010 | 0 | 2 | 2 |
| 3 | 0011 | 0 | 3 | 3 |
| 4 | 0100 | 2 | 0 | 4 |
| 5 | 0101 | 2 | 1 | 5 |
| 6 | 0110 | 2 | 2 | 6 |
| 7 | 0111 | 2 | 3 | 7 |
| 8 | 1000 | 4 | 0 | 8 |
| 9 | 1001 | 4 | 1 | 9 |
| 10 | 1010 | 4 | 2 | 10 |
| 11 | 1011 | 4 | 3 | 11 |
| 12 | 1100 | 4 | 4 | 12 |
| 13 | 1101 | 0 | 13 | 13 |
| 14 | 1110 | 0 | 14 | 14 |
| 15 | 1111 | 0 | 15 | 15 |

FIG. 21

| INPUT CODE | | OUTPUT VOLTAGE (xVref/32) | | (L31+L32) |
|---|---|---|---|---|
| DECIMAL | BINARY | OUTPUT L31 | OUTPUT L32 | |
| 0 | 00000 | 0 | 0 | 0 |
| 1 | 00001 | 1 | 0 | 1 |
| 2 | 00010 | 2 | 0 | 2 |
| 3 | 00011 | 3 | 0 | 3 |
| 4 | 00100 | 0 | 4 | 4 |
| 5 | 00101 | 1 | 4 | 5 |
| 6 | 00110 | 2 | 4 | 6 |
| 7 | 00111 | 3 | 4 | 7 |
| 8 | 01000 | 0 | 8 | 8 |
| 9 | 01001 | 1 | 8 | 9 |
| 10 | 01010 | 2 | 8 | 10 |
| 11 | 01011 | 3 | 8 | 11 |
| 12 | 01100 | 2 | 10 | 12 |
| 13 | 01101 | 3 | 10 | 13 |
| 14 | 01110 | 4 | 10 | 14 |
| 15 | 01111 | 5 | 10 | 15 |
| 16 | 10000 | 6 | 10 | 16 |
| 17 | 10001 | 7 | 10 | 17 |
| 18 | 10010 | 8 | 10 | 18 |
| 19 | 10011 | 9 | 10 | 19 |
| 20 | 10100 | 10 | 10 | 20 |
| 21 | 10101 | 0 | 21 | 21 |
| 22 | 10110 | 1 | 21 | 22 |
| 23 | 10111 | 2 | 21 | 23 |
| 24 | 11000 | 0 | 24 | 24 |
| 25 | 11001 | 1 | 24 | 25 |
| 26 | 11010 | 2 | 24 | 26 |
| 27 | 11011 | 3 | 24 | 27 |
| 28 | 11100 | 0 | 28 | 28 |
| 29 | 11101 | 1 | 28 | 29 |
| 30 | 11110 | 2 | 28 | 30 |
| 31 | 11111 | 3 | 28 | 31 |

FIG. 23

| INPUT CODE | | OUTPUT VOLTAGE (xVref/32) | | (L41+L42) |
|---|---|---|---|---|
| DECIMAL | BINARY | OUTPUT L41 | OUTPUT L42 | |
| 0 | 00000 | 0 | 0 | 0 |
| 1 | 00001 | 1 | 0 | 1 |
| 2 | 00010 | 2 | 0 | 2 |
| 3 | 00011 | 3 | 0 | 3 |
| 4 | 00100 | 0 | 4 | 4 |
| 5 | 00101 | 1 | 4 | 5 |
| 6 | 00110 | 2 | 4 | 6 |
| 7 | 00111 | 3 | 4 | 7 |
| 8 | 01000 | 0 | 8 | 8 |
| 9 | 01001 | 1 | 8 | 9 |
| 10 | 01010 | 2 | 8 | 10 |
| 11 | 01011 | 3 | 8 | 11 |
| 12 | 01100 | 0 | 12 | 12 |
| 13 | 01101 | 1 | 12 | 13 |
| 14 | 01110 | 2 | 12 | 14 |
| 15 | 01111 | 3 | 12 | 15 |
| 16 | 10000 | 8 | 8 | 16 |
| 17 | 10001 | 9 | 8 | 17 |
| 18 | 10010 | 10 | 8 | 18 |
| 19 | 10011 | 11 | 8 | 19 |
| 20 | 10100 | 0 | 20 | 20 |
| 21 | 10101 | 1 | 20 | 21 |
| 22 | 10110 | 2 | 20 | 22 |
| 23 | 10111 | 3 | 20 | 23 |
| 24 | 11000 | 0 | 24 | 24 |
| 25 | 11001 | 1 | 24 | 25 |
| 26 | 11010 | 2 | 24 | 26 |
| 27 | 11011 | 3 | 24 | 27 |
| 28 | 11100 | 0 | 28 | 28 |
| 29 | 11101 | 1 | 28 | 29 |
| 30 | 11110 | 2 | 28 | 30 |
| 31 | 11111 | 3 | 28 | 31 |

FIG. 25

| INPUT CODE | | OUTPUT VOLTAGE (xVref/32) | | (L51x2+L52) |
|---|---|---|---|---|
| DECIMAL | BINARY | OUTPUT L51 | OUTP5T L52 | |
| 0 | 00000 | 0 | 0 | 0 |
| 1 | 00001 | 0 | 1 | 1 |
| 2 | 00010 | 0 | 2 | 2 |
| 3 | 00011 | 0 | 3 | 3 |
| 4 | 00100 | 2 | 0 | 4 |
| 5 | 00101 | 2 | 1 | 5 |
| 6 | 00110 | 2 | 2 | 6 |
| 7 | 00111 | 2 | 3 | 7 |
| 8 | 01000 | 4 | 0 | 8 |
| 9 | 01001 | 4 | 1 | 9 |
| 10 | 01010 | 4 | 2 | 10 |
| 11 | 01011 | 4 | 3 | 11 |
| 12 | 01100 | 6 | 0 | 12 |
| 13 | 01101 | 6 | 1 | 13 |
| 14 | 01110 | 6 | 2 | 14 |
| 15 | 01111 | 6 | 3 | 15 |
| 16 | 10000 | 8 | 0 | 16 |
| 17 | 10001 | 8 | 1 | 17 |
| 18 | 10010 | 8 | 2 | 18 |
| 19 | 10011 | 8 | 3 | 19 |
| 20 | 10100 | 8 | 4 | 20 |
| 21 | 10101 | 8 | 5 | 21 |
| 22 | 10110 | 8 | 6 | 22 |
| 23 | 10111 | 8 | 7 | 23 |
| 24 | 11000 | 0 | 24 | 24 |
| 25 | 11001 | 0 | 25 | 25 |
| 26 | 11010 | 0 | 26 | 26 |
| 27 | 11011 | 0 | 27 | 27 |
| 28 | 11100 | 2 | 24 | 28 |
| 29 | 11101 | 2 | 25 | 29 |
| 30 | 11110 | 2 | 26 | 30 |
| 31 | 11111 | 2 | 27 | 31 |

A/D CONVERTER

CROSS-REFERENCE TO RELATED APPLICATION

The application is based upon and claims the benefit of priority from the prior Japanese Patent Application Nos. 2002-233561, filed on Aug. 9, 2002 and 2002-181742, filed on Jun. 21, 2002, the entire contents of which are incorporated herein by reference.

BACKGROUND OF THE INVENTION

1. Field of the Invention

The present invention relates to an A/D converter (analog/digital converter) for converting an inputted analog signal into a digital signal, and is particularly suitable for being used for a successive approximation type A/D converter for converting an analog signal into a digital signal by a successive comparison operation.

2. Description of the Related Art

A successive approximation type A/D converter is presently known as an A/D converter, which can be realized with a simple circuit constitution and produced at comparatively low cost with high matching property with a CMOS process, requires less time for A/D conversion that is the conversion processing from an analog signal to a digital signal, and has a wide range of product uses. In the successive approximation type A/D converters, the one using a double stage DAC (a D/A converter: a digital/analog converter) for converting a comparison digital signal into a comparison analog signal can realize an A/D converter (: an analog/digital converter) with high resolution in a small mounting area.

A successive approximation type A/D converter using the double stage DAC is constituted of a double stage DAC constituted of a main DAC for deciding a most significant bit (MSB) side and a sub DAC for deciding a least significant bit (LSB) side, a comparator circuit, and a control circuit (control method) called an "SAR (successive approximation register)". At first, an analog potential set by the main DAC and an input analog potential are compared, whereby high-order bits are decided. The analog potential set by the main DAC corresponding to the decided high-order bits and the analog potential set by the sub DAC are added, and a sum of them and the inputted analog potential are compared, whereby low-order bits are decided.

The double stage DACs are broadly divided into four constitutions (the main DAC+the sub DAC) as shown below depending on whether the main DAC and the sub DAC are realized by capacitor arrays, or resistor strings.

(1) Capacitor array+capacitor array type (hereinafter, called C-C type)
(2) Resistor string+capacitor array type (hereinafter, called R-C type)
(3) Capacitor array+resistor string type (hereinafter, called C-R type)
(4) Resistor string+resistor string type (hereinafter, called R-R type)

Constitution examples of a successive approximation type A/D converter using a C-R type double stage DAC are disclosed in, for example, Japanese Patent Laid-open No. 59-163913 and Japanese Patent Laid-open No. 57-55614.

A conventional successive approximation type A/D converter using a C-R type double stage DAC will be explained hereinafter.

FIG. 1 is a diagram showing a circuit constitution of the conventional successive approximation type A/D converter.

The successive approximation type A/D converter in FIG. 1 includes an input terminal 3 to which an input potential Vin is applied, nodes 24 to 27, nodes 40 to 44, a switch circuit 21, a switch circuit 22, a switch circuit 23, a switch circuit 121, a comparator 30, a successive approximation control circuit 32', resistors R0 to R15, and capacitors C1 to C5. The successive approximation control circuit 32' controls an operation of each of the switch circuits 21, 22, 23, 121, and the like.

The resistors R0 to R15 and the switch circuit 121 constitute a 4-bit sub DAC, and the capacitors C1 to C5 and the switch circuit 21 (and 22 and 23) constitute a 4-bit main DAC. As for the capacitors C1 to C5 constituting the main DAC, if a capacitance value of each of C1 and C2 is assumed to be Cx, C3 is weighted to be 2Cx, C4 is weighted to be 4Cx and C5 is weighted to be 8Cx. To secure relative accuracy, the sampling capacitors C3 to C5 are generally realized by connecting, for example, two, four or eight of certain unit capacitors Cx in parallel.

When sampling is performed, all of the capacitors C1 to C5 are connected to an analog input terminal 3 (Vin) via the switch circuit 21, the node 25 and the switch circuit 22, and charged to the input potential Vin. In this situation, the switch 23 is controlled so that the node 24 is at GND.

After sampling is finished, a comparison operation is started, and digital data corresponding to the input potential Vin is decided in sequence from the MSB. More specifically, the switch 23 is opened to bring the node 24 into a floating state, for example, the nodes 40 to 43 are connected to the GND via the switches 21 and 22, and the node 44 is connected to a reference potential Vref (a terminal 1). By the connection, electric charge stored by the input potential Vin at the sampling time is redistributed to the sampling capacitors C1 to C5, and a potential of the node 24 becomes (Vref/2−Vin) The node 24 is connected to an input of the comparator 30, and it can be determined according to a potential of the node 26 being an output of the comparator 30 whether the analog input potential Vin is larger or smaller than ½ of the reference potential Vref.

In the above-described connection, the node 44 is connected to the reference potential Vref, and the other nodes 40 to 43 are connected to the GND. Namely, 8Cx of C5 are connected to the reference potential Vref, and the sum total of 8Cx of the remaining C1 to C4 are connected to the GND. Generally, when the number of unit capacitors Cx connected to the reference potential Vref is assumed to be m, and the number of the remaining unit capacitors Cx connected to the GND is assumed to be (16−m), the potential Vx of the node 24 is $Vx=(m/16)Vref-Vin.$ For example, when the node 41 is connected to Vref, and the remaining nodes 40, 42, 43 and 44 are connected to the GND, m equals 1, and therefore the potential of the node 24 is (Vref/16−Vin).

Accordingly, by successively changing m, it is possible to change the potential of the node 24 successively in increments of Vref/16, and the MSB side of the digital data (high-order 4 bits) can be decided.

Next, with m that is decided as described above being assumed to be m', m' of the unit capacitors Cx out of C2 to C5 are connected to the reference potential Vref, the remaining (15−m') of the unit capacitors Cx out of C2 to Cs are connected to the GND, and the node 40 of one of the unit capacitor Cx of C1 is connected to the sub DAC (R0 to R15, and the switch circuit 121). The potential of the node 40 is changed in increments of Vref/16 by the sub DAC, whereby the potential of the comparator input 24 can be changed in increments of Vref/256. Consequently, the LSB side of the digital data (low-order 4 bits) is decided, and 8-bit digital data in total can be obtained.

FIG. 2 is a diagram showing another circuit constitution of the conventional successive approximation type A/D converter.

In FIG. 2, capacitors C1 to C5 and a switch group 21 (switches SWC1 to SWC5) constitute a capacitor type DAC (main DAC) with 4-bit accuracy, and resistors R0 to R15 and a selector 121 constitute a resistor type DAC (sub DAC) with 4-bit accuracy. As for the capacitors C1 to C5, if the capacitance value of each of the capacitors C1 and C2 is Cx, a capacitance value of the capacitor C3 is weighted to 2Cx, a capacitance value of the capacitor C4 is weighted to 4Cx (=$2^2$Cx), and a capacitance value of the capacitor C5 is weighted to 8Cx (=$2^3$Cx) The capacitors C3, C4 and C5 are generally constituted by connecting, for example, two, four, and eight of the unit capacitors Cx in parallel, respectively, to secure relative accuracy. Resistance values of the resistors R0 to R15 are equal to each other.

When the successive approximation type A/D converter shown in FIG. 2 converts an analog input signal inputted from an input terminal 3 into digital data, it firstly performs sampling of the potential Vin of the inputted analog input signal, and charges the capacitors C1 to C5 according to the potential Vin. In this situation, a successive approximation control circuit 32 controls the switch group 21 and a switch 22 according to control signals S2 and S3, whereby one ends of the capacitors C1 to C5 are connected to the input terminal 3 via lines L1 to L5, the switch group 21 and the line L7.

The successive approximation control circuit 32 controls a switch NM1 according to a control signal SPL1. The control of the switch NM1 is performed such that the switch NM1 is in an ON state, and a potential Vx of an input node 4 is equal to a logical threshold voltage VTL of a comparator 31.

As described above, the potential Vx of the node 4 is made the logical threshold voltage VTL, and the potential Vin of the analog input signal is supplied to the one ends of the capacitors C1 to C5, whereby sampling of the potential Vin of the analog input signal is performed, and electric charge corresponding to the potential Vin is stored in the capacitors C1 to C5.

After sampling of the potential Vin of the analog input signal is finished, the successive approximation type A/D converter performs a comparison operation of sequentially deciding digital data for each bit from the most significant bit (MSB) to a low-order side.

The successive approximation control circuit 32 firstly sets the switch NM1 into an OFF state so that the potential Vx of the input node 4 is decided by redistributing the electrical charge, which are stored in the capacitors C1 to C5 by sampling, into the capacitors C1 to C5. The successive approximation control circuit 32 controls the switch group 21 and the switch 22 to connect the one ends of the capacitors C1 to C4 to the ground via the switch 22, and connect the one end of the capacitor C5 to a power supply terminal 1 for supplying the reference potential Vref. As a result, the electric charge stored in the capacitors C1 to C5 by sampling is redistributed, and the potential Vx of the input node 4 becomes (VTL+Vref/2−Vin).

The comparator 31 determines whether the potential Vx of the input node 4 is lower than the logical threshold voltage VTL or not, namely, whether the potential Vin is higher than the potential Vref/2 or not. As a result of the determination, when the potential Vin is higher than the potential Vref/2, the determination output S1 from the comparator 31 is at a high level ("H"), and when the potential Vin is lower than the potential Vref/2, the determination output S1 is at a low level ("L"). The successive approximation control circuit 32 decides a value of the MSB to be '1' when the determination output S1 is "H", and decides the value of the MSB to be '0' when the determination output S1 is "L".

When the decided value of the MSB is '1', the successive approximation control circuit 32 controls the switch group 21 and the switch 22 to connect the one ends of the capacitors C4 and C5 to the power supply terminal 1 and connect the one ends of the capacitors C1 to C3 to the ground. As a result, the potential Vx of the input node 4 becomes (VTL+3 Vref/4−Vin).

On the other hand, when the decided value of the MSB is '0', the successive approximation control circuit 32 controls the switch group 21 and the switch 22 to connect the one end of the capacitor C4 to the power supply terminal 1 and connect the one ends of the capacitors C1 to C3 and C5 to the ground.

As a result, the potential Vx of the input node 4 becomes (VTL+Vref/4−Vin).

Similarly to what is described above, the comparator 31 determines whether the potential Vx of the input node 4 is lower than the logical threshold voltage VTL or not, whereby the successive approximation control circuit 32 decides the value of the lower bit than the MSB by 1 bit.

Similarly, the successive approximation control circuit 32 controls the switch group 21 and the switch 22 to connect the one end of the capacitors C1 to C5 to the power supply terminal 1 or the ground according to the decided value of the bit. Then, the comparator 31 determines by comparison whether the potential Vx of the input node 4 is lower than the logical threshold voltage VTL of the comparator 31 or not, whereby the successive approximation control circuit 32 decides the digital data in sequence from the high order side.

Here, if, for example, the switch group 21 and the switch 22 are controlled, and the one ends of the capacitors C1 and C3 to C5 are connected to the ground, and the one end of the capacitor C2 is connected to the power supply terminal 1, the potential Vx of the input node 4 becomes (VTL+Vref/16−Vin). Namely, the capacitor type DAC (main DAC) of the successive approximation type A/D converter shown in FIG. 2 controls the switch group 21 by setting the capacitance value Cx, which is 1/16 of the total capacitance values 16Cx of the capacitors C1 to C5, as a unit, whereby it selectively connects one ends of the capacitors C1 to C5 to the power supply terminal 1 or the ground. As a result, the successive approximation type A/D converter shown in FIG. 2 can change the potential Vx of the input node 4 in increments of Vref/16 by the capacitor type DAC, and can decide high-order 4-bit digital data.

After the high-order 4-bit digital data is decided, the successive approximation control circuit 32 controls the switch group 21 and the switch 22 according to the decided value of high-order 4 bits to connect the one ends of the capacitors C2 to C5 to the power supply terminal 1, or the ground via the switch 22. Further, the successive approximation control circuit 32 controls a selector 121 according to corresponding relationship shown in FIG. 3 that will be described later to supply a potential corresponding to a digital code to the one end of the capacitor C1 via an output line L71 of the resistor type DAC, a switch SWC1 and the line L1.

FIG. 3 is a diagram showing corresponding relationship of an input digital code and a potential outputted via the output line L71 in the resistor type DAC shown in FIG. 2. As shown in FIG. 2, the resistors R0 to R15 with equal resistance values are connected in series between the power supply terminal 1 and the ground terminal 2, whereby the resistor type DAC can generate 16 potentials (Vref/16×n: n is an integer from 0 to 15) by changing the potential in increments of Vref/16 as shown in FIG. 3.

When the value of low-order 4 bits is decided, the successive approximation control circuit 32 only closes the switch in the selector 121, which is connected to an interconnection point of the resistor R7 and the resistor R8 at first, and controls the other switches in the selector 121 to open (input digital code "1000"). Then, in the state in which the potential of Vref/2 (8 Vref/16) is supplied to the one end of the capacitor C1, the potential Vx of the input node 4 and the logical threshold voltage VTL of the comparator 31 are compared and determined by the comparator 31.

As a result of comparison and determination, when the potential Vx of the input node 4 is lower than the logical threshold voltage VTL, the switch in the selector 121, which is connected to the interconnection point of the resistor R11 and the resistor R12, is closed, and the other switches in the selector 121 are controlled to open (input digital code "1100"). Meanwhile, when the potential Vx of the input node 4 is higher than the logical threshold voltage VTL, only the switch in the selector 121, which is connected to the interconnection point of the resistor R3 and the resistor R4, is closed, and the other switches in the selector 121 are controlled to open (input digital code "0100").

Then, the potential Vx of the input node 4 and the logical threshold voltage VTL are compared and determined in the comparator 31. The same operations are repeatedly performed, and the value of low-order 4 bits is decided by each bit in sequence from the higher order side.

As described above, the resistor type DAC shown in FIG. 2 changes the potential, which is supplied to the one end of the capacitor C1 having the capacitance value Cx which is $\frac{1}{16}$ with respect to the total capacitance value 16Cx of the capacitors C1 to C5, in increments of Vref/16. As a result, the successive approximation type A/D converter shown in FIG. 2 can change the potential Vx of the input node 4 in increments of Vref/256, and digital data of 8 bits in total can be decided.

The conventional successive approximation type A/D converter as shown in FIG. 1 and FIG. 2 includes sixteen unit capacitors Cx and sixteen unit resistors, whereby the A/D converter with 8-bit accuracy is realized. In the case of constituting an A/D converter with 8-bit accuracy using a single stage DAC with only the capacitor type DAC or the resistor type DAC, it is necessary to include 256 unit capacitors or 256 unit resistors. Accordingly, in the case of constituting the A/D converter with the same accuracy, the number of components can be sharply reduced by using a double stage DAC. In the successive approximation type A/D converter shown in FIG. 1 and FIG. 2, the accuracy of the resistors in the resistor type DAC is only 4-bit accuracy, and it can be constituted by the resistor type DAC with a small area, which is also one of the advantages.

Namely, the conventional successive approximation type A/D converter reduces the area of the capacitors by using the double stage DAC, and further reduces the area of the resistor type DAC using the resistor string for the sub DAC.

The high resolution successive approximation type A/D converter with the small area at a high speed, which is produced in the CMOS process capable of production at comparatively low cost, is in practical use.

In recent years, a demand for speed enhancement of the A/D converter is increasing more and more, and speed enhancement of the successive approximation type A/D converter capable of constituting the circuit with a small area is strongly desired. In the conventional circuit shown in FIG. 1, there arises the problem of a delay in switching, when the potential of the node 27, which is the output of the sub DAC (R0 to R15 and the switch circuit 121), is set at, for example, Vref/2. This is because a switch circuit is generally realized by a CMOS transfer gate, and therefore when the power supply voltage (Vref) is low, the ON resistance becomes high at both the PMOS and NMOS with respect to the source/drain voltage at Vref/2, which increases a delay time in the switch circuit 121.

Following the development of finer integrated circuits and the like in recent years, power supply voltage in the integrated circuits and the like is reduced, and reduction in the power supply voltage is also demanded in the A/D converters. Reduction in the power supply voltage is also strongly demanded in the successive approximation type A/D converter capable of constituting a circuit with a small area.

For example, reduction in the power supply voltage in the conventional successive approximation type A/D converter using the C-R type double stage DAC as shown in FIG. 2 is considered.

When the conventional successive approximation type A/D converter as shown in FIG. 2 is produced in the CMOS process, the transfer gate as shown in FIG. 4 is generally used for each switch in the selector 121 and the switch group 21. The above-described transfer gate is constituted of a P-channel transistor (PMOS transistor) PMTr and an N-channel transistor (NMOS transistor) NMTr.

FIG. 5 is a graph showing relationship of an input potential Vin and ON resistance Ron, the input potential Vin being inputted from an input terminal T1 when 0V and a reference potential (power supply voltage for comparison) Vref (+3V or +5V or the like) are applied to the gate electrodes of the PMOS transistor PMTr and the NMOS transistor NMTr, respectively, as shown in FIG. 4 (when the transfer gate is in an ON state). As shown in FIG. 5, when the input potential Vin is sufficiently low (for example, 0V), the NMOS transistor NMTr is sufficiently in the ON state (ON resistance becomes small)(area (B)), while when the input potential Vin is sufficiently high (for example, VrefV), the PMOS transistor PMTr is sufficiently in the ON state (ON resistance becomes small) (area (A)). Accordingly, the input potential Vin is transmitted to an output end T2 as an output potential.

However, as the input potential Vin becomes higher from the sufficiently low value, the ON resistance becomes larger. Similarly, as the input potential Vin becomes lower from the sufficiently high value, the ON resistance becomes larger. For example, when the potential is ½ times as low as the reference potential Vref, both the PMOS transistor PMTr and the NMOS transistor NMTr are in the state with the large ON resistance, and the ON resistance of the transfer gate becomes the maximum.

As described above, the switch group 21 for controlling the capacitor type DAC supplies the ground GND or the reference potential Vref to the one ends of the capacitors C2 to C5 during a comparison operation. Meanwhile, the switch inside the selector 121 for controlling the output potential from the resistor type DAC outputs the potential about ½ times as low as the reference potential Vref in some case as, for example, when the digital code is "1000" in the corresponding relationship as shown in FIG. 3.

When the potential substantially ½ times as low as the reference potential Vref is transmitted in the switch inside the selector 121, the gate-source voltage of the MOS transistors PMTr and NMtr constituting the transfer gate becomes about Vref/2. Accordingly, when the potential substantially ½ times as low as the reference potential Vref is outputted, the ON resistance of the transfer gate becomes large as shown in FIG. 5, which becomes interference in reduction of the power supply voltage.

Namely, in the conventional successive approximation type A/D converter using the C-R type double stage DAC, the gate-source voltage of the MOS transistors PMTr and NMTr becomes about Vref/2 when the potential of substantially ½ times as low as the reference potential Vref is outputted from the resistor type DAC. Consequently, in reduction of the power supply voltage in the conventional successive approximation type A/D converter, such a problem exists that a normal operation cannot be performed only at a power supply voltage up to a voltage at which the voltage of Vref/2 is about the threshold voltage VTH of the MOS transistors PMTr and NMTr, namely, the power supply voltage of about 2VTH.

In the conventional successive approximation type A/D converter using the C-R type double stage DAC, as for a current passing through the resistor type DAC, the current of the same value passes all through the sampling period and comparison operation period. However, a time constant required of the resistor type DAC during the sampling period is generally larger than a time constant required in the comparison operation. Accordingly, during the sampling period, the resistor type DAC wastes electric power.

SUMMARY OF THE INVENTION

A first object of the present invention is to provide a circuit with a processing time of A/D conversion of a successive approximation type A/D converter being reduced.

A second object of the present invention is to provide a circuit which makes it possible to operate the successive approximation type A/D converter at low power supply voltage, without increasing a delay time in resistor DACs even when the power supply voltage is low.

A third object of the present invention is to make it possible to reduce power consumption required for all the processes of A/D conversion in the successive approximation type A/D converter.

The A/D converter according to the present invention includes a capacitor type D/A conversion circuit including a capacitor array constituted of a plurality of capacitors for sampling an input potential and storing electric charge, a first resistor type D/A conversion circuit for generating a desired potential by potential division, a second resistor type D/A conversion circuit for generating a desired potential by potential division, a first signal path for adding an output of the first resistor type D/A conversion circuit to an output of the capacitor type D/A conversion circuit by capacity coupling, a second signal path for adding an output of the second resistor type D/A conversion circuit to an output of the capacitor type D/A conversion circuit by capacity coupling, and a comparing circuit for determining whether a potential of the output of the capacitor type D/A conversion circuit is higher or lower than the input potential.

In the above-described constitution, for example, in the case of 8-bit A/D conversion, it is sufficient if the switch circuits of the first resistor type D/A conversion circuit and the second resistor type D/A conversion circuit are each a selector of 4:1 for deciding 2 bits, as compared with the switch circuit of the sub DAC of the conventional circuit being a selector of 16:1 for deciding low-order 4 bits, and the scale of the switch circuits can be sharply reduced. In the switch circuit, junction capacitance of a MOS transfer gate constituting the switch works as parasitic capacitance, which brings about a delay in a signal change, and therefore the time required for the comparison process of A/D conversion is increased. In the constitution of the present invention, the switch circuits of the first resistor type D/A conversion circuit and the second resistor type D/A conversion circuit can be made small-scaled, therefore sharply reducing the parasitic capacitance and making it possible to reduce the time required for the comparison process.

When the number of bits of the capacitor DAC is reduced and the number of bits of the resistor DAC is increased in order to reduce the sampling time, an increase in a delay time in the resistor DAC can be reduced. Accordingly, it is possible to reduce the sampling time substantially without increasing the comparison time out of the conversion time of the A/D converter, and therefore the conversion time can be reduced.

According to another aspect of the present invention, in the above-described A/D converter, the first resistor type D/A conversion circuit is connected to the output of the capacitor type D/A conversion circuit via capacitor being a predetermined times as much as minimum unit capacitance of a plurality of capacitors, and a range of the output of the first resistor type D/A conversion circuit exists only in either of an upper half or lower half among a range from a first potential to a second potential, which is divided by a resistor string.

In this constitution, in the case of a resistor string dividing Vref into 16, for example, the output of the first resistor type D/A conversion circuit is set in a voltage range as high as possible such as from 12 Vref/16 to 15 Vref/16, whereby the switch circuit of the resistor type D/A conversion circuit can be used in the area with ON resistance being low. At the transfer gates of PMOS and NMOS, the ON resistance becomes high at the voltage around ½ of the power supply voltage (Vref), and a high-speed operation becomes difficult, but use of the voltage near the power supply voltage (Vref) makes it possible to reduce a delay time, whereby enhancement in speed of the conversion processing can be attained.

Another mode of the A/D converter of the present invention includes a capacitor type D/A conversion circuit for outputting a potential corresponding to high-order L bits of inputted comparison digital data, a plurality of resistor type D/A conversion circuits for outputting in accordance with a value of low-order M bits potentials obtained by dividing supplied power supply voltage in a predetermined combination, a plurality of coupling capacitors connected between output terminals of the resistor type D/A conversion circuits and an output end of the capacitor type D/A conversion circuit, a control circuit and a comparing circuit, and a plurality of resistor type D/A conversion circuits are respectively controlled so that a sum of output potentials of a plurality of resistor type D/A conversion circuits, weighted based on the coupling capacitors, becomes equal to a potential corresponding to the value of the low-order M bits of the comparison digital data. As a result, it becomes possible to add and output the output potentials of a plurality of resistor type D/A conversion circuits, without outputting the potential itself which causes a problem in the reduction in the power supply voltage.

Further, when an initial potential supply circuit for outputting a predetermined potential to one of the plurality of coupling capacitors during sampling of the input analog signal is further included, it becomes possible to reduce power consumption during sampling and reduce power consumption required for the A/D conversion process by providing the initial potential supply circuit with less power consumption than the resistor type D/A conversion circuit used for the comparison operation separately from the resistor D/A conversion circuit.

BRIEF DESCRIPTION OF THE DRAWINGS

FIG. 3 is a diagram for explaining a function of a resistor type DAC shown in FIG. 2;

FIG. 9 is a diagram showing a modified example of the successive approximation type A/D converter according to the first embodiment;

FIG. 10 is a circuit diagram showing a constitution example of a successive approximation type A/D converter according to a second embodiment;

FIG. 14 is a diagram showing a constitution example of a control circuit for controlling a first selector included by the resistor type DAC;

FIG. 15 is a diagram showing a constitution example of a control circuit for controlling a second selector included by the resistor type DAC;

FIG. 17 is a diagram for explaining a function of a resistor type DAC shown in FIG. 16;

FIG. 19 is a diagram for explaining a function of a resistor type DAC shown in FIG. 18;

FIG. 21 is a diagram for explaining a function of the resistor type DAC shown in FIG. 20;

FIG. 23 is a diagram for explaining a function of the resistor type DAC shown in FIG. 22;

FIG. 25 is a diagram for explaining a function of the resistor type DAC shown in FIG. 24;

DETAILED DESCRIPTION OF THE PREFERRED EMBODIMENTS

Hereinafter, embodiments of the present invention will be explained based on the drawings.

First Embodiment

Figure 1:
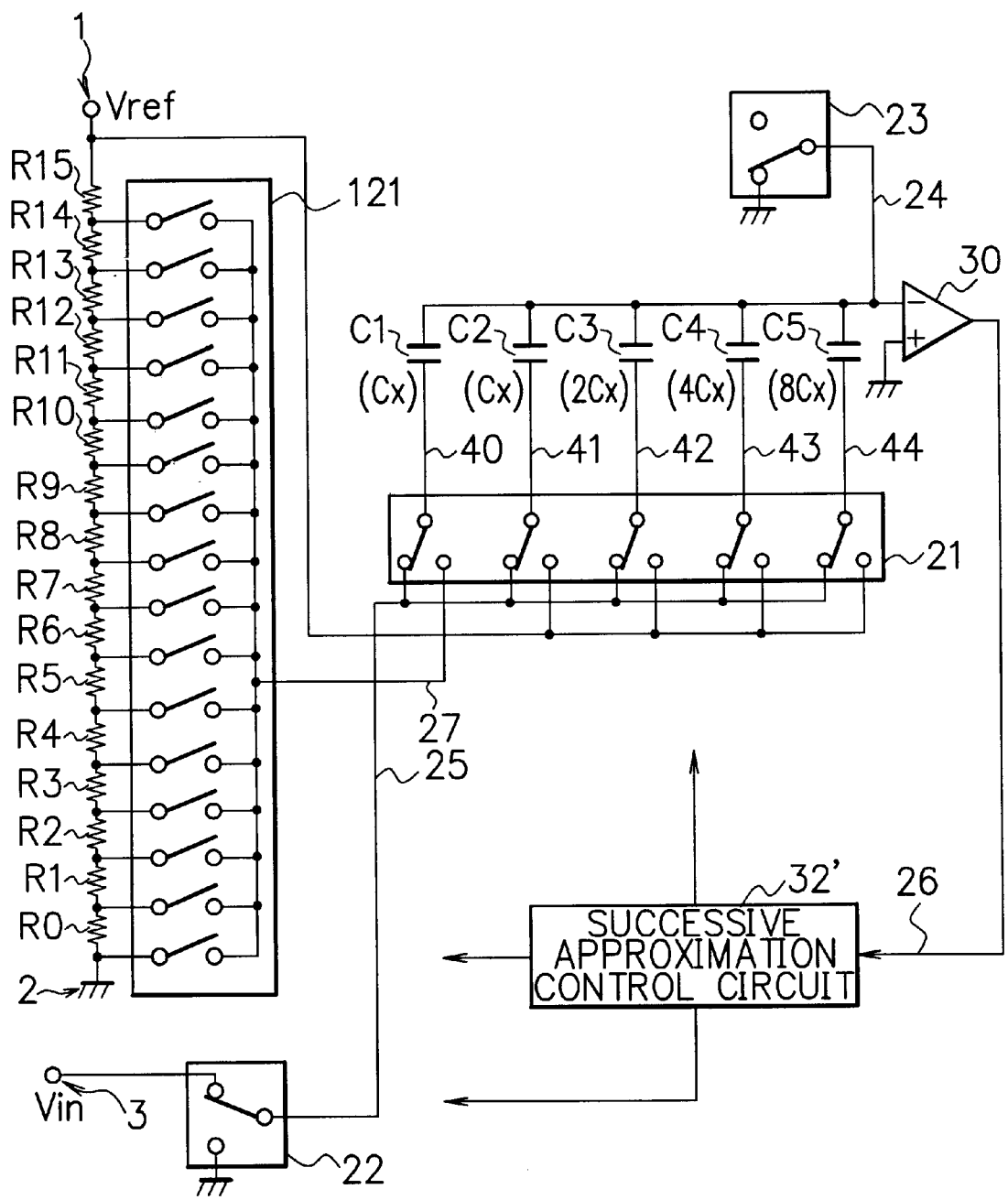
FIG. 1 is a diagram showing a circuit constitution of a successive approximation type A/D converter using a conventional C-R type double stage DAC.
Figure 6:
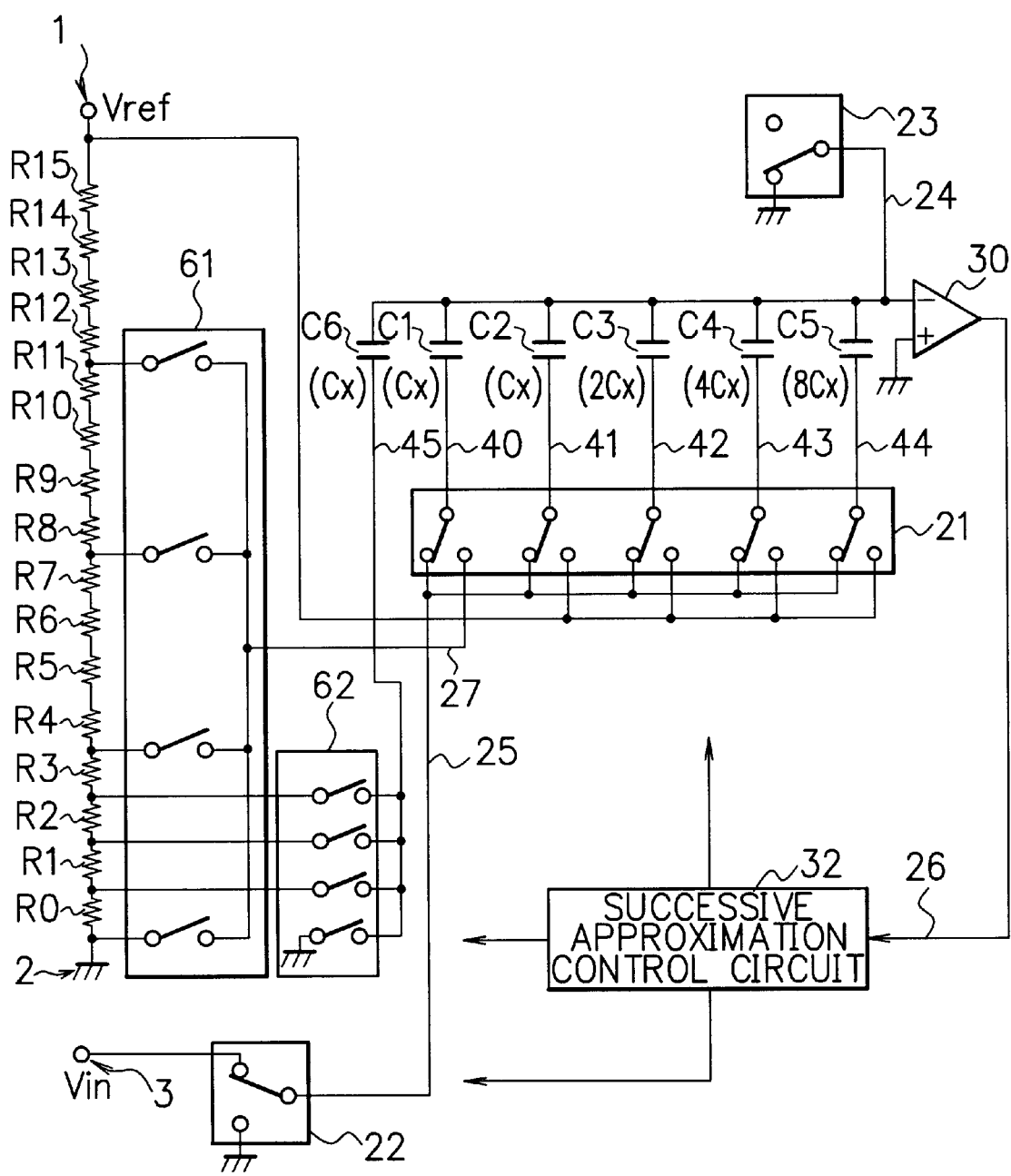
FIG. 6 is a circuit diagram showing a constitution example of a successive approximation type A/D converter according to a first embodiment.

FIG. 6 is a circuit diagram showing a constitution example of a successive approximation type A/D converter according to a first embodiment of the present invention. In FIG. 6, the same components as in FIG. 1 are referred to with the same numerals.

The successive approximation type A/D converter in FIG. 6 includes an input terminal 3 to which an input potential Vin is applied, nodes 24 to 27, nodes 40 to 45, a switch circuit 21, a switch circuit 22, a switch circuit 23, a switch circuit 61, a switch circuit 62, a comparator 30, a successive approximation control circuit 32, resistors R0 to R15, and capacitors C1 to C6. The successive approximation control circuit 32 controls an operation of each of the switches 21, 22, 23, 61, 62 and the like.

The resistors R0 to R15, the switch circuits 61 and 62, and the capacitor C6 constitute a sub DAC, and the C1 to C5 and the switch circuit 21 (and 22 and 23) constitute a 4-bit main DAC. As for the C1 to C5 constituting the main DAC, if a capacitance value of each of C1 and C2 is assumed to be Cx, C3 is weighted to be 2Cx, C4 is weighted to be 4Cx, and C5 is weighted to be 8Cx. When sampling is performed, all of the C1 to C5 are connected to an analog input terminal 3 (Vin) via the switch circuit 21, the node 25 and the switch circuit 22, and charged to the input potential Vin. In this situation, the switch 23 is controlled so that the node 24 is at GND. To secure relative accuracy, the sampling capacitors C3 to C5 are generally realized by connecting, for example, two, four or eight of certain unit capacitors Cx in parallel.

After sampling is finished, a comparison operation is started, and digital data corresponding to the input potential Vin is decided in sequence from the MSB. More specifically, the switch 23 is opened to bring the node 24 into a floating state, for example, the nodes 40 to 43 are connected to the GND via the switches 21 and 22, and the node 44 is connected to the reference potential Vref (a terminal 1). The node 45 is connected to the GND by the switch circuit 62. By the connection, electric charge stored according to the input potential Vin at the time of sampling is redistributed to the sampling capacitors C1 to C5, and a potential of the node 24 becomes the potential proportional to (Vref/2−Vin) The node 24 is connected to an input of the comparator 30, and it can be determined according to a potential of the node 26 being an output of the comparator 30 whether the analog input potential Vin is larger or smaller than ½ of the reference potential Vref.

In the above-described connection, as for the sampling capacitors C1 to C5, the node 44 is connected to the reference potential Vref, and the other nodes 40 to 43 are connected to the GND. Namely, 8Cx of C5 are connected to the reference potential Vref, and the total of 8Cx of the remaining C1 to C4 are connected to the GND. Generally, when the number of unit capacitors Cx connected to the reference potential Vref is m, and the number of the remaining unit capacitors Cx connected to the GND is (16−m), the potential Vx of the node 24 is $$Vx=(^{16}/_{17})[(m/16)Vref-Vin] \qquad (1).$$

For example, when the node 41 is connected to Vref, and the remaining nodes 40, 42, 43 and 44 are connected to the GND, m equals 1, and therefore the potential of the node 24 is $(^{16}/_{17})$ [Vref/16−Vin]. It should be noted that the coefficient $(^{16}/_{17})$ in the above formula is the result of taking the influence of the capacitor C6, which is not used as a sampling capacitor, into consideration.

By successively changing m, it is possible to change the potential of the node 24 in increments of Vref/16. Accordingly, the MSB side of the digital data (high-order 4 bits) can be decided.

Figure 7:
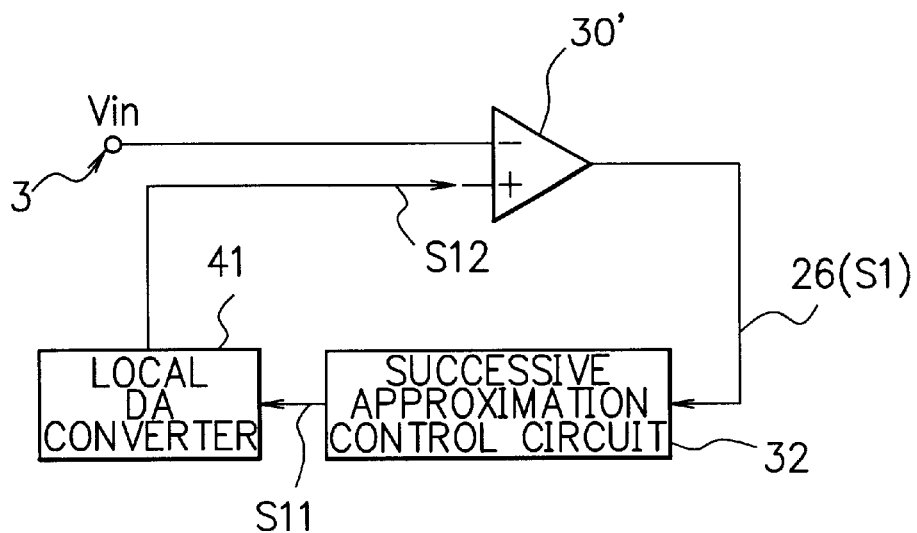
FIG. 7 is a diagram conceptually showing a constitution and operation of the circuit shown in FIG. 6.

FIG. 7 is a diagram conceptually showing a constitution and an operation of the circuit in FIG. 6.

The successive approximation type A/D converter in FIG. 7 includes a successive approximation control circuit 32, a local D/A converter 33, and a comparator 30'. The local D/A converter 33 is the combination and integration of the main DAC and the sub DAC in FIG. 6, and voltage in increments of Vref/256 is generated by a D/A conversion operation of 8 bits. The successive approximation control circuit 32 controls opening and closing of the switch circuits, thereby controlling the operation of the local D/A converter 33. The comparator 30' compares the voltage generated by the local D/A converter 33 and the input voltage Vin, and determines relationship between their magnitudes. In the constitution in FIG. 6, after the Vin is sampled, the result of subtracting Vin from (m/16) Vref is supplied to the comparator 30 as an input, but FIG. 7 shows that the comparator 30' subtracts Vin from (m/16) Vref and performs comparison, as a diagram showing the conceptual constitution.

In the successive approximation type A/D conversion circuit in FIG. 7, the successive approximation control circuit 32 sets digital data S11, and the local D/A converter 33 performs D/A conversion of the digital data S11 and generates local analog voltage S12. The input analog voltage Vin and the local analog voltage S12 of the local D/A converter 33 are compared and the relationship between their magnitudes is determined by the comparator 30', and the successive approximation control circuit 32 controls the local D/A converter 33 based on a comparison determination output 26. In consequence, the digital data when the local analog voltage output S12 of the local D/A converter 33 becomes substantially equal to the input analog voltage Vin is obtained and the digital data is made an A/D conversion output. In the comparison operation, each bit of the digital data is decided from the MSB in sequence toward the LSB side.

Hereinafter, process of deciding low-order bits at the LSB side by the sub DAC will be explained.

In the node 40 of the C1 having a capacitance value Cx of $^{1}/_{16}$ of total sampling capacitance 16Cx of C1 to C5, the potential is changed in increments of Vref/4 by using a 2-bit resistor DAC (R0 to R15 and the switch circuit 61). As a result, the potential of the node 24, which is the input to the comparator, can be changed in increments of Vref/64.

For example, the capacitance value of the capacitors connected to the Vref by the switch circuit 21 is assumed to be mCx (m is 0 to 15), and the capacitance value of the capacitors connected to the GND by the switch circuit 21 is assumed to be (15−m)Cx. Further, the potential of the node 40 of C1, which is set by the above-described 2-bit resistor DAC, is assumed to be n×Vref/4 (n is 0 to 3). In this situation, the potential Vx of the node 24 decided by electric charge redistribution is $$Vx=(^{16}/_{17})[(m/16+n/64)Vref-Vin] \qquad (2).$$

In the above formula, the potential of the node 45 is assumed to be set at the GND.

Accordingly, after the value of m corresponding to the digital data of high-order 4 bits is decided, the value of Vx is changed in increments of the voltage obtained by dividing the reference potential Vref by 64, and the value of n can be decided by the comparator 30. Namely, following the digital data of the high-order 4 bits, the data of 2 bits corresponding to the value of n can be decided.

From the above, the digital data of 6 bits can be obtained from the MSB side.

Further, in the node 45 of the C6 having the capacitance value Cx of $^{1}/_{16}$ of the total sampling capacitance 16Cx of the C1 to C5, the potential is changed in increments of Vref/16 by using the 2-bit resistor DAC (R0 to R15 and the switch circuit 62). As a result, the potential of the node 24, which is the input to the comparator, can be changed in increments of Vref/256.

For example, the capacitance value of the capacitors connected to the Vref by the switch circuit 21 is assumed to be mCx (m is 0 to 15), and the capacitance value of the capacitors connected to the GND by the switch circuit 21 is assumed to be (15−m)Cx. Further, the potential of the node 40 of the C1 is assumed to be n×Vref/4 (n is 0 to 3), and the potential of the node 45 of C6, which is set by the above-described 2-bit resistor DAC, is assumed to be p Vref/16 (p is 0 to 3). In this situation, the potential Vx of the node 24 decided by electric charge redistribution is $$Vx=(^{16}/_{17})[(m/16+n/64+p/256)Vref-Vin] \qquad (3).$$

Accordingly, after the values of m and n corresponding to the digital data of high-order 6 bits are determined, the value of Vx is changed in increments of the voltage obtained by dividing the reference potential Vref by 256, and the value of p can be decided by the comparator 30. Namely, following the digital data of the high-order 6 bits, the data of 2 bits corresponding to p can be decided.

From the above, all the digital data of 8 bits can be obtained.

Figure 8:
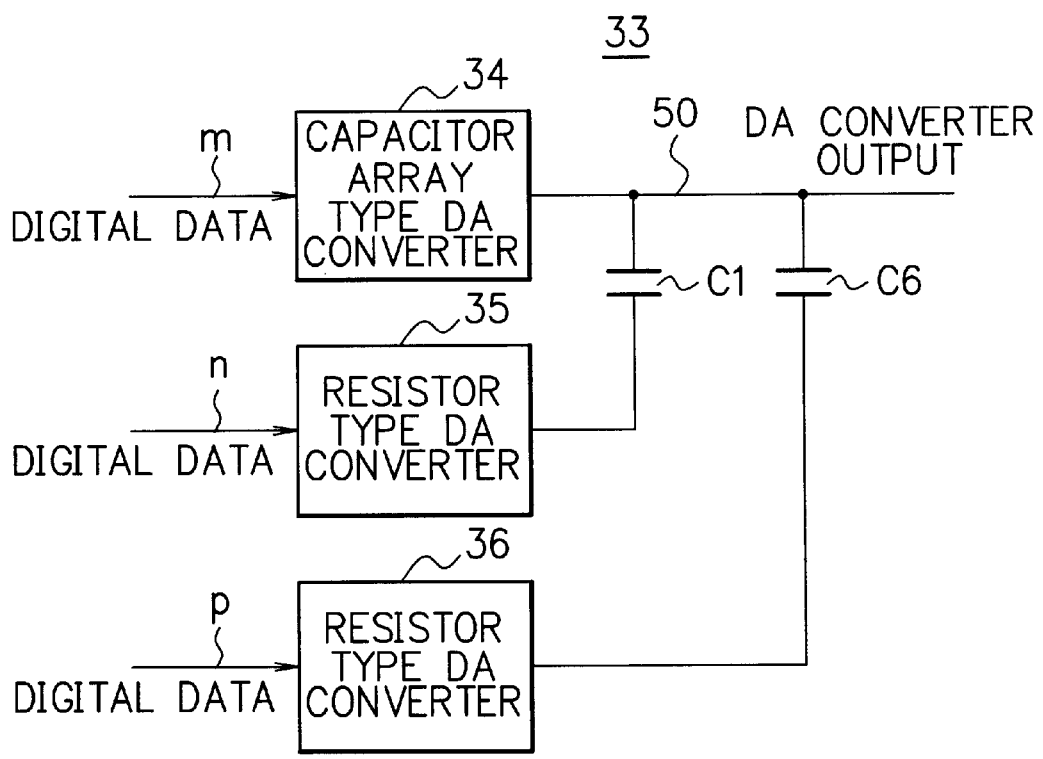
FIG. 8 is a diagram showing a constitution of a local D/A converter shown in FIG. 7 to explain the operation of the circuit shown in FIG. 6 conceptually.

FIG. 8 is a diagram showing a constitution of the local D/A converter 33 in FIG. 7 to explain an operation of the circuit in FIG. 6 conceptually.

The local D/A converter 33 in FIG. 7 includes a capacitor array type D/A converter 34, a resistor type D/A converter 35 and a resistor type D/A converter 36. m is a high-order 4 bits of the digital data, n is an intermediate-order 2 bits of the digital data, and p is a low-order 2 bits of the digital data. The capacitor array type D/A converter 34 indicates a capacitor array DAC for converting the high-order bits in the local D/A converter 33, and corresponds to C1 to C5 and the switch circuit 21 (and 22 and 23) in FIG. 6. The resistor type D/A converter 35 indicates a resistor DAC for converting the intermediate-order 2 bits in the local D/A converter 33, and corresponds to R0 to R15 and the switch circuit 61 in FIG. 6. The resistor type D/A converter 36 indicates a resistor DAC for converting the low-order 2 bits in the local D/A converter 33, and corresponds to R0 to R15 and the switch circuit 62 in FIG. 6. In FIG. 6, C1 is shown as a part of the capacitor array DAC, but in FIG. 8, it is shown separately from the capacitor array DAC.

Capacity coupling of an output of the resistor type D/A converter 35 to an output of the capacitor array type D/A converter 34 is performed via C1, and further, capacity coupling of an output of the resistor type D/A converter 36 is performed via C6. Capacity coupling of the output of the resistor type D/A converter 35 makes it possible to scale down and add the voltage corresponding to the intermediate-order order bits indicated by n. Capacity coupling of the output of the resistor type D/A converter 36 makes it possible to scale down and add the voltage corresponding to the low-order bits indicated by p.

The examples in FIG. 6 and FIG. 8 show the constitution in which capacity addition of the output potentials of the two resistor DACs to the output potential of the capacitor DAC is performed, but the number of the resistor DACs is not limited to two, and the constitution in which two or more resistor DACs are provided together with the capacity coupling means may be adopted. The output potential of the resistor DAC applied to the node 45 of the C6 is sufficient if it can be changed in increments of voltage of Vref/16 as a relative change from a sampling time, and the potential does not need to have the absolute value corresponding to R0 to R3.

The capacitor DAC corresponds to 4 bits, and the resistor DAC corresponds to 4 bits, but, without being limited to this, for example, the capacitor DAC may correspond to 3 bits, and the resistor DAC may correspond to 5 bits.

As compared with the switch circuit 121 of the conventional circuit in FIG. 1 being a selector of 16:1, the switch circuits 61 and 62 are both selectors of 4:1 in the circuit according to the first embodiment in FIG. 6, and therefore the scale of the switch circuit can be sharply reduced.

Specifically, the switch circuit is realized by a MOS transfer gate, and when the resistor DAC is 4-bit as in FIG. 1, junction capacitance of the MOS transfer gates of 16 taps becomes parasitic capacitance of the node 27. The influence of the parasitic capacitance causes a delay in signal change of the node 27, and increases a settling time of the node 24 and time required for comparison processing.

Since the switch circuits 61 and 62 in FIG. 6 have small circuit scales, the parasitic capacitance of the nodes 27 and 45 in FIG. 6 are sharply reduced as compared with the parasitic capacitance of the node 27 in FIG. 1, thus making it possible to reduce the time required for comparison processing.

In the successive approximation type A/D converter, a processing time for A/D conversion processing for converting an analog signal to a digital signal is constituted of a sampling time in which the analog signal is stored in the sampling capacitors and a comparing time in which a digital value is determined after sampling is finished. In order to reduce the conversion processing time, it is necessary to reduce the sampling time and comparing time. In order to reduce the sampling time, it is necessary to reduce a capacitance value of the sampling capacitor if signal source impedance of an external circuit for supplying an analog input signal is assumed to be constant. However, in order to keep relative accuracy, it is impossible to reduce the value of the unit capacitance so much, and there is no other choice but to reduce the sampling capacitance by reducing the number of capacitors.

In order to reduce the capacitance value of the sampling capacitor, it is suitable to make the capacitor main DAC have, for example, a three-bit constitution and the resistor sub DAC have 5-bit constitution. In this case, the sampling capacitance becomes 8-unit capacitance, and it is possible to reduce the capacitance value to half with respect to the original total sampling capacitance. However, since the number of bits of the resistor DAC needs to be 5, the junction capacitance of the MOS transfer gates of 32 taps becomes the parasitic capacitance of the node 27, which increases the settling time of the node 24 and increases a comparing time.

In the constitution according to the present invention, the comparing time can be reduced by reducing a delay time of the resistor DAC output, when it is compared in the same number of resistor DAC bits as the constitution of the prior art. Even when the number of bits of the capacitor DAC is reduced and the number of bits of the resistor DAC is increased to reduce the sampling time, an increase in the delay time in the resistor DAC can be reduced. Accordingly, it becomes possible to decrease the sampling time with hardly increasing the comparing time, out of the conversion time of the A/D converter, and the converting time can be reduced.

FIG. 9 is a diagram showing a modified example of the successive approximation type A/D converter according to the first embodiment.

In FIG. 9, a switch circuit 63 is provided in the successive approximation type A/D converter according to the fist embodiment shown in FIG. 6 to provide a constitution capable of supplying a divided potential generated by the resistor array R0 to R15 to the outside.

In the circuit in FIG. 6, a DAC operation corresponding to 4-bits is realized by taking out the D/A outputs each corresponding to 2 bits from the resistor string by the two switch circuits 61 and 62. In this constitution, the resistor DAC output corresponding to 4 bits (output of 16 stages) cannot be directly taken out.

During the time of testing or actual use, it is sometimes necessary to supply a divided potential corresponding to 4 bits to the outside of the apparatus. Thus, in the constitution in FIG. 9, it is made possible to take out a 4-bit DAC output by providing the switch circuit 63. Addition of the switch circuit 63 does not increase parasitic capacity of the nodes 27 and 45, and therefore the A/D conversion performance is not reduced.

Second Embodiment

Next, a second embodiment of the present invention will be explained.

FIG. 10 is a circuit diagram showing a constitution example of a successive approximation type A/D converter according to the second embodiment of the present invention. In FIG. 10, the same components as in FIG. 6 are referred to with the same numerals.

The successive approximation type A/D converter in FIG. 10 includes an input terminal 3 to which an input potential Vin is applied, nodes 24 to 27, nodes 40 to 44 and 47, a switch circuit 21, a switch circuit 22, a switch circuit 23, a switch circuit 62, a switch circuit 64, a comparator 30, a successive approximation control circuit 32A, resistors R0 to R15, and capacitors C1 to C5 and C7. The successive approximation control circuit 32A controls an operation of each of the switch circuits 21, 22, 23, 62, 64 and the like.

The resistors R0 to R15, the switch circuits 62 and 64, and the capacitor C7 constitute a sub DAC, and the C1 to C5 and the switch circuit 21 (and 22 and 23) constitute a 4-bit main DAC. As for C1 to C5 constituting the main DAC, if a capacitance value of each of the C1 and C2 is assumed to be Cx, C3 is weighted to be 2Cx, C4 is weighted to be 4Cx, and C5 is weighted to be 8Cx. When sampling is performed, all of C1 to C5 are connected to an analog input terminal 3 (Vin) via the switch circuit 21, the node 25 and the switch circuit 22, and charged to the input the potential Vin. In this situation, the switch 23 is controlled so that the node 24 is at the GND. The potential of a node 60 is supplied to the node 47 via the switch circuit 64. The electric charge stored in the C1 to C5 and C7 at this sampling time is (16CxVin+ 4CxV$_{60}$) (V$_{60}$ is the potential of the node 60). It should be noted that the capacitance value of the C7 is 4Cx.

After sampling is finished, a comparison operation is started, and digital data corresponding to the input potential Vin is determined in sequence from the MSB. If the number of unit capacitors Cx connected to the reference potential Vref is assumed to be m, and the number of the remaining unit capacitors Cx connected to the GND is assumed to be (16−m), the potential Vx of the node 24 is $$Vx = (16/20)[(m/16)Vref - Vin] \quad (4).$$

Here, the node 47 is connected to the node 60, and is set at a potential V$_{60}$.

By successively changing m, it is possible to change the potential of the node 24 in increments of Vref/16. Accordingly, the MSB side of the digital data (high-order 4 bits) can be determined.

Next, processing of determining low-order bits at the LSB side by the sub DAC will be explained.

In the node 47 of the C7 having a capacitance value 4Cx of ¼ of total sampling capacitance 16Cx of the C1 to C5, the potential is changed in increments of Vref/16 by using a 2-bit resistor DAC (R0 to R15 and the switch circuit 64). As a result, the potential of the node 24, which is the input to the comparator, can be changed in increments of Vref/64.

For example, the capacitance value of the capacitors connected to the Vref by the switch circuit 21 is assumed to be mCx (m is 0 to 15), and the capacitance value of the capacitors connected to the GND by the switch circuit 21 is assumed to be (15−m)Cx. Further, the potential of the node 47 of the C7, which is set by the 2-bit resistor DAC, is assumed to be n×Vref/16 (n is 0 to 3)+V$_{60}$. In this situation, the potential Vx of the node 24 determined by electric charge redistribution is expressed as follows:

$$Vx = (16/20)[(m/16 + n/64)Vref - Vin] \quad (5).$$

In this situation, the node 40 is connected to the GND.

Accordingly, after the value of m corresponding to the digital data of high-order 4 bits is determined, the value of Vx is changed in increments of the voltage obtained by dividing the reference potential Vref by 64, and the value of n can be determined by the comparator 30. Namely, following the digital data of the high-order 4 bits, the data of 2 bits corresponding to n can be determined.

From the above, the digital data of 6 bits can be obtained from the MSB side.

Further, in the node 40 of the C1 having the capacitance value Cx of 1/16 of the total sampling capacitance 16Cx of the C1 to C5, the potential is changed in increments of Vref/16 by using the 2-bit resistor DAC (R0 to R15 and the switch circuit 62). As a result, the potential of the node 24, which is the input to the comparator, can be changed in increments of Vref/256.

For example, the capacitance value of the capacitors connected to the Vref by the switch circuit 21 is assumed to be mCx (m is 0 to 15), and the capacitance value of the capacitors connected to the GND by the switch circuit 21 is assumed to be (15−m)Cx. Further, the potential of the node 47 of the C7 is assumed to be n×Vref/16+V$_{60}$ (n is 0 to 3) and the potential of the node 40 of the C1, which is set by the 2-bit resistor DAC, is assumed to be p×Vref/16 (p is 0 to 3). In this situation, the potential Vx of the node 24 determined by electric charge redistribution is $$Vx = (16/20)[(m/16 + n/64 + p/256)Vref - Vin] \quad (6).$$

Accordingly, after the values of m and n corresponding to the digital data of high-order 6 bits are determined, the value of Vx is changed in increments of the voltage obtained by dividing the reference potential Vref by 256, and the value of p can be determined by the comparator 30. Namely, following the digital data of the high-order 6 bits, the data of 2 bits corresponding to p can be determined.

From the above, all the digital data of 8 bits can be obtained.

As described above, according to the constitution in FIG. 10, the successive approximation type A/D converter of 8 bits can be realized. In the circuit in FIG. 6, the increment of the output potential of the resistor DAC used for conversion of intermediate-order bits is set to be Vref/4. On the other hand, in the constitution in FIG. 10, the increment of the output potential of the resistor DAC used for conversion of the intermediate-order bits is set to be Vref/16, and a potential is added to the node 24 via the C7 having the capacitance value 4Cx which is ¼ of the total sampling capacitance 16Cx.

In this constitution, the output potential of the resistor DAC is set at n Vref/16+V$_{60}$ (n is 0 to 3) by adding the bias potential V$_{60}$, whereby the voltage range as high as possible, which is from 12 Vref/16 to 15 Vref/16 is used. Consequently, the switch circuit 64 can be used in an area with small ON resistance. In the transfer gates of the PMOS and NMOS, at a voltage about ½ of the power supply voltage (Vref), ON resistance becomes large to make a high-speed operation difficult, but by using a voltage near the power supply voltage (Vref) as the switch circuit 64 in FIG. 10, a delay time can be reduced, whereby speedup of the conversion processing can be achieved.

In the A/D converter according to the present invention, the sub DAC is divided into a first resistor type D/A converter and a second resistor type D/A converter, whereby the scale of the switch circuit can be sharply reduced. Consequently, the parasitic capacity in the switch circuit is sharply reduced, and a time required for comparison processing can be reduced.

Speedup of the comparison processing can be achieved by operating the resistor DAC while avoiding a voltage area in which the ON resistance of the MOS transfer gate becomes high.

Third Embodiment

Figure 11:
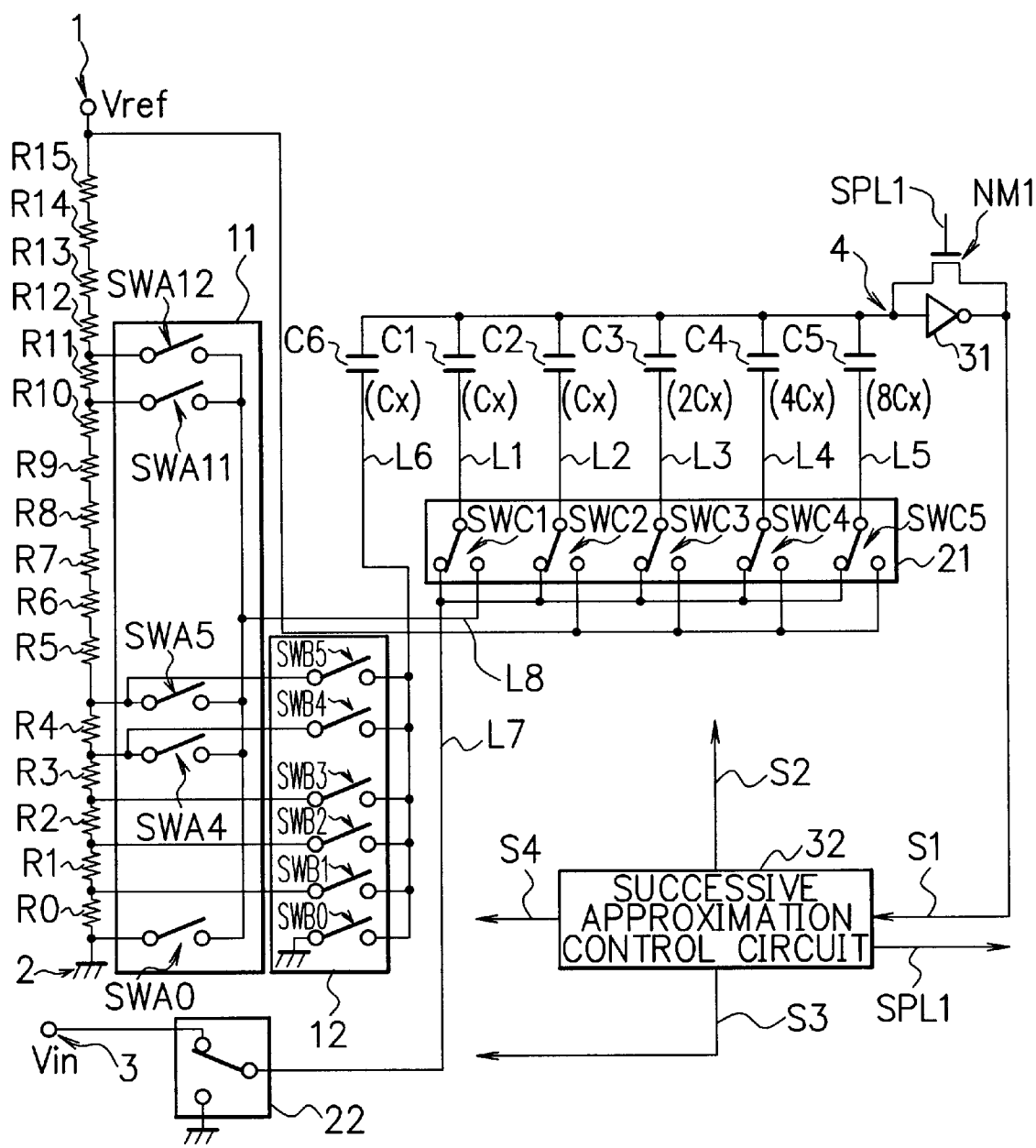
FIG. 11 is a circuit diagram showing a constitution example of a successive approximation type A/D converter according to a third embodiment.

FIG. 11 is a circuit diagram showing a constitution example of a succession comparison type A/D converter according to a third embodiment of the present invention.

In FIG. 11, C1 to C6 are capacitors, and when the capacitance values of the capacitors C1 and C2 are Cx, the capacitance values of the capacitors C3, C4 and C5 are weighted to 2Cx, 4Cx (=$2^2$Cx) and 8cx (=$2^3$Cx). For example, the capacitors C3, C4 and C5 are constituted by connecting two, four, and eight unit capacitors Cx in parallel to secure relative accuracy of the capacitance value. The capacitance value of the capacitor C6 is Cx.

One end of the capacitors C1 to C5 are connected to first terminals of corresponding switches SWC1 to SWC5 inside a switch group 21 via lines L1 to L5. One end of the capacitor C6 is connected to an output end of a second selector 12 via an output line L6. The other ends of the capacitors C1 to C6 are connected to the node 4.

The switches SWC1 to SWC5 are three-terminal switches capable of selectively connecting either the first terminals and second terminals, or the first terminals and third terminals, and are controlled according to a control signal S2. A switch 22 is also a three-terminal switch with the same constitution, and is controlled according to a control signal S3.

A second terminal of the switch SWC1 is connected to an output end of a first selector 11 via an output line L8, and the second terminals of the switches SWC2 to SWC5 are connected to a power supply terminal 1 for supplying reference potential Vref. The third terminals of the switches SWC1 to SWC5 are connected to a first terminal of the switch 22 via a line L7. A second terminal of the switch 22 is connected to an analog signal input terminal 3, and a third terminal is connected to the ground (GND).

R0 to R15 denote resistors having equal resistance values, and are connected to between the power supply terminal 1 and a ground terminal 2 in series. In the explanation below, the resistors R0 to R15 are connected in the order of the resistors R0, R1, R2, . . . , R15 from the ground terminal 2 side to the power supply terminal 1 side.

The first selector 11 is constituted of a plurality of switches SWAn, and selectively supplies the potential divided by the resistors R0 to R15 to the output line L8. Similarly, the second selector 12 is constituted of a plurality of switches SWBn, and selectively supplies the potential divided by the resistors R0 to R15 to the output line L6. In the switches SWAn and SWBn, n is an added character and an integer.

The switches SWAn and SWBn are switches for selecting the potential of (Vref/16)×n, and are controlled according to a control signal S4. One ends of the switches SWAn and SWBn are connected to an interconnection point of the resistor R (n−1) and the resistor Rn, the other end of the switch SWAn is connected to the output line L8, and the other end of the switch SWBn is connected to the output line L6. It should be noted that the one ends of the switches SWA0 and SWB0 are connected to an interconnection point of a ground terminal and the resistor R0.

Figure 4:
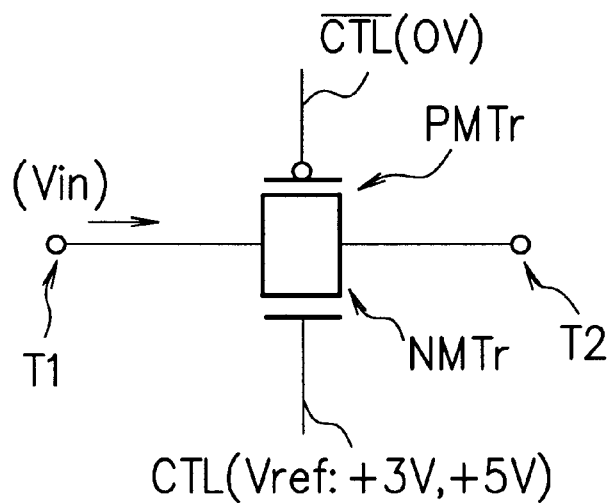
FIG. 4 is a diagram showing a constitution of a switch inside a resistor type DAC.
Figure 5:
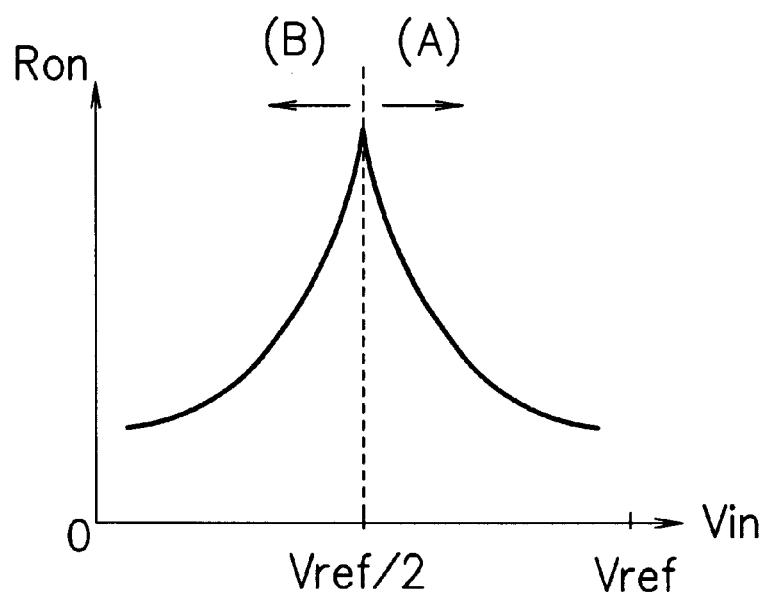
FIG. 5 is a diagram showing an electric resistance characteristic in the switch inside the resistor type DAC.

The switches SWAn and SWBn are each constituted of a transfer gate constituted of, for example, one P-channel transistor (PMOS transistor) PMTr and one N-channel transistor (NMOS transistor) NMTr as shown in FIG. 4. When the transfer gate is bought into an on state (conducting state), 0V and the reference potential Vref are applied respectively to gate electrodes of the P-channel transistor PMTr and the N-channel transistor NMTr, while when the transfer gate is brought into an off state (non-conducting state), the reference potential Vref and 0 (V) are respectively applied to the gate electrodes of the P-channel transistor PMTr and the N-channel transistor NMTr.

In FIG. 11, the first selector 11 includes the switches SWA0, SWA4, SWA5, SAW11 and SWA12. Accordingly, the first selector 11 can selectively supply the potentials of 0 (V), 4 Vref/16, 5 Vref/16, 11 Vref/16, and 12 Vref/16 to the output line L8. The second selector 12 includes the switches SWB0 to SWB5, and can selectively supply potentials of 0 (V) to 5 Vref/16 to the output line L6.

31 denotes a comparator (for example, a chopper type comparator) constituted of an inverter circuit, in which a input terminal is connected to the node 4, while an output terminal is connected to a successive approximation control circuit 32. NM1 denotes a switch constituted of an N-channel transistor, in which a control signal SPL1 is supplied to a gate electrode, and a source electrode and a drain electrode are connected to the input terminal and the output terminal of the comparator 31.

The successive approximation control circuit 32 controls each circuit constituting the successive approximation type A/D converter shown in FIG. 11. For example, the successive approximation control circuit 32 generates digital data based on an output S1 of the comparator 31, and retains determined values in digital data. The successive approximation control circuit 32 outputs the control signals S2, S3, S4 and SPL1 corresponding to the generated digital data and the like, and outputs the digital data with the values of all bits being determined to the outside as an output of A/D conversion of an analog input signal.

The successive approximation type A/D converter shown in FIG. 11 is a successive approximation type A/D converter using a C-R type double stage DAC, and in FIG. 11, the capacitors C1 to C5 and the switches SWC1 to SWC5 constitute the capacitor type DAC (main DAC) with 4-bit accuracy using a capacitor array. The resistors R0 to R15 and the first selector 11 constitute one resistor type DAC using a resistor string, the resistors R0 to R15 and the second selector 12 similarly constitute one resistor type DAC, and the two resistor type DACs and the capacitors C1 and C6 function as the resistor type DAC (sub DAC) with 4-bit accuracy.

Next, an operation will be explained.

First, an outline of the operation of the successive approximation type A/D converter shown in FIG. 11 will be explained based on the conceptual diagram of the successive approximation type A/D converter shown in FIG. 7.

In FIG. 7, the local DAC 33 corresponds to the capacitor type DAC and the resistor type DAC constituted of the capacitors C1 to C6, the switch group 21, the resistors R0 to R15, the first selector 11 and the second selector 12 shown in FIG. 11. In FIG. 11, the comparator 31 is constituted of the inverter circuit, but in FIG. 7, the comparator 30' is a differential circuit (differential amplifier) to show it conceptually.

When performing A/D conversion of an analog input signal inputted from the analog signal input terminal 3, the successive approximation control circuit 32 supplies digital data S11 for determining the value of the most significant bit (MSB) in the A/D conversion output to the local DAC 33. The local DAC 33 performs D/A conversion of the supplied digital data S11 and supplies it to the comparator 30' as an analog output S12.

The comparator 30' compares the potential Vin of the analog input signal and the potential of the analog output S12 and determines the magnitude relationship between them, and supplies a determination output S1 corresponding to the determination result to the successive approximation control circuit 32. The successive approximation control circuit 32 decides the value of the MSB based on the determination output S1 supplied from the comparator 30'.

Next, the successive approximation control circuit 32 reflects the decided value, and supplies the digital data S11 for deciding the value of a lower-order bit by one bit from the MSB to the local DAC 33. Thereafter, by performing the operation for each bit in the order from the MSB side to the least significant bit (LSB) side, the successive approximation type A/D converter decides the value of the digital data in sequence.

After the values of all the bits are decided, namely, after the digital data with the least difference between the potential Vin of the analog input signal and the potential of the analog output S12 is decided, the successive approximation control circuit 32 outputs the digital data to the outside as an A/D conversion output. In this manner, the successive approximation type A/D converter performs A/D conversion of the analog input signal, and outputs the digital data corresponding to the potential Vin of the analog input signal.

Next, the operation of the successive approximation type A/D converter shown in FIG. 11 will be explained in detail.

The A/D conversion operation of the successive approximation type A/D converter is divided into a sampling operation of sampling the potential Vin of the analog input signal, and a comparison operation of deciding the value of the digital data for each bit based on the sampled potential Vin in succession. In the following explanation, the sampling operation is explained at first, and the comparison operation is explained next.

Sampling Operation

When the A/D conversion operation is started, the successive approximation control circuit 32 controls the switch group 21 according to the control signal S2 so that the first terminal (the lines L1 to L5) and the third terminal (the line L7) are connected at the switches SWC1 to SWC5. The successive approximation control circuit 32 controls the switch 22 according to the control signal S3 so that the first terminal and the second terminal are connected. As a result, the one ends of the capacitors C1 to C5 having the function as sampling capacitors are respectively connected to the analog signal input terminal 3, and the potential Vin of the analog input signal is supplied to the one ends of the capacitors C1 to C5 via the lines L7 and L1 to L5, and the like.

In this situation, the successive approximation control circuit 32 controls the second selector 12 according to the control signal S4 so that only the switch SWB0 is closed and the switches SWB1 to SWB5 are opened. As a result, one end of the capacitor C6 is connected to the ground. Further, the successive approximation control circuit 32 controls a switch NM1 according to a control signal SPL1 so that the potential Vx of the node 4 becomes equal to a logical threshold voltage VTL of the comparator 31 by bringing the switch NM1 into an ON state. The logical threshold voltage VTL is a threshold at a logical level at the input of the comparator 31 (high level ("H") and low level "L").

As described above, the potential Vx of the node 4 is made the logical threshold voltage VTL, and the potential Vin of the analog input signal is supplied to the one ends of the capacitors C1 to C5, whereby sampling of the potential Vin of the analog input signal is performed, and the capacitors C1 to C5 are charged corresponding to the potential Vin.

In the sampling operation, electric charge Q stored in the capacitors C1 to C6 is expressed by the following formula (11).

$$Q=-16Cx(Vin-VTL)+CxVTL \quad (11)$$

Comparison Operation

After the sampling operation is finished, the successive approximation type A/D converter performs a comparison operation, and the value is decided for each bit in the direction from the MSB of the digital data to the low order side in sequence.

First, the successive approximation control circuit 32 brings the switch NM1 into an OFF state according to a control signal SPL1 so that the potential Vx of the node 4 is determined by redistributing the electric charge, which is stored in the capacitors C1 to C5 by the sampling operation, to the capacitors C1 to C5. In the following explanation, redistribution of the electric charge stored in the capacitors C1 to C5 to the capacitors C1 to C5 is called "redistribution of electric charge".

Further, the successive approximation control circuit 32 controls the switch SWC1 and the first selector 11 respectively, according the control signals S2 and S4, and the one end of the capacitor C1 is connected to the ground. Similarly, the successive approximation control circuit 32 controls the second selector 12 according to the control signal S4, and the one end of the capacitor C6 is connected to the ground. In concrete, the successive approximation control circuit 32 controls the first selector 11 so that only the switch SWAO is closed and the other switches SWAn (n≠0) are opened, and controls the second selector 12 so that only the switch SWB0 is closed and the other switches SWBn (n≠0) are opened.

The successive approximation control circuit 32 controls the switches SWC2 to SWC5 as appropriate according to the control signal S2 so that the one ends of the capacitors C2 to C5 are selectively connected to the power supply terminal 1 or the ground.

Here, a resultant capacitance value of the capacitors the one ends of which are connected to the power supply terminal 1 (the reference potential Vref is supplied to the one ends of the capacitors C1 to C5) in the capacitors C1 to C5 is assumed to be mCx (since the capacitors which is selectively connected to the power supply terminal 1 or the ground are capacitors C2 to Cs, m is an integer from 0 to 15). In this situation, a resultant capacitance value of the capacitors whose ends are connected to the ground in the capacitors C1 to C5 is (16–m)Cx. Input capacitance of the comparator 31 and parasitic capacitance of wiring are ignored for convenience of explanation.

Accordingly, if the capacitor C6 is taken into consideration, and the electric charge Q expressed by the formula (11) is stored, the potential Vx of the node 4 by redistribution of the electric charge is expressed as follows.

$$Vx=(^{16}/_{17})[(m/16)Vref-Vin]+VTL \quad (12)$$

As is obvious from the formula (12), by determining whether or not the potential Vx of the node 4 is higher than the logical threshold voltage VTL by the comparator 31, it can be determined whether the potential Vin of the analog input signal is higher or lower than arbitrary potential (m/16)Vref out of the sixteen-split parts of the reference potential Vref. Namely, the successive approximation type A/D converter shown in FIG. 11 controls the switches SWC2 to SWC5 based on the value of the high-order 4 bits of the digital data to be compared, and determines whether the potential Vx of the node 4 is higher than the logical threshold voltage VTL or not. Consequently, the successive approximation type A/D converter can decide the value of the high-order 4 bits of the digital data corresponding to the potential Vin of the analog input signal.

For example, when the value of the MSB of the digital data is decided, the digital data used for comparison is "1000 0000", and the value of high-order 4 bits is "8". Accordingly, the successive approximation control circuit 32 controls the switches SWC2 to SWC5 so that the one ends of the capacitors C2 to C4 are connected to the ground and the one end of the capacitor C5 is connected to the power supply terminal 1. It is determined by the comparator 31 whether the potential Vx of the node 4 is higher than the logical threshold voltage VTL or not.

As a result of the determination, when the determination output S1 from the comparator 31 is "H", the potential Vin of the analog input signal is higher than the potential 8 Vref/16 (=Vref/2), and therefore the successive approximation control circuit 32 decides the value of the MSB to be "1". On the other hand, when the determination output S1 is "L", the potential Vin of the analog input signal is lower than the potential 8 Vref/16 (=Vref/2), and therefore the successive approximation control circuit 32 decides the value of the MSB to be "0".

When the value of the MSB is decided as described above, an operation of deciding the value of the lower-order bit than the MSB by one bit is performed by reflecting the value of the decided MSB in the digital data to be compared.

When the decided value of the MSB is "1", the digital data used for comparison is "1100 0000", and the value of the high-order 4 bits is "12". Accordingly, the successive approximation control circuit 32 controls the switches SWC2 to SWC5 so that the one ends of the capacitors C2 and C3 are connected to the ground, and the one ends of the capacitors C4 and C5 are connected to the power supply terminal 1. On the other hand, when the decided value of the MSB is "0", the digital data used for comparison is "0100 0000", and the value of the high-order 4 bits is "4". Accordingly, the successive approximation control circuit 32 controls the switches SWC2 to SWC5 so that the one ends of the capacitors C2, C3 and C5 are connected to the ground, and the one end of the capacitor C4 is connected to the power supply terminal 1.

The control of the switches SWC2 to SWC5 in which the value of the MSB thus decided is reflected is performed, and it is determined by the comparator 31 whether the potential Vx of the node 4 is higher than the logical threshold voltage VTL or not. Based on the determination result, the successive approximation control circuit 32 decides the value of the lower-order bit than the MSB by one bit.

The operation is performed for the high-order 4 bits of the digital data in sequence with the decided digital data being reflected therein, and the value of the high-order 4 bits of the digital data corresponding to the potential Vin of the analog input signal is decided from the high order side in sequence.

As described above, the potential of the one ends of the capacitors C1 and C6 is set at the ground, and by controlling the switches SWC2 to SWC5 and 22 so as to set the potential of the one ends of the capacitor C2 to C5 at the ground or the reference potential Vref, the value of the high-order 4 bits of the digital data is decided.

Here, as shown in the formula (12), the potential Vx of the node 4 is the value (to be accurate $16/17$ times) which is resulted from subtracting the potential Vin of the analog input signal from the output potential (m/16) Vref of DAC when the logical threshold voltage VTL of the comparator 31 is assumed to be a reference. Accordingly, the capacitors C1 to C5 and the switch group 21 shown in FIG. 11 function as the local DAC and an adding and subtracting circuit.

Next, decision of the value of the low-order 4 bits will be explained.

After the value of the high-order 4 bits of the digital data is decided as described above, the successive approximation type A/D converter decides the value of the low-order 4 bits.

The value of the low-order 4 bits is decided by changing the potentials supplied to the one ends of the capacitors C1 and C6 each having the capacitance value Cx that is the value of $1/16$ with respect to the total capacitance value 16Cx of the sampling capacitors C1 to C5.

In concrete, the successive approximation control circuit 32 controls the first and the second selectors 11 and 12 to respectively change the potentials supplied to the one ends of the capacitors C1 and C6. Thereby, the potential Vx of the node 4 is changed in increments of $1/256$ of the reference potential Vref, and it is determined whether the potential Vx of the node 4 is higher than the logical threshold voltage VTL or not. The potential of the output line L8 is supplied to the one end of the capacitor C1 via the line L1.

In FIG. 11, the resistors R0 to R15, the first selector 11, the second selector 12 and the capacitors C1 and C6 function as the resistor type DAC with 4-bit accuracy as a whole. The functional operation of the 4-bit resistor type DAC is shown in FIG. 12.

The selector 121 in the conventional successive approximation type A/D converter outputs the potential itself of (the numeral expressing the inputted digital code in a decimal digit)×Vref/16, as shown in FIG. 3. On the other hand, the first and the second selectors 11 and 12 in the third embodiment do not output the potential itself in the range of 6 Vref/16 to 10 Vref/16 as shown in FIG. 12, but they are controlled so that the total potential that they supply via the two output lines L6 and L8 is the potential of (the numeral expressing the inputted digital code in a decimal digit)× Vref/16.

Figures 12, 13:
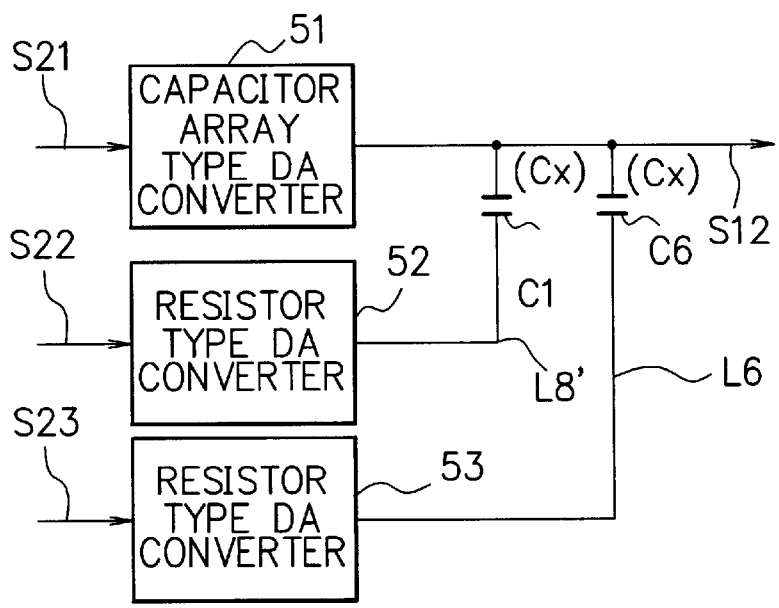
FIG. 12 is a diagram for explaining a function of a resistor type DAC shown in FIG. 11.
FIG. 13 is a conceptual diagram for explaining an operation of a local DAC.

As shown in FIG. 12, the potential Vx of the node 4, which is decided by redistribution of electric charge when the potentials of the output lines L6 and L8 (line L1) are controlled, will be explained.

Similarly to the occasion of deciding the value of the high-order 4 bits of the digital data, the resultant capacitance value of the capacitors C2 to C5 the one ends of which are connected to the power supply terminal 1 is assumed to be mCx (m is an integer from 0 to 15), and the resultant capacitance value of the capacitors C2 to C5 the one ends of which are connected to the ground is assumed to be (15−m)Cx. The potential supplied to the one end of the capacitor C1 via the output line L8 (line L1) is expressed by p Vref/16 (p is an integer from 0 to 15), and the potential supplied to the one end of the capacitor C6 via the output line L6 is expressed by q Vref/16 (q is an integer from 0 to 15).

In this situation, when the electric charge Q expressed by the formula (11) is assumed to be stored, the potential Vx of the node 4 by redistribution of the electric charge is $$Vx=(16/17)[(m/16)Vref+((p+q)/256)Vref-Vin]+VTL \qquad (13).$$

Here, if p+q=r, and the values p and q are selected so that the digital code (a decimal digit) inputted into the resistor type DAC becomes equal to the value r as shown in FIG. 12, the formula (13) is expressed by the following formula (14).

$$Vx=(16/17)[(m/16)Vref+(r/256)Vref-Vin]+VTL \qquad (14)$$

Since the values of the output lines L6 and L8 (output voltage values) respectively correspond to the values q and p in FIG. 12, the value of (the output line L8)+(the output line L6) in FIG. 12 is equal to the value r (=p+q). Namely, the resistor type DAC shown in FIG. 11 is constituted so that the values p, q and r have the relationship shown below with respect to the inputted digital code. The inputted digital code is expressed in a decimal digit.

When the digital code is "0", p=0, q=0, r=0
When the digital code is "1", p=0, q=1, r=1
When the digital code is "2", p=0, q=2, r=2
When the digital code is "3", p=0, q=3, r=3
When the digital code is "4", p=4, q=0, r=4
When the digital code is "5", p=4, q=1, r=5
When the digital code is "6", p=4, q=2, r=6
When the digital code is "7", p=4, q=3, r=7
When the digital code is "8", p=4, q=4, r=8
When the digital code is "9", p=4, q=5, r=9
When the digital code is "10", p=5, q=5, r=10
When the digital code is "11", p=11, q=0, r=11
When the digital code is "12", p=12, q=0, r=12
When the digital code is "13", p=12, q=1, r=13
When the digital code is "14", p=12, q=2, r=14
When the digital code is "15", p=12, q=3, r=15

As described above, the two resistor type DACs shown in FIG. 11 become the resistor type DACs of 4-bit by being constituted to add the potential supplied via the two output lines L6 and L8 by the capacitors C1 and C6, and the value r can take all the integer values from 0 to 15.

Here, the potential Vin of the analog input signal is determined to be higher or lower than the potential (m/16) Vref in increments of Vref/16 which is the result of dividing the reference potential Vref by 16, when the value of high-order 4 bits is decided by the capacitor type DAC. Specifically, it is understood that the potential Vin of the analog input signal is the potential within the range of Vref/16, namely, 16 Vref/256 with respect to the potential corresponding to the value m of the high-order 4 bits of the digital data.

Accordingly, after the value m of the high-order 4 bits of the digital data corresponding to the potential Vin of the analog input signal is decided, the potential Vx of the node 4 is changed by the potential in increments of Vref/256 which is the result of dividing the reference potential Vref by 256 (to be accurate, 16/17 times) in the range of 0×Vref/256~15×Vref/256 by the resistor type DAC having the characteristics shown in FIG. 12. By determining whether the potential Vx is higher than the logical threshold voltage VTL or not by the comparator 31, the value r of the low-order 4 bits can be decided.

For example, when the value of the highest-order bit in the low-order 4 bits is decided (digital code "1000"), only the switches SWA4 and SWB4 of the first and the second selectors 11 and 12 are closed. As a result, the potential of 4 Vref/16 is supplied to the one ends of the capacitors C1 and C6 via the output lines L6 and L8, and the potential Vx of the node 4 rises to be higher than the potential corresponding to the value m of high-order 4 bits by 8 Vref/256. In this situation, it is determined by the comparator 31 whether the potential Vx is higher than the logical threshold voltage VTL or not, whereby the value of the highest-order bit of the low-order 4 bits is decided.

Thereafter, the value of the low-order 4 bits is similarly decided from the high-order side to the low-order side in sequence by reflecting the value of the bit in the higher-order side which is decided in the low-order 4 bits in the digital code.

FIG. 13 is a conceptual diagram for explaining the operation in the successive approximation type A/D converter shown in FIG. 11.

In FIG. 13, S21 denotes digital data corresponding to the value m in the formula (14) (digital data corresponding to the high-order 4 bits), and S22 and S23 denote digital data corresponding to the value r in the formula (14) (digital data corresponding to the low-order 4 bits).

Reference numeral 51 denotes the capacitor type DAC for performing D/A conversion of the high-order 4 bits, and corresponds to the capacitors C1 to C5 and the switch group 21 shown in FIG. 11. Reference numerals 52 and 53 are the first and the second resistor type DACs for performing D/A conversion of the low-order 4 bits, and supply the potentials corresponding to the digital data S22 and S23 to the one ends of the capacitors C1 and C6 via the output lines L8' and L6. The first resistor type DAC 52 corresponds to the resistors R0 to R15 and the first selector 11 shown in FIG. 11, and the second resistor type DAC 53 corresponds to the resistors R0 to R15 and the second selector 12 shown in FIG. 11. The capacitor C1 is part of the capacitor type DAC 51 as shown in FIG. 11, but in FIG. 13, it is shown separately from the capacitor type DAC 51 to facilitate understanding of the explanation of the operation.

With the constitution shown in FIG. 13, and by supplying the potential from the resistor type DACs 52 and 53 to the one ends of the two capacitors C1 and C6 (the capacitor constituting the capacitor type DAC and a capacitor separately provided and different from the capacitor), the output corresponding to the digital data S22 and S23 can be obtained by the capacitor coupling. Namely, in FIG. 13, the potentials which the resistor type DACs 52 and 53 supply via the output lines L8' and L6 can be added in the line S12 by the capacitors C1 and C6.

In the example shown in FIG. 11, FIG. 13 and the like, the example of adding the potential supplied from the two resistor type DACs by using the two capacitors is shown as an example, but it goes without saying that even if the number of resistor type DACs exceeds two, the output of the resistor type DAC can be added by providing the corresponding capacitors at the resistor type DACs.

As explained above, in the successive approximation type A/D converter according to the third embodiment, the successive approximation control circuit 32 controls a plurality of resistor type DACs so that the total output potential of a plurality of resistor type DACs becomes a predetermined potential without outputting the predetermined potential in the vicinity of Vref/2 from a plurality of resistor type DACs using the resistor string (a plurality of resistors R0 to R15 connected in series). Namely, the output supplied from a plurality of resistor type DACs is added by using the capacitors, and the same function as one resistor type DAC is realized.

As a result, in a plurality of resistor type DACs, without outputting the potential around Vref/2 itself, at which the ON resistance of the switch becomes large when it is outputted, A/D conversion can be performed similarly to the conventional successive approximation type A/D converter.

Figure 2:
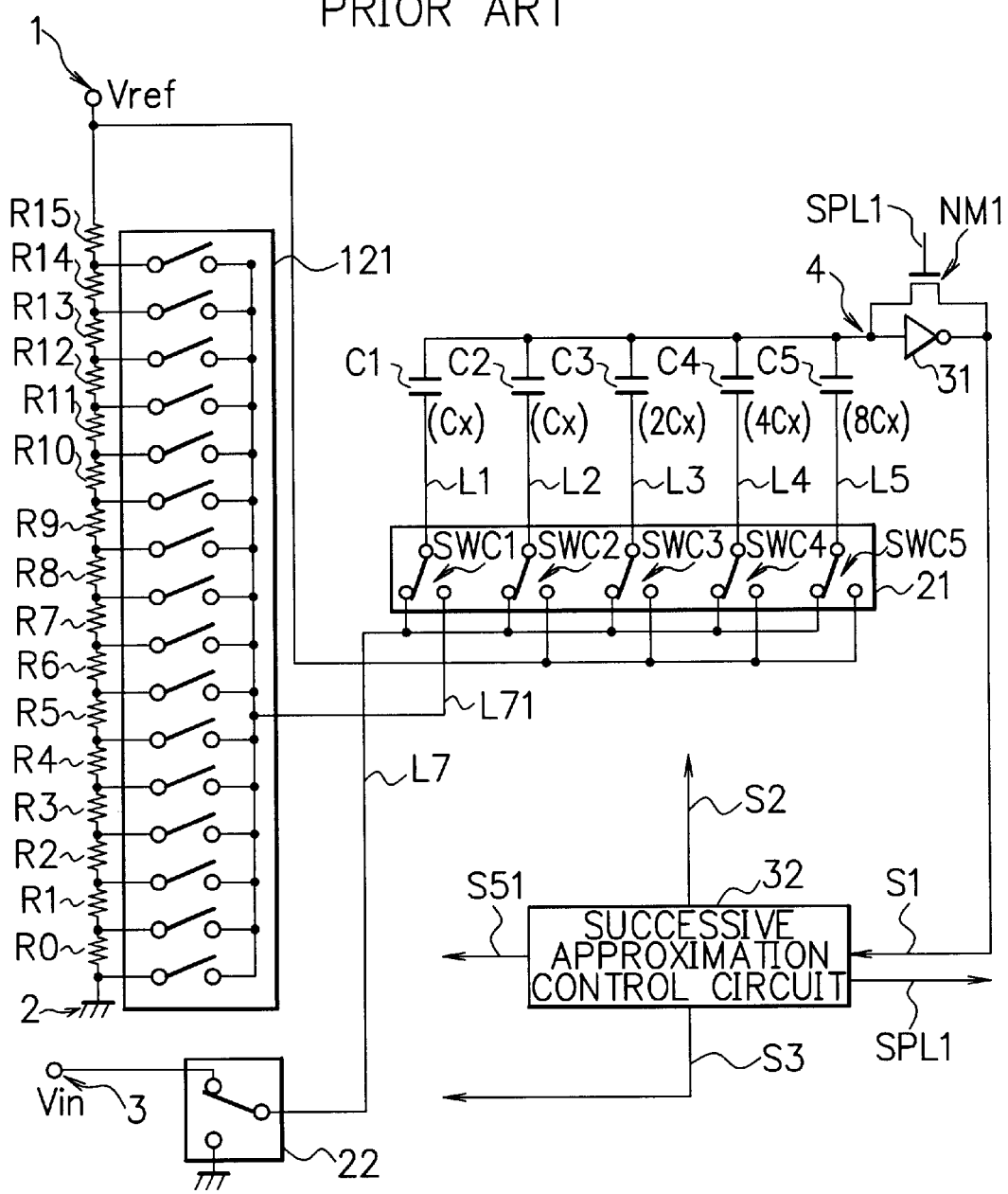
FIG. 2 is a diagram showing another circuit constitution of the successive approximation type A/D converter using the conventional C-R type double stage DAC.

In concrete, in the conventional successive approximation type A/D converter shown in FIG. 2, the resistor type DAC needs to supply all the potentials including the potentials in the vicinity of Vref/2 from 6 Vref/16 to the 10 Vref/16 via the output line L71. However, in the successive approximation type A/D converter according to the third embodiment, the respective resistor DACs do not need to supply the potentials from 6 Vref/16 to 10 Vref/16 via the output lines L6 and L8 as is obvious from FIG. 11 and FIG. 12.

Namely, the successive approximation type A/D converter according to the third embodiment controls a plurality of resistor type DACs so that they do not output the potential near Vref/2 which causes large ON resistance at the CMOS transfer gate. As a result, the CMOS transfer gate can be operated in an area with small ON resistance. Accordingly, the successive approximation type A/D converter according to the third embodiment can be operated at lower voltage as compared at the same ON resistance as the conventional successive approximation type A/D converter.

A design and operational principle of the resistor type DAC according to the third embodiment will be explained in detail.

The resistor type DAC of the successive approximation type A/D converter according to the third embodiment is constructed not to output the potential around Vref/2 from each resistor type DAC, for example, not to have output taps (a terminal and a node) at the portion with the potential of around Vref/2 by the resistor string while realizing the equal function to the 4-bit resistor type DAC in the conventional successive approximation type A/D converter.

The successive approximation type A/D converter according to the third embodiment includes the capacitor C6 for adding the output from the resistor type DACs as compared with the conventional successive approximation type A/D converter shown in FIG. 2. The conventional successive approximation type A/D converter supplies the potential from the resistor type DAC to only the capacity C1, and adds it to the potential Vx of the node 4, but the successive approximation type A/D converter according to the third embodiment supplies the potentials from the resistor type DACs to the capacitors C1 and C6 and adds the potentials supplied to them to the potential Vx of the node 4. Namely, in the successive approximation type A/D converter according to the third embodiment, the capacitance value of the coupled capacitors (C1 and C6) becomes twice with respect to the conventional circuit, and therefore the effect of the potential of the resistor type DAC on the potential Vx of the node 4 becomes substantially twice (to be accurate, multiplied by a coefficient $16/17$) as much as the conventional circuit when, for example, the potentials of the output lines L8 and L6 are the same.

Accordingly, in the successive approximation type A/D converter according to the third embodiment, each of the potentials supplied from the resistor type DAC via the output lines L8 and L6 is set at Vref/4, whereby the same effect as obtained from supplying the potential of Vref/2 via the output line L71 in the conventional circuit as shown in FIG. 2 can be obtained.

For example, when the potential of 15 Vref/16 is supplied from the resistor type DAC, by simply doubling the capacitance value of the coupled capacitors and supplying and adding the potential of 7.5 Vref/16 from each resistor type DAC, reduction in voltage cannot be achieved in the successive approximation type A/D converter, because it is necessary to supply the potential around Vref/2 ultimately. However, in the third embodiment, by setting the potential supplied from the resistor type DACs via the output lines L8 and L6 at 12 Vref/16 and 3 Vref/16, the same effect as in the case of supplying the potential of 15 Vref/16 via the output line L71 in the conventional circuit shown in FIG. 2 is obtained.

Incidentally, when the potentials supplied via the output lines L8 and L6 are added to the potential Vx of the node 4 by the capacitors C1 and C6, the respective potential values supplied via the output lines L8 and L6 are not important, but it is suitable if the sum total of the potential values are the same, as is obvious from the formula (14). If the desired value r in the formula (14) can be distributed to the values p and q so that the potentials supplied via the output lines L8 and L6 do not become around Vref/2, the power supply voltage can be reduced in the successive approximation type A/D converter, and when only one coupling capacitor (the capacitance value Cx) is used, the equivalent effect to supplying the potential of 0 to Vref to the capacitor can be obtained.

A distribution method of the values q and p will be explained.

For convenience of the explanation, it is assumed that continuous potential can be supplied via the output lines L8 and L6.

For example, the range of the potential of 0 to Vref is assumed to be divided into three. The same effects as obtained by supplying the potential from 0 to 2 Vref/3 to a coupling capacitor, which is the only one in the conventional circuit, is obtained by applying the potentials of 0 to Vref/3 to the coupling capacitors C1 and C6 (the resultant capacitance value 2Cx) shown in FIG. 11.

The same effects as obtained by supplying the potential exceeding 2 Vref/3 to a coupling capacitor, which is the only one in the conventional circuit, can be obtained by applying the potential exceeding 2 Vref/3 to one capacitor of the capacitors C1 and C6 shown in FIG. 11, and applying 0 (V) to the other capacitor. In this case, the ranges of the potentials supplied via the output lines L8 and L6 are 0 to Vref/3, and 2 Vref/3 to Vref, and the potential from Vref/3 to 2 Vref/3 does not need to be supplied via the output lines L8 and L6. Namely, in the third embodiment, each of the resistor type DAC outputs only the potential in the range of 0 to Vref/3, and 2 Vref/3 to Vref, and by optional combination of them, the same function as in the conventional resistor type DAC can be realized.

The values of actual potentials supplied via the output lines L8 and L6 are discrete values, and therefore it is suitable to apply the explanation to the discrete values. For example, the range of the potential from 0 to Vref is divided into three ranges of 0 to 5 Vref/16, 6 Vref/16 to 10 Vref/16, and 11 Vref/16 to 15 Vref/16. The same effect as obtained by applying 10 Vref/16 in the conventional circuit can be obtained by applying the potential of 5 Vref/16 to each of the coupling capacitors C1 and C6. The same effect as obtained by applying the potential of 11 Vref/16 in the conventional circuit can be obtained by applying the potential of 11 Vref/16 to one capacitor (for example, the capacitor C1) of the coupling capacitors C1 and C6, and applying 0 to the other capacitor (for example, the capacitor C6).

Namely, the function of supplying the potential of 0 to 10 Vref/16 via the output line L71 in the conventional circuit can be realized by supplying optional potentials within the range of 0 to 5 Vref/16 via the output lines L8 and L6 in the third embodiment. The function of supplying the potential of 11 Vref/16 to 15 Vref/16 via the output line L71 in the conventional circuit can be realized by supplying the potential of 11 Vref/16 or higher via one of the output lines L8 and L6, supplying the potential of 3 Vref/16 or lower via the other one, and combining them in the third embodiment. In this manner, the desired value r is distributed to the values p and q so that the potentials supplied via the output lines L8 and L6 do not become around Vref/2.

According to the third embodiment, the combination as shown in FIG. 12 is shown as an example of the potentials supplied via the output lines L8 and L6, but it is sufficient to decide the values p and q so as to meet the relation of p+q=r, and various modifications of the circuit constitution, the control method of the switches SWAn and SWBn and the like can be made. It goes without saying that the power supply voltage can be also reduced as in the successive approximation type A/D converter shown in FIG. 11 in this case.

For example, in the CMOS transfer gate for obtaining the output from the resistor string, when threshold voltage VTHP of the P-channel transistor is higher than threshold voltage VTHN of the N-channel transistor, the potential of 6 Vref/16 may be used instead of using the potential of 11 Vref/16.

In this case, when the value of the inputted digital code is "12" or smaller, the potentials of 6Vref/16 or lower are supplied to the capacitors C1 and C6 via the output lines L8 and L6, for example, as 6 Vref/16+6 Vref/16=12 Vref/16. When the value of the digital code is "13" or larger, at least the potential of 13 Vref/16 or higher is supplied to one of the capacitors C1 and C6. As described above, by using the potential of 6 Vref/16 instead of using the potential of 11 Vref/16, the voltage between the gate and source of the P-channel transistor can be made higher. The potential in the range of 7 Vref/16 to 12 Vref/16 is not used.

On the other hand, when the threshold voltage VTHN of the N-channel transistor is higher than the threshold voltage VTHP of the P-channel transistor, if the value of the inputted digital code is "8" or less, the potentials of 4 Vref/16 or less are supplied to the capacitors C1 and C6 via the output lines L8 and L6, respectively as, for example, 4 Vref/16+4 Vref/16=8 Vref/16. If the value of the digital code is "9" or more, at least the potential of 9 Vref/16 or higher is supplied to one of the capacitors C1 and C6. In this manner, by using the potential of 9 Vref/16, instead of using the potential of 5 Vref/16, the voltage between the gate and source of the N-channel transistor can be made higher. The potential in the range of 5 Vref/16 to 8 Vref/16 is not used.

In the explanation, the one end of the capacitor C6 is set at OV (GND) in a sampling operation, but a predetermined potential may be supplied to the one end of the capacitor C6 during sampling operation, which makes it possible to have no effect on the comparison result based on the formula (14). Namely, the potential which is supplied from the second selector 12 (resistor type DAC) to be added by the capacitor C6 is sufficient if it can change by the required value q in increments of Vref/16 with respect to a predetermined potential, and the absolute value is not necessarily the potential shown in FIG. 12.

Next, a control circuit for the resistor type DACs for supplying the potentials via the output lines L8 and L6 as shown in FIG. 12 will be explained.

The control circuit for the resistor type DACs is provided inside the successive approximation control circuit 32 shown in FIG. 11. By constituting the control circuit as shown in, for example, FIG. 14 and FIG. 15, the function shown in FIG. 12 can be realized.

FIG. 14 and FIG. 15 are diagrams showing an example of the control circuit for the resistor type DAC.

In FIG. 14 and FIG. 15, SAR3, SAR2, SAR1 and SAR0 are signals corresponding to 4 bits (corresponding to low-order 4 bits in the A/D conversion output) from the highest order bit of the inputted digital code (binary code) to the lowest order bit. SAn and SBn (n is an integer) are selection signals for opening and closing the switches SWAn and SWBn provided at the first and the second selectors 11 and 12. The selection signal is selected with "H" (the switch is closed).

INV0 to INV9 denote inverter circuits, NOR1 to NOR13 denote NOR circuits, and NAND1 to NAND20 denote NAND circuits.

The control circuit for the resistor type DAC shown in FIG. 14 and FIG. 15 can be easily designed by considering FIG. 12 showing the functions (characteristics) of the resistor type DAC as a truth table.

In concrete, the condition of the switch SWAO inside the first selector 11 being selected is the condition of the value of the column of the output line L8 being "0" in FIG. 12, namely, that the value of the signals SAR3 and SAR2 is "00". Accordingly, the circuit for outputting the selection signal SA0 is constituted of logic circuits INV3, INV2 and NAND1 which are connected to output "L" when the value of the signals SAR3 and SAR2 is "00" ("LL") as shown in FIG. 14, and a logic circuit INV4, to which the output of the logic circuit NAND1 is inputted, and which inverts the signal to output it as a signal SAO.

Similarly, the condition of the switch SWA4 being selected, is that the value of the signals SAR3 and SAR2 is "01", and the value of the signals SAR3, SAR2, and SAR1 is "100". Accordingly, the circuit for outputting the selection signal SA4 is constituted of the logic circuits INV3 and NAND3 which are connected to output "L" when the value of the signals SAR3 and SAR2 is "01" ("LH"), the logic circuits INV2, INV1 and NAND4 which are connected to output "L" when the value of the signals SAR3, SAR2 and SAR1 is "100" ("HLL"), and the logic circuit NAND5 in which the output of the logic circuits NAND3 and NAND4 are inputted and which outputs the arithmetic operation result as the selection signal SA4.

The condition of the switch SWA5 being selected is that the value of the signals SAR3, SAR2, SARi and SARO is "1010". The circuit for outputting the selection signal SA5 is constituted of the logic circuits INV2 and NAND6 which are connected to output "L" when the signals SAR3 and SAR2 are "10" ("HL"), the logic circuits INVO and NAND7 which are connected to output "L" when the signals SARi and SARO are "10" ("HL"), and the logic circuit NOR1 in which the output of the logic circuits NAND6 and NAND7 is inputted, and which outputs the arithmetic operation result as the signal SA5.

The condition of the switch SWA11 being selected is that the value of the signals SAR3, SAR2, SARi and SARO is "1011". The circuit for outputting the selection signal SA11 is constituted of the logic circuits INV2 and NAND 8 which are connected to output "L" when the value of the signals SAR3 and SAR2 is "10" ("HL"), the logic circuit NAND9 for outputting "L" when the value of the signals SARi and SARO is "11" ("HH"), and the logic circuit NOR2 in which the output of the logic circuit NAND8 and NAND9 is inputted, and which outputs the arithmetic operation result as the signal SA11.

The condition of the switch SWA12 is selected is that the value of the signals SAR3 and SAR2 is "11". The circuit for outputting the selection signal SA12 is constituted of the logic circuit NAND2 for outputting "L" when the value of the signals SAR3 and SAR2 is "11" ("HH"), and the logic circuit INV5 in which the output of the logic circuit NAND2 is inputted and which inverts the signal to output it as the signal SA12.

Similarly, the condition of the switch SWB0 inside the second selector 12 being selected is that the value of the signals SAR1 and SARO is "00" and the value of the signals SAR3 and SAR2 is not "10", and that the value of the signals SAR3, SAR2, SAR1 and SARO is "1011". The condition of the switch SWBl being selected is that the value of the signals SAR1 and SARO is "01" and the value of the signals SAR3 and SAR2 is not "10".

The condition of the switch SWB2 being selected is that the value of the signals SAR1 and SAR0 is "10" and the value of the signals SAR3 and SAR2 is not "10". The condition of the switch SWB3 being selected is that the value of the signals SAR1 and SARO is "11" and the value of the signals SAR3 and SAR2 is not "10". The condition of the switch SWB4 being selected is that the value of the signals SAR3, SAR2, SAR1 and SARO is "1000". The condition of the switch SWB5 being selected is that the value of the signals SAR3, SAR2, SAR1 and SAR0 is "1001", and that the value of the signals SAR3, SAR2, SAR1, and SAR0 is "1010".

The control circuit for outputting the selection signals SB0 to SB5 as shown in FIG. 15 is constituted similarly to the control circuit for controlling the switch SWAn in the first selector 11.

As explained above, if the functions (characteristics) of the resistor type DAC, as shown in, for example, FIG. 12 are decided, the control circuit for controlling the first and the second selectors 11 and 12 as described above can be easily designed.

The control circuits of the resistor type DACs in a fourth to a seventh embodiments that will be described later may be constituted similarly to the control circuit of the resistor type DAC in the third embodiment.

Fourth Embodiment

Next, a fourth embodiment of the present invention will be explained.

The successive approximation type A/D converter according to the third embodiment realizes the DAC operation corresponding to 4 bits by selecting in the first and the second selectors 11 and 12 the potential obtained by resistor potential division by the resistors R0 to R15, and supplying and adding the potential to the one ends of the capacitors C1 and C6 having the same capacitance value Cx, respectively.

The successive approximation type A/D converter according to the fourth embodiment that will be explained below uses a capacitor having the capacitance value 2Cx that is double the capacitance value of the capacitor C6 (capacitance value Cx) in the third embodiment instead of the capacitor C6.

Figure 16:
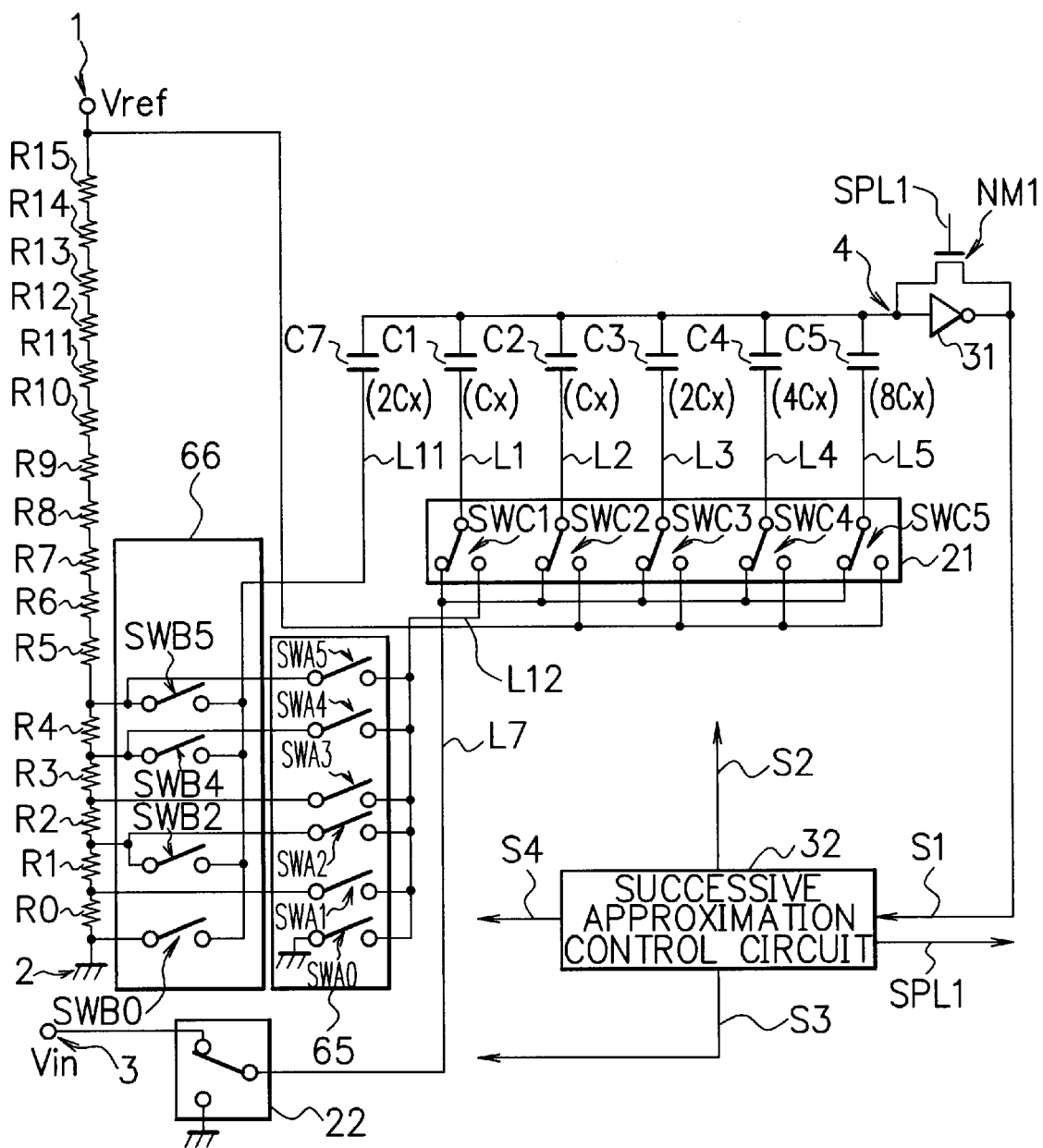
FIG. 16 is a circuit diagram showing a constitution example of a successive approximation type A/D converter according to a fourth embodiment.

FIG. 16 is a circuit diagram showing a constitution example of the successive approximation type A/D converter according to the fourth embodiment of the present invention. In FIG. 16, the components and the like having the same functions as the components and the like shown in FIG. 11 are given the same reference numerals and symbols and the overlapping explanation will be omitted.

In FIG. 16, C7 denotes a capacitor, and when the capacitance value of a capacitor C1 is assumed to be Cx, the capacitance value of the capacitor C7 is 2Cx. For example, in order to secure the relative accuracy of the capacitance value, the capacitor C7 is constituted by connecting two unit capacitors Cx in parallel. One end of the capacitor C7 is connected to an output end of a second selector 66 via an output line L11, and the other end is connected to a node 4.

A first and a second selector 65 and 66 correspond to the first and the second selector 11 and 12 respectively shown in FIG. 11. The first selector 65 includes switches SWA0 to SWA5, and the second selector 66 includes switches SWB0, SWB2, SWB4 and SWB5. One end of an output line L12 is connected to an output end of the first selector 65, and the other end is connected to a second terminal of a switch SWC1.

Next, an operation will be explained.

A sampling operation and a comparison operation for deciding the value of high-order 4 bits of the digital data are the same as in the third embodiment.

However, in the fourth embodiment, the capacitor C7 (capacitance value 2Cx) is used instead of the capacitor C6 (capacitance value Cx), and thus in the sampling operation, electric charge Q stored in the capacitors C1 to C5, and C7 is as expressed in the following formula (15).

$$Q=-16Cx(Vin-VTL)+2CxVTL \quad (15)$$

The potential Vx of the node 4 by redistribution of the electric charge at the time of the comparison operation for deciding the value of high-order 4 bits of the digital data is as expressed in the following formula (16).

$$Vx=(^{16}/_{18})[(m/16)Vref-Vin]+VTL \quad (16)$$

Here, the resultant capacitance value of the capacitor with one end being connected to the power supply terminal 1 in the capacitors C1 to C5 is assumed to be mCx (m is an integer from 0 to 15), and the resultant capacitance value of the capacitor with its one end being connected to the ground is assumed to be (16−m)Cx.

Accordingly, the value of the high-order 4 bits of the digital data can be decided based on the formula (16) as in the third embodiment.

After the value of the high-order 4 bits of the digital data is decided, the successive approximation type A/D converter decides the value of low-order 4 bits. As in the third embodiment, the successive approximation control circuit 32 controls the first and the second selectors 65 and 66, and changes the potentials, which are supplied to one end of the capacitor C1 having the capacitance value Cx which is 1/16 of a total capacitance value 16Cx of the sampling capacitors C1 to C5, and to one end of the capacitor C7 having the capacitance value 2Cx which is 2/16 with respect to the total capacitance value. Thereby, the potential Vx of the node 4 is changed in increments of 1/256 of the reference potential Vref, and it is determined whether the potential Vx of the node 4 is higher than the logical threshold voltage VTL or not, whereby the value of the lower-order 4 bits is decided.

In the successive approximation type A/D converter shown in FIG. 16, the resistors R0 to R15 and the first selector 65 constitute a resistor type DAC, similarly, the resistors R0 to R15 and the second selector 66 constitute one resistor type DAC, and the two resistor type DACs and the capacitors C1 and C7 function as the resistor type DAC with 4-bit accuracy as a whole. The function operation of the resistor type DAC with 4-bit accuracy is shown in FIG. 17. The first and the second selector 65 and 66 of the successive approximation type A/D converter shown in FIG. 16 output only the potential in the range of 0 to 5 Vref/16 via the output lines L11 and L12 as shown in FIG. 17. Accordingly, in the successive approximation type A/D converter shown in FIG. 16, the switches SWAn and SWBn included in the first and the second selector 65 and 66 are not limited to the transfer gates each constituted of one P-channel transistor and one N-channel transistor, but they may be constituted of only the N-channel transistors.

The potential Vx of the node 4, which is decided by redistribution of electric charge when the potential of the output lines L11 and L12 (line L1) is controlled as shown in FIG. 17, will be explained.

Similarly to the third embodiment, the resultant capacitance value of the capacitors C2 to C5 the one ends of which are connected to the power supply terminal 1 is assumed to be mCx (m=0 to 15), and the resultant capacitance value of the capacitors C2 to C5 the one ends of which are connected to the ground is assumed to be (15−m)Cx. The potential supplied to the one end of the capacitor C1 via the output line L12 is expressed by q Vref/16 (q is an integer of 0 to 15), and the potential supplied to the one end of the capacitor C7 via the output line L11 is expressed by s Vref/16 (s is an integer of 0 to 15).

In this situation, if the electric charge Q expressed by the formula (15) is stored, the potential Vx of the node 4 by redistribution of the electric charge is $$Vx=(^{16}/_{18})[(m/16)Vref+((2s+q)/256)Vref-Vin]+VTL \quad (17).$$

Here, if 2s+q=r, and the values s and q are selected so that the digital code (decimal digit) inputted into the resistor type DAC becomes equal to the value r as shown in FIG. 17, the formula (17) is expressed by the following formula (18).

$$Vx=(16/18)[(m/16)Vref+(r/256)Vref-Vin]+VTL \qquad (18)$$

In FIG. 17, the values of the output lines L11 and L12 (output voltage values) correspond to the values s and q, respectively, and therefore the value of (output line L11)× 2+(output line L12) shown in FIG. 17 is equal to the value r (=2s+q). The resistor type DAC shown in FIG. 16 is constituted so that the values s, q, and r have the relationship shown below with respect to the inputted digital codes. The inputted digital codes are shown in decimal digit.

When the digital code is "0", s=0, q=0, r=0
When the digital code is "1", s=0, q=1, r=1
When the digital code is "2", s=0, q=2, r=2
When the digital code is "3", s=0, q=3, r=3
When the digital code is "4", s=2, q=0, r=4
When the digital code is "5", s=2, q=1, r=5
When the digital code is "6", s=2, q=2, r=6
When the digital code is "7", s=2, q=3, r=7
When the digital code is "8", s=4, q=0, r=8
When the digital code is "9", s=4, q=1, r=9
When the digital code is "10", s=4, q=2, r=10
When the digital code is "11", s=4, q=3, r=11
When the digital code is "12", s=5, q=2, r=12
When the digital code is "13", s=5, q=3, r=13
When the digital code is "14", s=5, q=4, r=14
When the digital code is "15", s=5, q=5, r=15

The resistor type DAC shown in FIG. 16 is constituted to add up the potentials supplied via the output lines L11 and L12 by the capacitors C1 and C7 so that the value r can take all the integers from 0 to 15, whereby it becomes the DAC equivalent to 4 bits.

Here, as in the third embodiment, it can be found that the potential Vin of the analog input signal is the potential within the range of 16 Vref/256 with respect to the potential corresponding to the value m when the value m of the high-order 4 bits of the digital data is decided by the capacitor type DAC.

Accordingly, after the value m of the high-order 4 bits of the digital data is decided, the potential Vx of the node 4 is changed in the range of 0×Vref/256 to 15×Vref/256 (increments of Vref/256 (to be accurate, 16/18 times)) by the resistor type DAC having the characteristics shown in FIG. 17. Then, it is determined by the comparator 31 whether the potential Vx is higher than the logical threshold voltage VTL or not, and the value r of the low-order 4 bits is decided.

In FIG. 16, the combination as shown in FIG. 17 is shown as an example of the potentials supplied via the output lines L11 and L12, but it is sufficient if the values s and q are decided to meet the relationship of 2s+q=r as is obvious from the formulas (17) and (18), and various modifications of the circuit constitution, the control method of the switches SWAn and SWBn and the like are possible.

Figure 18:
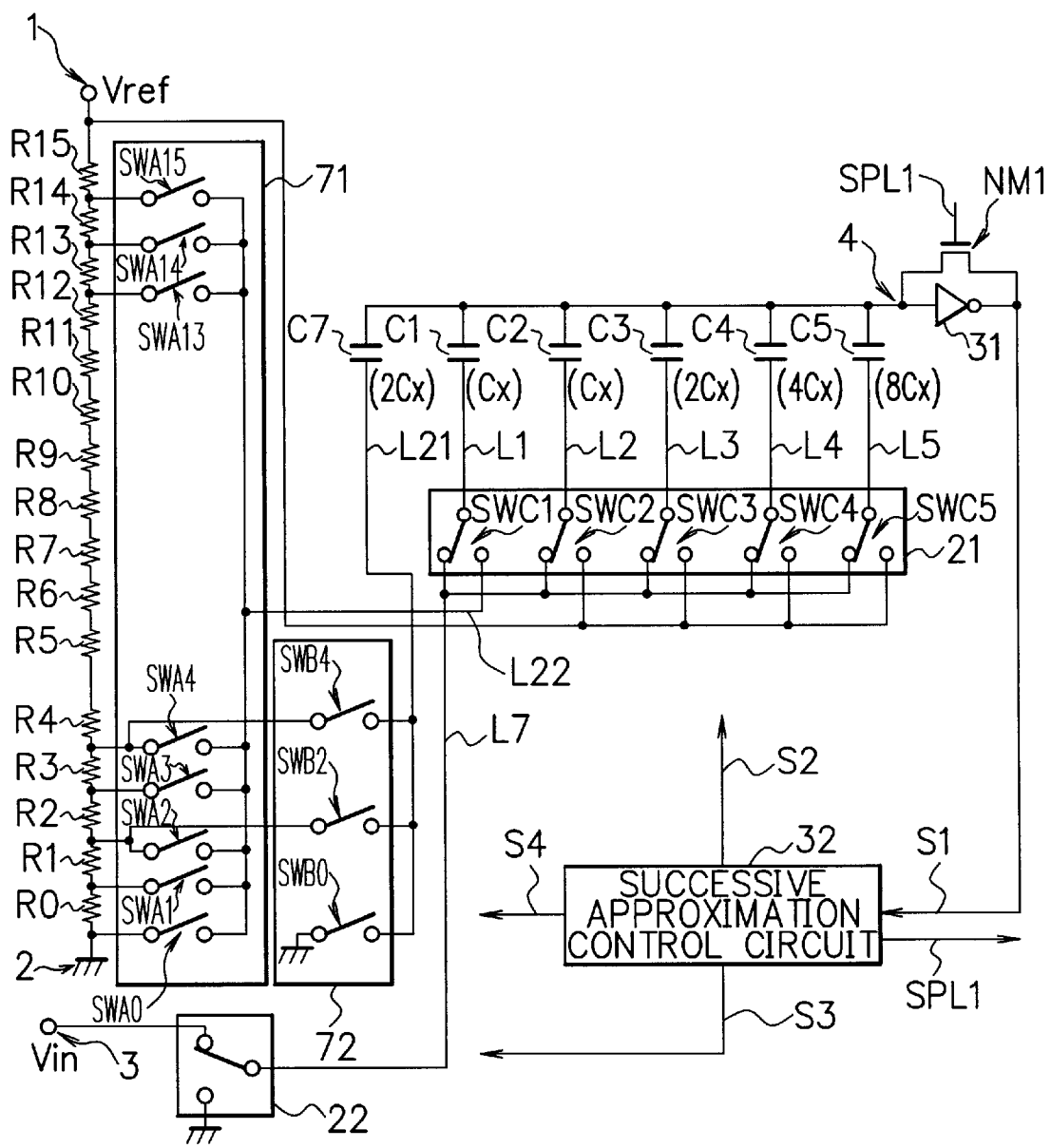
FIG. 18 is a circuit diagram showing another constitution example of the successive approximation type A/D converter according to the fourth embodiment.

For example, the successive approximation type A/D converter can be constituted as shown in FIG. 18.

FIG. 18 is a circuit diagram showing another constitution example of the successive approximation type A/D converter according to the fourth embodiment. In the successive approximation type A/D converter shown in FIG. 18, first and second selectors 71 and 72 have different constitutions from those of the first and second selectors 65 and 66 shown in FIG. 16, respectively. In FIG. 18, the same components and the like having the same functions as the components and the like shown in FIG. 11 and FIG. 16 are given the same reference numerals and symbols, and the overlapping explanation will be omitted.

In FIG. 18, 71 and 72 denote the first and the second selector, which correspond to the first and the second selector 11 and 12 shown in FIG. 11, respectively. The first selector 71 includes the switches SWA0 to SWA4, and SWA13 to SWA15, and the second selector 72 includes the switches SWB0, SWB2 and SWB4.

One end of the output line L22 is connected to an output end of the first selector 71, and the other end is connected to a second terminal of the switch SWC1. One end of the output line L21 is connected to an output end of the second selector 72 and the other end is connected to one end of a capacitor C7.

Operations (sampling operation, and comparison operation) of the successive approximation type A/D converter shown in FIG. 18 are the same as the operations of the successive approximation type A/D converter shown in FIG. 16, though only the control of the switches SWAn and SWBn (selection of the values s, q shown in the formula (17)) for deciding the low-order 4 bits of the digital code is different.

In the successive approximation type A/D converter shown in FIG. 18, the resistors R0 to R15, the first selector 71, the second selector 72 and the capacitors C1 and C7 realize the function operation shown in FIG. 19, and function as a resistor type DAC with 4-bit accuracy as a whole. The first and the second selector 71 and 72 shown in FIG. 18 are constituted so as not to output the potential in the range of 5 Vref/16 to 12 vref/16 itself as shown in FIG. 19.

The resistor type DAC shown in FIG. 18 is constituted so that the values s, q, and r shown in the formulas (17) and (18) have the relationship shown below with respect to the inputted digital codes. The inputted digital codes are shown in decimal digit.

When the digital code is "0", s=0, q=0, r=0
When the digital code is "1", s=0, q=1, r=1
When the digital code is "2", s=0, q=2, r=2
When the digital code is "3", s=0, q=3, r=3
When the digital code is "4", s=2, q=0, r=4
When the digital code is "5", s=2, q=1, r=5
When the digital code is "6", s=2, q=2, r=6
When the digital code is "7", s=2, q=3, r=7
When the digital code is "8", s=4, q=0, r=8
When the digital code is "9", s=4, q=1, r=9
When the digital code is "10", s=4, q=2, r=10
When the digital code is "11", s=4, q=3, r=11
When the digital code is "12", s=4, q=4, r=12
When the digital code is "13", s=0, q=13, r=13
When the digital code is "14", s=0, q=14, r=14
When the digital code is "15", s=0, q=15, r=15

The resistor type DAC of the successive approximation type A/D converter according to the fourth embodiment will be explained.

In the successive approximation type A/D converter according to the fourth embodiment, the two output lines from the first and the second selector are provided as the output of the resistor type DAC, and the potentials respectively supplied via the output lines are added by the capacitors C1 and C7. In the successive approximation type A/D converter according to the fourth embodiment, the total capacitance value of the coupling capacitors C1 and C7 is three times as large as that in the conventional circuit. Accordingly, when the potentials supplied via the output lines are the same, the effect the potential supplied from the resistor type DAC gives to the potential Vx of the node 4 becomes three times as much as that in the prior art.

Namely, substantially the same effect of supplying the potential of Vref to the one end of the capacitor C1 via the output line L71 in the successive approximation type A/D converter shown in FIG. 2 can be obtained by supplying the potential of Vref/3 from the first and the second selector, respectively, via the two output lines. This circuit which realizes this principle in concrete is the successive approximation type A/D converter shown in FIG. 16.

As in the third embodiment, when the potentials supplied from the first and second selectors via the two output lines are added to the potential Vx of the node 4 by the capacitors C1 and C7, it is not the respective potential values supplied via the two output lines that are important, but it is suitable if the weighted sum of $2s+q=r$ is the same, as is obvious from the formulas (17) and (18). Namely, in order to reduce voltage in the successive approximation type A/D converter, it is suitable to distribute the desired value r in the formula (18) to the values s and q so that the potentials supplied via the two output lines do not become around Vref/2.

Distribution of the values s and q in the successive approximation type A/D converter shown in FIG. 18 will be explained.

First, the range of the potential from 0 to Vref is divided into four. The same effect of supplying the potential from 0 to 3 Vref/4 to a coupling capacitor, which is the only one in the conventional circuit, can be obtained by applying the potential from 0 to Vref/4 to the coupling capacitors C1 and C7 (resultant capacitance value 3Cx). The same effect of supplying the potential exceeding 3 Vref/4 to a coupling capacitor, which is only one in the conventional circuit, can be obtained by supplying the potential exceeding 3 Vref/4 to the capacitor C1 (capacitance value Cx) and applying 0 (V) to the capacitor C7 (capacitance value 2Cx).

Accordingly, in the successive approximation type A/D converter shown in FIG. 18, the range of the potentials supplied via the output lines L21 and L22 is from 0 to Vref/4 and from 3 Vref/4 to Vref, the same function as the conventional resistor type DAC is realized by arbitrary combination of them, and the potentials in the range from Vref/4 to 3 Vref/4 do not have to be supplied via the output lines L21 and L22. In. this manner, the desired value r can be distributed to the values s and q so that the potentials supplied via the output lines L21 and L22 do not become around Vref/2.

As explained as above, according to the fourth embodiment, the successive approximation control circuit 32 controls a plurality of resistor type DACs so that the potential around Vref/2 is not outputted from the plurality of resistor type DACs using the resistor string constituted of the resistors R0 to R15, and adds the potentials supplied from the plurality of resistor type DACs by the capacitors.

Consequently, the same function as one resistor type DAC can be realized by adding the potentials supply from the plurality of resistor type DACs without outputting the potential around Vref/2 itself at which the ON resistance of the switch becomes high when it is outputted from the resistor type DAC, therefore making it possible to perform A/D conversion of, for example, 8 bits as in the conventional successive approximation type A/D converter and reduce the power supply voltage.

As is obvious from the drawings, the successive approximation type A/D converter shown in FIG. 18 has the wider range of potential which is not used (not supplied via the first and second selectors 71 and 72) in comparison with the successive approximation type A/D converter shown in FIG. 16, and therefore, it is capable of operation at lower voltage as compared with the successive approximation type A/D converter shown in FIG. 16. For example, when the reference potential (power supply voltage) Vref is about 3V, the successive approximation type A/D converter shown in FIG. 18 can reduce the power supply voltage by about 0.2V (Vref/16) as compared with the successive approximation type A/D converter shown in FIG. 16.

On the other hand, the successive approximation type A/D converter shown in FIG. 16 has the smaller number of switches SWAn connected to the output line L12 and junction capacitance by junction is smaller as compared with the successive approximation type A/D converter shown in FIG. 18, therefore making a delay time and the like shorter as compared with the successive approximation type A/D converter shown in FIG. 18.

Accordingly, if various kinds of modified circuits are selected according to the conditions required of the successive approximation type A/D converter, in consideration of an increase in junction capacitance, the voltage range not used and the like, a more suitable successive approximation type A/D converter can be constituted.

The successive approximation type A/D converters according to the third and fourth embodiments will be compared. The successive approximation type A/D converter according to the third embodiment uses the capacitor C6 having the capacitance value Cx, and the successive approximation type A/D converter according to the fourth embodiment uses the capacitor C7 having the capacitance value 2Cx. Accordingly, the successive approximation type A/D converter according to the third embodiment has less increase in the circuit area and a shorter delay time by the resistors constituting the resistor type DAC and the capacitor C6 (time constant is smaller), thus making it possible to perform A/D conversion more quickly, as compared with the successive approximation type A/D converter according to the fourth embodiment.

On the other hand, the successive approximation type A/D converter according to the fourth embodiment uses the capacitor C7 having the doubled capacitance value 2Cx, and thereby doubles the potential supplied to the capacitor C7 and adds it as an output of the resistor type DAC. As a result, the successive approximation type A/D converter according to the fourth embodiment has a wider range of potential which is not used (½ of the entire range at the maximum, while in the third embodiment, ⅓ of the entire range at the maximum) as compared with the third embodiment, thus making it possible to reduce the power supply voltage more and reduce the number of switches included in the first and the second selector as a whole.

Fifth Embodiment

Next, a fifth embodiment of the present invention will be explained.

A successive approximation type A/D converter according to the fifth embodiment is a successive approximation type A/D converter, with the resistor type DACs (4-bit accuracy) in the third and fourth embodiments being made a resistor type DAC with 5-bit accuracy, which is capable of 9-bit A/D conversion as the entire A/D converter.

Figure 20:
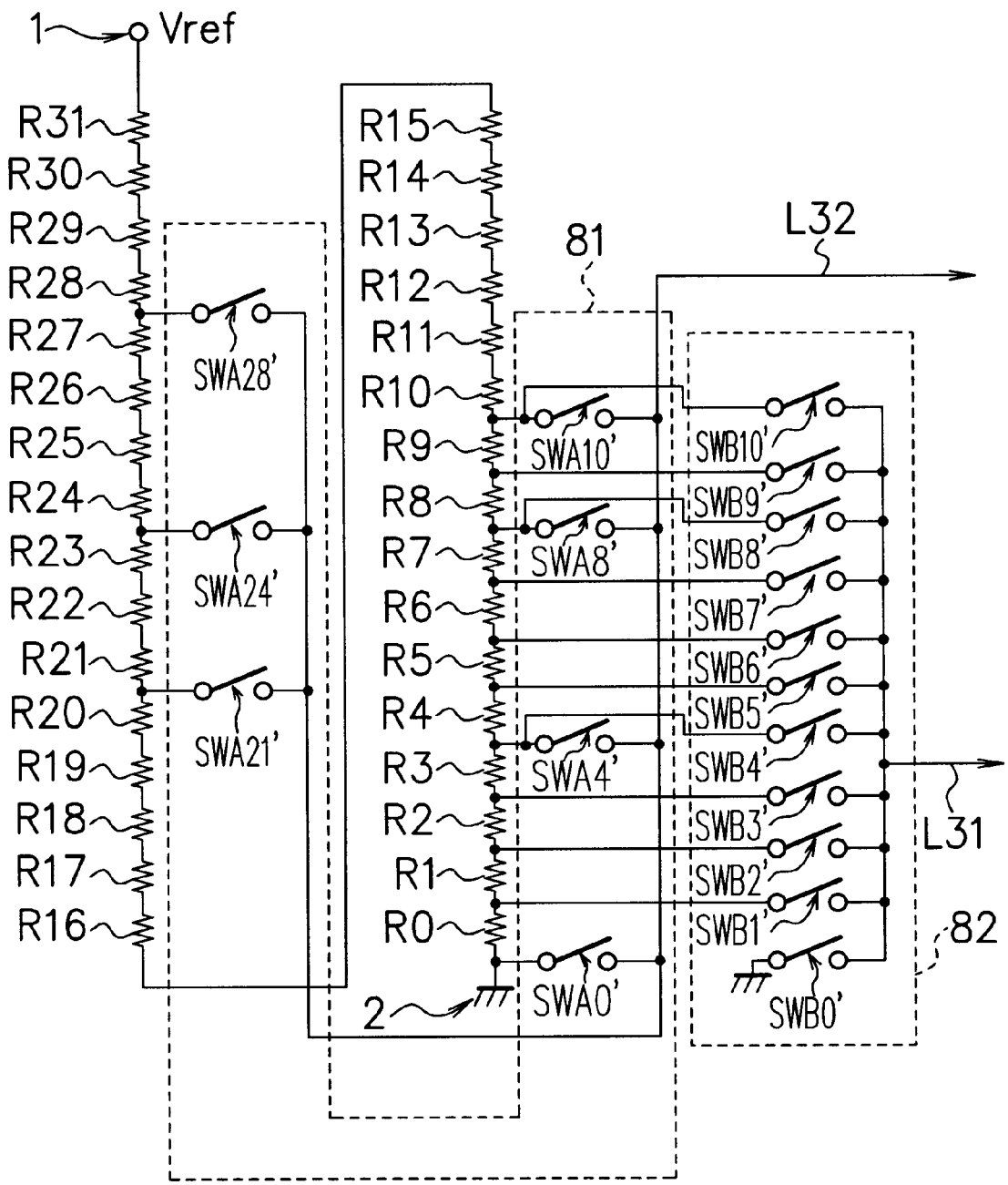
FIG. 20 is a circuit diagram showing a constitution example of a resistor DAC of a successive approximation type A/D converter according to a fifth embodiment.

FIG. 20 is a circuit diagram showing a constitution example of a resistor type DAC of the successive approximation type A/D converter according to the fifth embodiment of the present invention. In FIG. 20, the circuits other than resistor strings and a first and a second selector 81 and 82 are not shown, but the capacitor type DAC, the comparator 31, the successive approximation control circuit 32 and the like are the same as in the circuit constitution shown in FIG. 11.

In FIG. 20, R0 to R31 denote resistors having equal resistance values, and they are connected in series in the order of the resistors R0, R1, R2, . . . , R31 from the side of a ground terminal 2 to a side of a power supply terminal 1 between the power supply terminal 1 and the ground terminal 2.

A first and a second selector 81 and 82 correspond to the first and the second selector 11 and 12 shown in FIG. 11. The first selector 81 includes switches SWA0', SWA4', SWA8', SWA10', SWA21', SWA24' and SWA28', and the second selector 82 includes switches SWB0' to SWB10'. The switches SWAn' and SWBn' are the switches for selecting the potential of (Vref/32)×n, and are controlled according to a control signal from a successive approximation control circuit not shown.

Output lines L32 and L31 correspond to the output lines L8 and L6 shown in FIG. 11, respectively. Though not shown, the output line L32 is connected to a second terminal of a switch SWC1 to be connectable to one end of a capacitor C1 (capacitance value Cx), and the output line L31 is connected to one end of a capacitor C6 (capacitance value Cx).

Namely, as in the third embodiment, the resistors R0 to R31 and the first selector 81 constitute one resistor type DAC, the resistors R0 to R31 and the second selector 82 similarly constitute one resistor type DAC, potentials which the two resistor type DACs supply via the output lines L32 and L31 are added to the potential Vx of the node 4 by the capacitors C1 and C6 not shown, and the two resistor type DACs function as a resistor type DAC with 5-bit accuracy as a whole.

FIG. 21 is a diagram showing function operations of the resistor type DAC with 5-bit accuracy shown in FIG. 20. As shown in FIG. 21, the first and the second selector 81 and 82 output only the potential in the range of 0 to 10 Vref/32, and the potentials of 21 Vref/32, 24 Vref/32, and 28 Vref/32 via the output lines L31 and L32.

Next, an operation will be explained.

A sampling operation and conversion of high-order 4 bits by a capacitor type DAC in a comparison operation are the same as the operations in the third embodiment, and therefore the explanation thereof will be omitted.

After the value of the high-order 4 bits of the digital data is decided, the successive approximation control circuit not shown controls the first and the second selector 81 and 82 to change the potentials supplied to one ends of the capacitors C1 and C6 having the capacitance value Cx, respectively as in the third embodiment. Thereby, the successive approximation control circuit changes a potential Vx of the node 4 in increments of 1/512 of the reference potential Vref, and determines whether the potential Vx of the node 4 is higher than the logical threshold voltage VTL or not, whereby it decides the value of low-order 5 bits.

Next, the potential Vx of the node 4, which is decided by redistribution of electric charge when the potentials of the output lines L31 and L32 (line L1) are controlled, as shown in FIG. 21, will be explained.

As in the third embodiment, a resultant capacitance value of the capacitors C2 to C5 one ends of which are connected to the power supply terminal 1 is assumed to be mCx (m is an integer of 0 to 15), and a resultant capacitance value of the capacitors C2 to C5 the one ends of which are connected to the ground is assumed to be (15−m)Cx. The potential supplied to the one end of the capacitor C1 via the output line L32 (line L1) is expressed by t Vref/32 (t is an integer of 0 to 31), and the potential supplied to the one end of the capacitor C6 via the output line L31 is expressed by u Vref/32 (u is an integer of 0 to 31)

In this situation, when the electric charge Q expressed by the formula (11) is assumed to be stored, the potential Vx of the node 4 by redistribution of the electric charge is $$Vx=(16/17)[(m/16)Vref+((t+u)/512)Vref-Vin]+VTL \qquad (19).$$

Here, when t+u=v, and the values t and u are selected so that the digital code (decimal digit) and the value v become equal as shown in FIG. 21, the formula (19) is expressed by the following formula (20).

$$Vx=(16/17)[(m/16)Vref+(v/512)Vref-Vin]+VTL \qquad (20)$$

Since the values of the output lines L31 and L32 (output volume values) correspond to the values u and t, respectively in FIG. 21, the value of (output line L31)+(output line L32) shown in FIG. 21 is equal to the value v (=t+u).

Accordingly, as in the third embodiment, the resistor type DACs shown in FIG. 20 are constructed so that the potentials supplied via the two output lines L32 and L31 are added by the capacitors C1 and C6, and the value v can take all the integer values from 0 to 31, whereby the resistor type DAC equivalent to 5 bits can be realized. Consequently, 9-bit A/D conversion can be realized in the entire successive approximation type A/D converter.

As for distribution of the values t and u, the same effect as obtained by dividing the range of the potential of 0 to Vref into three and supplying the potential of 0 to 2 Vref/3 to a coupling capacitor, which is the only one in the conventional circuit, can be obtained by applying the potentials of 0 to Vref/3 to the coupling capacitors C1 and C6 (resultant capacitance value 2Cx), as in the third embodiment. The same effect as obtained by supplying the potential exceeding 2 Vref/3 to a coupling capacitor, which is the only one in the conventional circuit, can be obtained by supplying at least the potential exceeding 2 Vref/3 to one capacitor of the capacitors C1 and C6. Accordingly, even if the resistor type DAC is made the resistor type DAC with 5-bit accuracy, the successive approximation type A/D converter can be constituted as in the third embodiment.

In FIG. 20, the combination as shown in FIG. 21 is shown as an example of a distribution method of the potentials supplied via the output lines L32 and L31, namely, the values t and u, but the combination of the values t and u is not limited to this, but if the combination of the values t and u is decided so that the potential around the potential Vref/2 is not used, reduction in voltage can be achieved as in the successive approximation type A/D converter according to the third embodiment.

Figure 22:
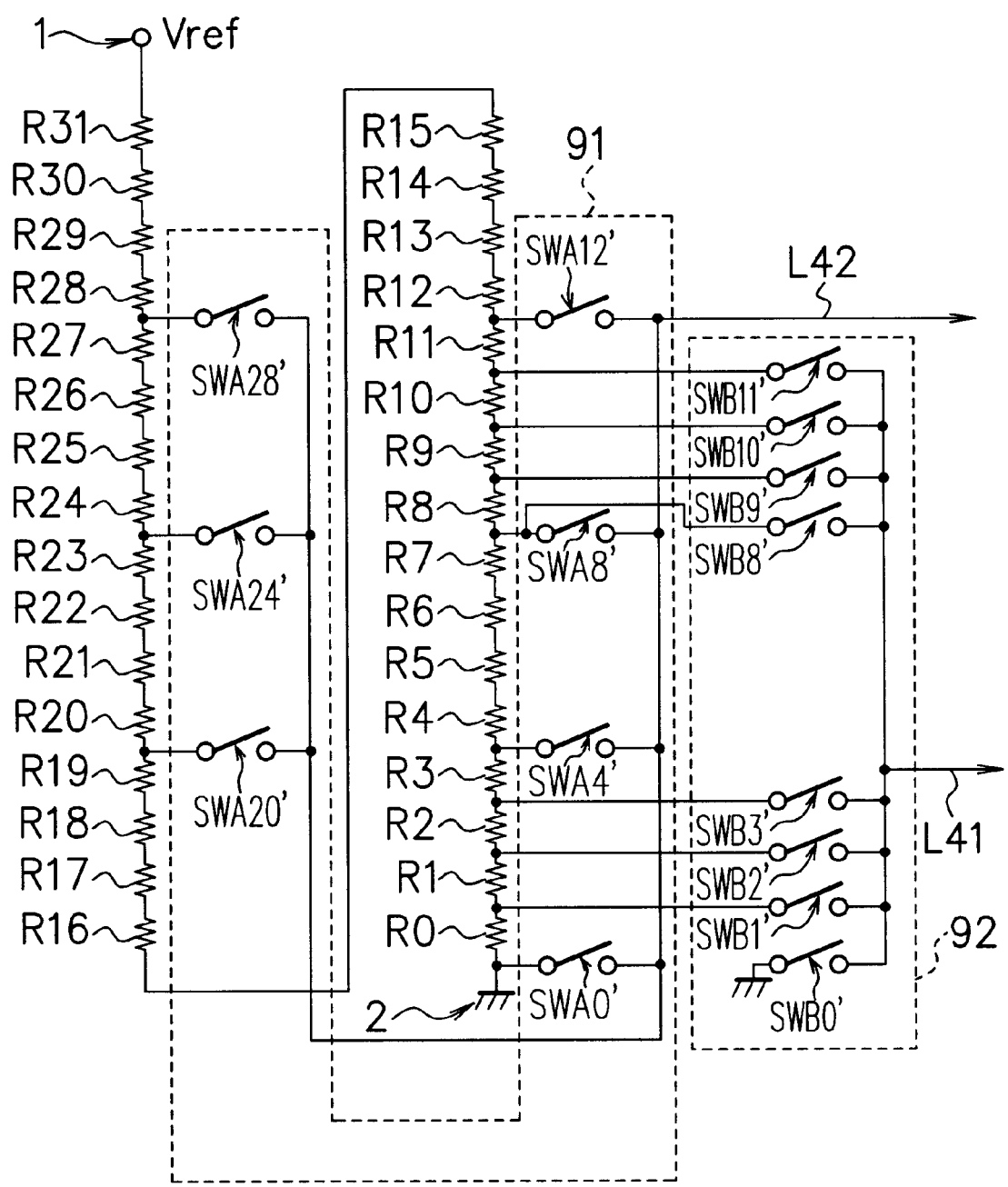
FIG. 22 is a circuit diagram showing another constitution example of the resistor DAC in the fifth embodiment.

FIG. 22 is a circuit diagram showing another constitution example of the resistor type DAC in the fifth embodiment. The resistor type DAC shown in FIG. 22 intends reduction in junction capacitance of an output line L41 and simplification of the control circuit of the switches SWAn' and SWBn', relative to the resistor type DAC shown in FIG. 20.

In FIG. 22, the components and the like having the same functions as the components and the like shown in FIG. 20 are given the same reference numerals and symbols, and the overlapping explanation will be omitted. In FIG. 22, the circuits other than the resistance strings and the first and the second selectors 91 and 92 are not shown, either as in Fig, 20, but the capacitor type DAC, the comparator 31, the successive approximation control circuit 32 and the like are the same as in the circuit constitution shown in FIG. 11.

In FIG. 22, 91 and 92 are the first and the second selector, which correspond to the first and the second selector 81 and 82 shown in FIG. 20, respectively. The first selector 91 includes the switches SWA0', SWA4', SWA8', SWA12', SWA20', SWA24' and SWA28', and the second selector 92 includes switches SWB0' to SWB3' and SWB8' to SWB11'. The output lines L41 and L42 correspond to the output lines L31 and L32 shown in FIG. 20, respectively.

Accordingly, similarly to the resistor type DAC shown in FIG. 20, the resistors R0 to R31 and the first selector 91 constitute one resistor type DAC, the resistors R0 to R31 and the second selector 92 similarly constitute one resistor type DAC, the potentials which the two resistor type DACs supply via the output lines L42 and L41, respectively are added to the potential Vx of the node 4 by the capacitors C1 and C6 (both have the capacitance values Cx) not shown, and the two resistor type DACs function as a resistor type DAC with 5-bit accuracy as a whole.

An operation of the successive approximation type A/D converter having the resistor type DAC shown in FIG. 22 is the same as the operation of the successive approximation type A/D converter having the resistor type DAC shown in FIG. 20, and therefore the explanation thereof will be omitted.

FIG. 23 is a diagram showing function operations of the resistor type DAC with 5-bit accuracy shown in FIG. 22. As shown in FIG. 23, in the resistor type DAC shown in FIG. 22, the potentials supplied via the output lines L41 and L42, respectively are regularly distributed, as compared with the resistor type DAC shown in FIG. 20. Accordingly, the control circuit for the resistor type DAC for selecting the switches SWAn', and SWBn' of the resistor type DAC shown in FIG. 22 can be constituted very easily.

In the resistor type DAC shown in FIG. 20, only the potential from 0 to 10 Vref/32 is used as the potential supplied via the output line L31, and as a result, the number of switches SWBn' connected to the output line L31 is eleven. On the other hand, as shown in FIG. 22, if the potential, for example, up to 11 Vref/32 is used, the number of switches SWBn' connected to the output line L41 can be reduced to eight, and the junction capacitance by junction at the output line 41 can be reduced. In this manner, various modifications can be made in consideration of the number of switches, namely, the junction capacitance, and the effects obtained by reduction in voltage.

Figure 24:
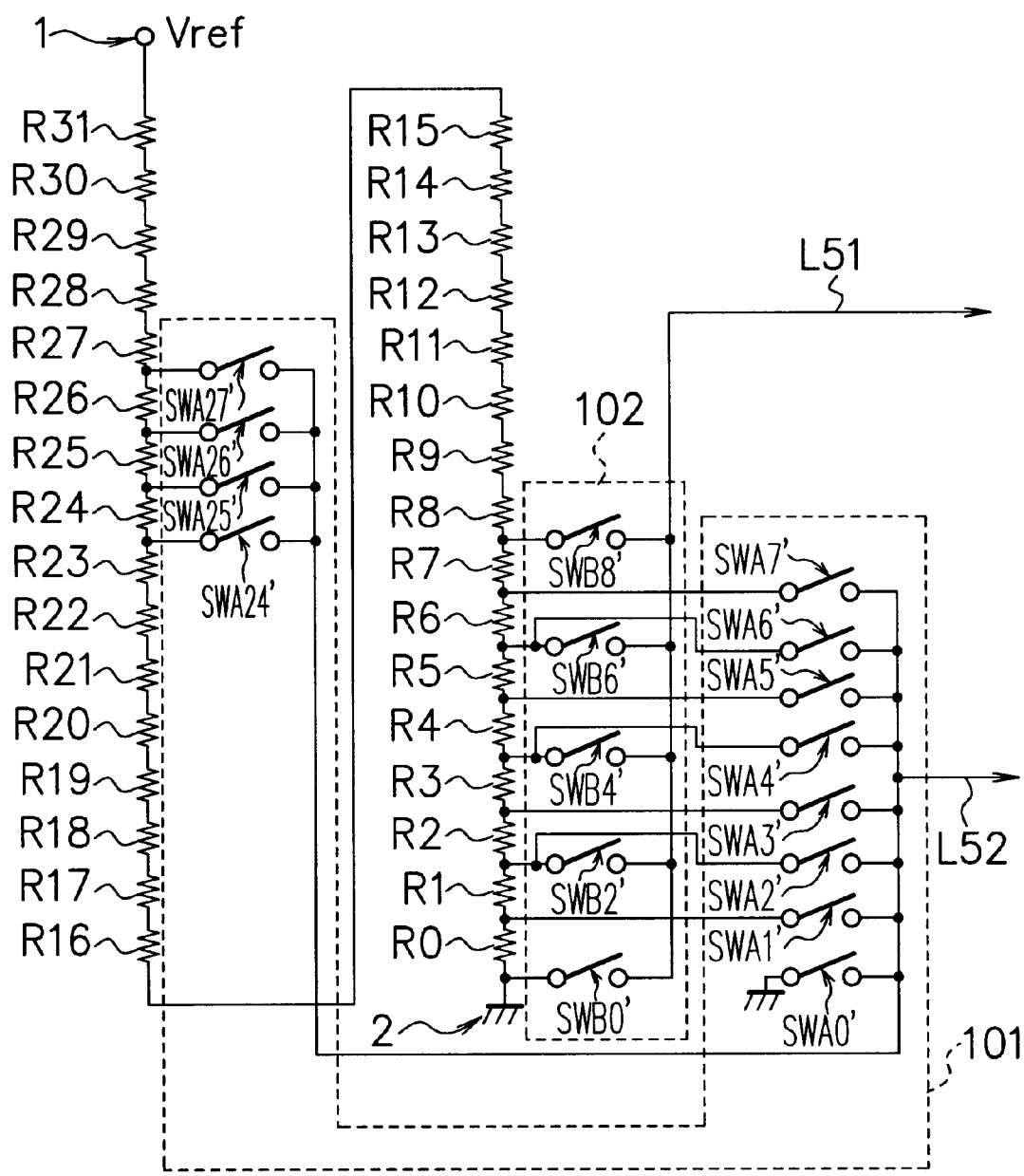
FIG. 24 is a circuit diagram showing another constitution example of the resistor DAC in the fifth embodiment.

FIG. 24 is a circuit diagram showing still another constitution example of the resistor type DAC in the fifth embodiment. The resistor type DAC shown in FIG. 24 is applied to the successive approximation type A/D converter with the resultant capacitance value of the coupling capacitors being 3Cx as shown in FIG. 16. In FIG. 24, the components and the like having the same functions as the components and the like shown in FIG. 20 are given the same reference numerals and symbols, and the overlapping explanation will be omitted. In FIG. 24, the circuits other than resistor strings and a first and a second selector 101 and 102 are not shown, but the capacitor type DAC, the comparator 31, the successive approximation control circuit 32 and the like are the same as in the circuit constitution shown in FIG. 16.

In FIG. 24, 101 and 102 are the first and the second selector, and correspond to the first and the second selector 65 and 66 shown in FIG. 16. The first selector 101 includes switches SWA0' to SWA7' and SWA24' to SWA27', and the second selector 102 includes switches SWB0', SWB2', SWB4', SWB6' and SWB8'. The output lines L51 and L52 correspond to the output lines L11 and L12 shown in FIG. 16, respectively.

FIG. 25 is a diagram showing function operations of the resistor type DAC with 5-bit accuracy shown in FIG. 24. As shown in FIG. 25, the resistor type DAC outputs only the potential of 0 to 8 Vref/32, and the potential of 24 Vref/32 to 27 Vref/32.

Next, operations will be explained.

A sampling operation, and conversion of high-order 4 bits by the capacitor type DAC in a comparison operation are the same as the operations in the fourth embodiment, and therefore the explanation thereof will be omitted, and only the operation of deciding the value of the low-order 5 bits of the digital data will be explained.

The value of the low-order 5 bits is decided by changing the potential Vx of the node 4 in increments of 1/512 of the reference potential Vref by changing the potentials supplied to the one ends of the capacitors C1 (capacitance value Cx) and C7 (capacitance value 2Cx) from the first and the second selector 101 and 102, respectively, and determining whether the potential Vx of the node 4 is higher than the logical threshold voltage VTL, or not.

The potential Vx of the node 4, which is decided by redistribution of the electric charge when the potentials of the output lines L51 and L52 (line L1) are controlled as shown in FIG. 25 will be explained.

As in the fourth embodiment, the resultant capacitance value of the capacitors C2 to C5 the one ends of which are connected to the power supply terminal 1 is assumed to be mCx (m is 0 to 15), and the resultant capacitance value of the capacitors C2 to C5 the one ends of which are connected to the ground is assumed to be (15−m)Cx. The potential supplied to the one end of the capacitor C1 via the output line L52 (line L1) is expressed by u Vref/32 (u is an integer of 0 to 31), and the potential supplied to one end of the capacitor C7 via the output line L31 is expressed by w Vref/32 (w is an integer of 0 to 31).

In this situation, if the electric charge Q expressed by the formula (15) is stored, the potential Vx of the node 4 by redistribution of the electric charge is $$Vx=(16/18)[(m/16)Vref+((2w+u)/512)Vref-Vin]+VTL \quad (21).$$

Here, when 2w+u=v, and the values w and u are selected so that digital code (decimal digit) and the value v become equal as shown in FIG. 25, the formula (21) is expressed by the following formula (22).

$$Vx=(16/18)[(m/16)Vref+(v/512)Vref-Vin]+VTL \quad (22)$$

In FIG. 25, the values of the output lines L51 and L52 (output voltage values) correspond to the values w and u, respectively, and therefore the value of (output line L51)× 2+(output line L52) shown in FIG. 25 is equal to the value v (=2w+u). Accordingly, as in the fourth embodiment, the resistor type DAC shown in FIG. 24 can realize the function of the resistor type DAC equivalent to 5 bits which is constituted not to use the potential around the potential Vref/2 of a center of the resistor string, and a low voltage operation becomes possible as in the fourth embodiment.

In FIG. 24, the combination as shown in FIG. 25 is shown as an example of a distribution method of the potentials supplied via the output lines L52 and L51, namely the values u and w, but it is suitable to decide the values u and w to meet the relation of 2w +u=v, and not to use the potential around the potential Vref/2 of the center of the resistor string, the combination is not limited to the one shown in FIG. 25, and even if the combination is changed, reduction in voltage can be achieved similarly.

Sixth Embodiment

Next, a sixth embodiment will be explained.

Figure 26:
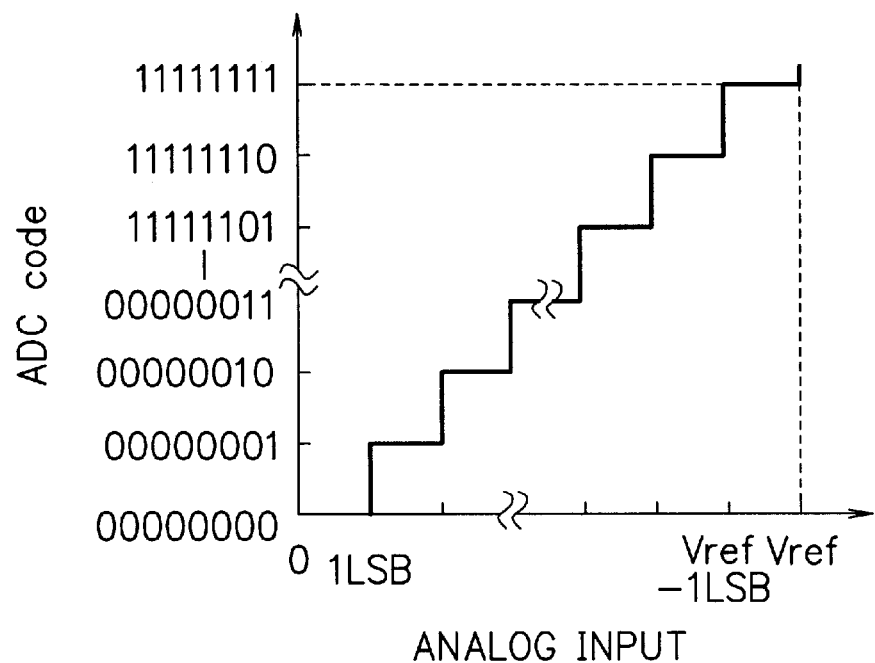
FIG. 26 is a diagram showing an example of a transfer characteristic by an A/D conversion operation.

In the successive approximation type A/D converter shown in the third to fifth embodiments, the transfer characteristic in the A/D conversion operation of analog input signals into digital codes shows the transfer characteristic in which a digital code changes for each potential corresponding to the amount of 0 (V) to 1LSB (the value is not changed in the least significant bit) as shown in FIG. 26. For example, in the 8-bit successive approximation type A/D converter, when the potential Vin of the analog input signal is the potential (Vref/$2^8$)×x to (Vref/$2^8$)×(x+1) (x is 0 to 254), the digital code x is outputted.

Figure 27:
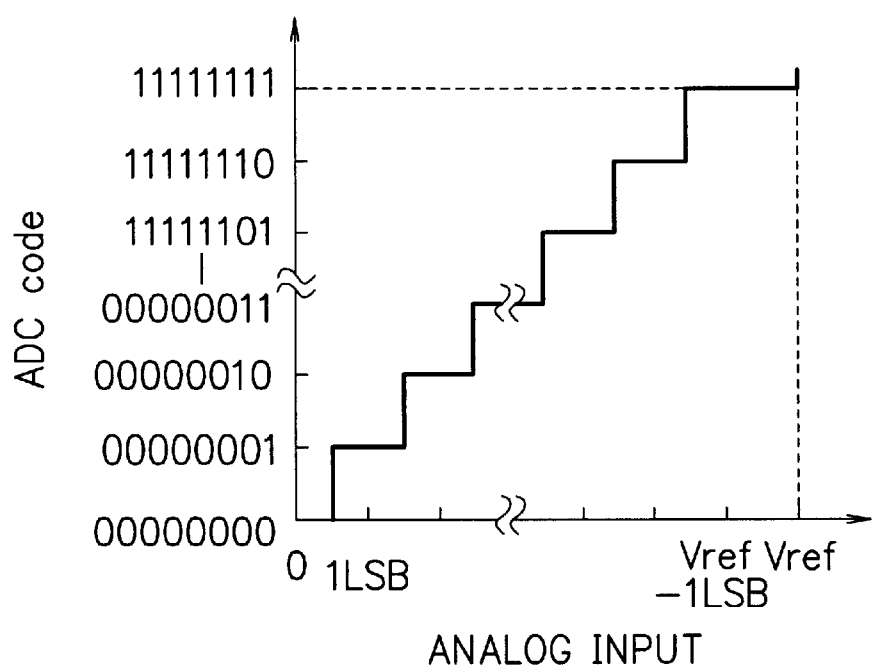
FIG. 27 is a diagram showing another example of the transfer characteristic by the A/D conversion operation.

However, in the A/D converter, as shown in FIG. 27, transition of the digital code takes place at the potential corresponding to the value (x+½) (x is 0 to 254) (for each (x+½) LSB), namely, in some cases, the transfer characteristic of outputting the digital code x when the potential is (Vref/$2^8$)×(x ½) to (Vref/$2^8$)×(x+½) is desired.

The successive approximation type A/D converter according to the sixth embodiment is the successive approximation type A/D converter showing the transfer characteristic as shown in FIG. 27.

Figure 28:
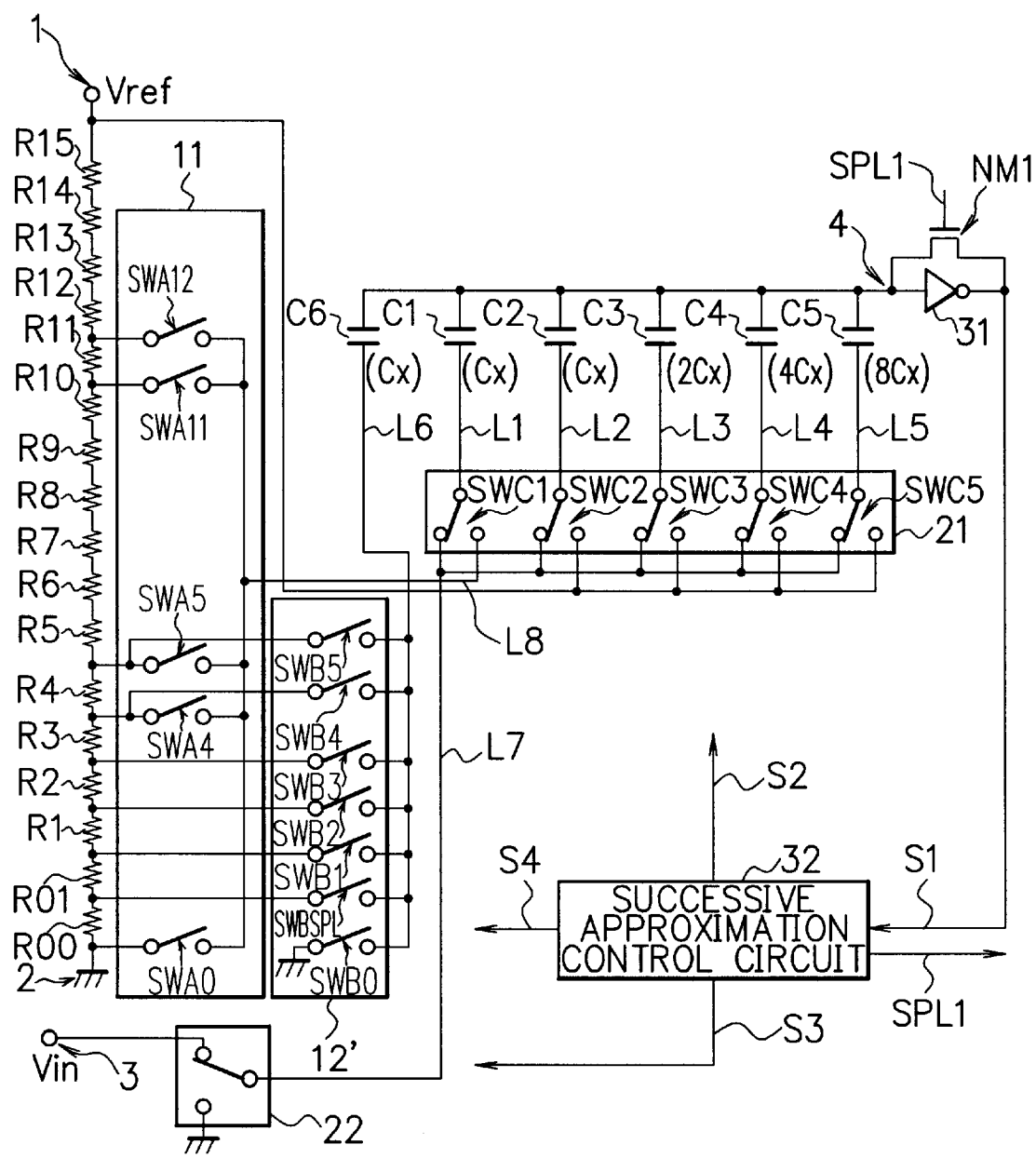
FIG. 28 is a circuit diagram showing a constitution example of a successive approximation type A/D converter according to a sixth embodiment.

FIG. 28 is a circuit diagram showing a constitution example of the successive approximation type A/D converter according to the sixth embodiment of the present invention. In FIG. 28, the components and the like having the same functions as the components and the like shown in FIG. 11 are given the same reference numerals and symbols, and the overlapping explanation will be omitted. The components and the like having the functions not the same as but corresponding to the components and the like shown in FIG. 11 are given the same reference numerals and symbols with ' being given to them.

A different point of the circuit constitution between the successive approximation type A/D converter shown in FIG. 28 and the successive approximation type A/D converter shown in FIG. 11 is that two resistors R00 and R01 are provided instead of the resistor R00 in FIG. 11, and a switch SWBSPL for selecting the potential at an interconnection point of the resistor R00 and the resistor R01 is newly provided in a second selector 12'. The resistance values of the resistors R00 and R01 are each set to be ½ of the resistance value of the resistor R0. Accordingly, the potential between the resistor R00 and the resistor R01 becomes Vref/32.

Next, operations will be explained.

A sampling operation and a comparison operation are the same as in the third embodiment except the point in which only the switch SWBSPL is controlled to close in the second selector 12' and the potential Vref/32 is supplied to one end of the capacitor C6 during a sampling operation.

Accordingly, the electric charge Q stored in the capacitors C1 to C6 by the sampling operation is expressed by the following formula (23).

$$Q = -16Cx(Vin-VTL) + Cx(VTL-Verf/32) \qquad (23)$$

The potential Vx of the node 4 by redistribution of the electric charge during the comparison operation of deciding the value of high-order 4 bits of the digital data is expressed in the following formula (24).

$$Vx = (16/17)[(m/16)Vref - Vref/512 - Vin] + VTL \qquad (24)$$

The potential Vx of the node 4 by redistribution of the electric charge during the comparison operation of deciding the value of low-order 4 bits of the digital data is as expressed in the following formula (25).

$$Vx = (16/17)[(m/16)Vref + ((p+q)/256)Vref - Vref/512 - Vin] + VTL \qquad (25)$$

Further, when p+q=r, and the values p and q are selected so that the digital code (decimal digit) inputted into the resistor type DAC becomes equal to the value r as shown in FIG. 12, the formula (25) is as shown in the following formula (26).

$$Vx = (16/17)[(m/16)Vref + ((r)/256)Vref - Vref/512 - Vin] + VTL \qquad (26)$$

Here, the resultant capacitance value of the capacitors the one ends of which are connected to the power supply terminal 1 in the capacitors C1 to C5 is assumed to be mCx (m is an integer of 0 to 15). The potential supplied to the one end of the capacitor C1 via the output line L8 (line L1) is expressed by p Vref/16 (p is an integer of 0 to 15), and the potential supplied to the one end of the capacitor C6 via the output line L6 is expressed by q Vref/16 (q is an integer of 0 to 15).

Accordingly, as in the third embodiment, the value of the high-order 4 bits of the digital data can be decided based on the formula (24), and the value of low-order 4 bits of the digital data can be decided based on the formula (26). As is understood from the terms (-Vref/512) of the formulas (24) to (26), the potential Vx of the node 4 corresponding to the same digital code can be made lower by the potential of (½) LSB as compared with the successive approximation type A/D converter shown in FIG. 11.

As explained above, by changing part of the circuit constitution of the successive approximation type A/D converter as shown in FIG. 28, the successive approximation type A/D converter having the transfer characteristic which causes the transition of the digital code as shown in FIG. 27 can be constituted. In FIG. 28, the case in which this embodiment is applied to the successive approximation type A/D converter using the 4-bit resistor type DAC shown in FIG. 11 is shown as an example, but this is not restrictive, and the embodiment can be also applied to the successive approximation type A/D converters according to, for example, the fourth and the fifth embodiments.

Seventh Embodiment

Next, a seventh embodiment will be explained.

Figure 29:
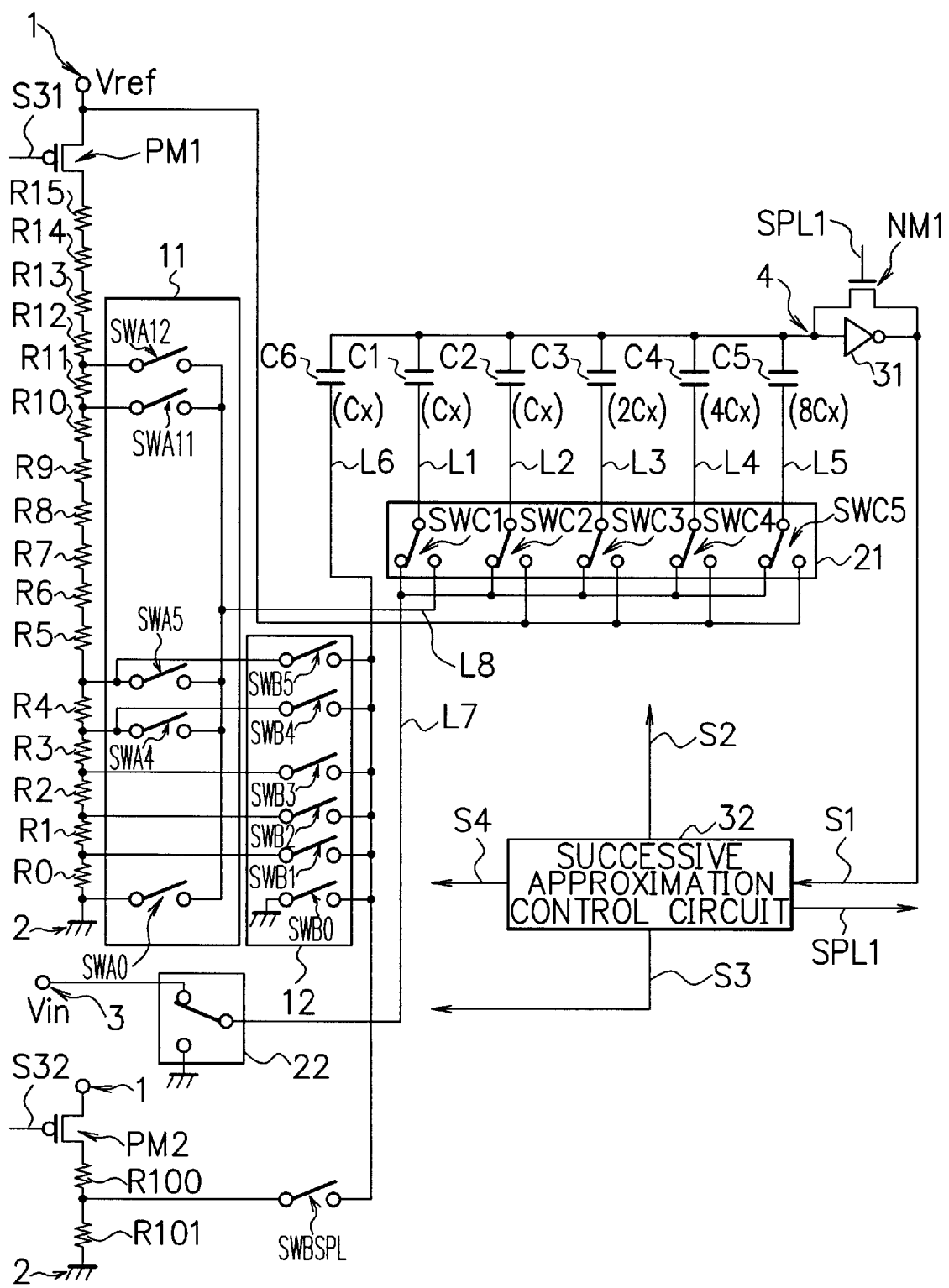
FIG. 29 is a circuit diagram showing a constitution example of a successive approximation type A/D converter according to a seventh embodiment.

FIG. 29 is a circuit diagram showing a constitution example of a successive approximation type A/D converter according to the seventh embodiment of the present invention. In FIG. 29, the components and the like having the same functions as the components and the like shown in FIG. 11 are given the same reference numerals and symbols, and the overlapping explanation will be omitted.

The successive approximation type A/D converter shown in FIG. 29 is the one in which the circuit constitution of the successive approximation type A/D converter shown in FIG. 28 is changed so that power consumption can be reduced while the same functions as the successive approximation type A/D converter according to the sixth embodiment is included. In concrete, the successive approximation type A/D converter shown in FIG. 29 is provided with a switch PM1 (P-channel transistor) between the resistor R15 and the power supply terminal 1 in the resistor type DAC used at the time of a comparison operation. By the switch PM1, a control is conducted so that a current is not passed in the resistor type DAC, which is used in the comparison operation, during a sampling period, and a required potential is supplied with a separately provided resistor type DAC with less current (the resistor type DAC using the resistors having larger resistance values than the resistors constituting the resistor type DAC used at the time of the comparison operation).

The successive approximation type A/D converter shown in FIG. 29 and the successive approximation type A/D converter shown in FIG. 28 differ in the point that when a sampling operation is performed, the potential Vref/32, which is supplied to one end of the capacitor C6 by the switch SWBSPL, is generated by the resistors R100 and R101 provided separately from the resistor type DAC used at the time of the comparison operation.

As described above, in order to constitute the successive approximation type A/D converter having the transfer characteristic as shown in FIG. 27, it is suitable to supply the potential Vref/32 to the one end of the capacitor C6 during the sampling operation. In the successive approximation type A/D converter shown in FIG. 29, if the resistance value of the resistor R100 is made 31 times as high as the resistance value of the resistor R101, the successive approximation type A/D converter having the transfer characteristic as shown in FIG. 27 can be constituted.

Here, a conversion processing time required for A/D conversion in the successive approximation type A/D converter is assumed to be a sampling time required for the sampling operation and a comparison time required for the comparison operation (time required for comparison for one bit×number of bits). For example, in the 8-bit successive approximation type A/D converter as shown in FIG. 29, the conversion processing time is (conversion processing time)= (sampling time)+(time required for comparison for one bit)×8.

Accordingly, in order to realize A/D conversion processing within a desired time, if the ratio of the sampling time and the comparison time is assumed to be (1:1), the ratio of the sampling time and the time required for comparison for one bit is 8:1. Namely, the time constant in the sampling operation and the comparison operation may differ by 8 times. The time constant generally required differs in the sampling operation period and the comparison operation period as above, and a high-speed processing is not required in the sampling operation as compared in the comparison operation.

As is understood from the explanation, in order to realize high-speed A/D conversion processing in the successive approximation type A/D converter shown in FIG. 28, the resistance values of the resistors R00, R01, R1 to R15 cannot be made very large because the time constant is made small. Similarly, in the successive approximation type A/D converter shown in FIG. 29, the resistance values of the resistors R0 to R15 cannot be made larger than a certain value in order to realize high-speed A/D conversion processing.

However, the time constant of the sampling period may be large in some case. If the potential supplied to the one end of the capacitor C6 is generated by the resistors R100 and R101 different from the resistors R0 to R15 in the sampling operation as shown in FIG. 29, the total resistance value of the resistors R100 and R101 can be made larger than the total resistance value of the resistors R0 to R15. Accordingly, during the sampling operation, a current passing through the resistors R100 and R101 can be made smaller than a current passing through the resistors R00, R01, R1 to R15 in the successive approximation type A/D converter shown in FIG. 28, and power consumption can be reduced. For example, if the total resistance value of the resistors R101 and R101 is made eight times as large as the total resistance value of the resistors R0 to R15, the current passing through the resistances R100 and R101 in the sampling period can be made ⅛ of the current passing through the resistors R0 to R15 during the comparison operation.

In the successive approximation type A/D converter shown in FIG. 29, the switch PM1 is provided, and in the period of the sampling operation, a gate signal 35 of the switch PM1 is made "H" to bring the switch PM1 into an OFF (open) state, while a gate signal 36 of a switch PM2 (P-channel transistor) is made "L" to bring the switch PM2 into an ON (close) state. Consequently, in the sampling operation, a current is not passed through the resistors R0 to R15, and the potential generated by the resistors R100 and R101 is supplied to one end of the capacitor C6.

Accordingly, the successive approximation type A/D converter shown in FIG. 29 can obtain the same characteristic as the successive approximation type A/D converter shown in FIG. 28. If the switch PM1 is brought into the ON state immediately before the comparison operation is started, it can be operated similarly to the successive approximation type A/D converter shown in FIG. 28.

By the above constitution, power consumption by the resistors is reduced during the sampling operation, and an average current in the entire conversion period can be reduced.

Figure 30:
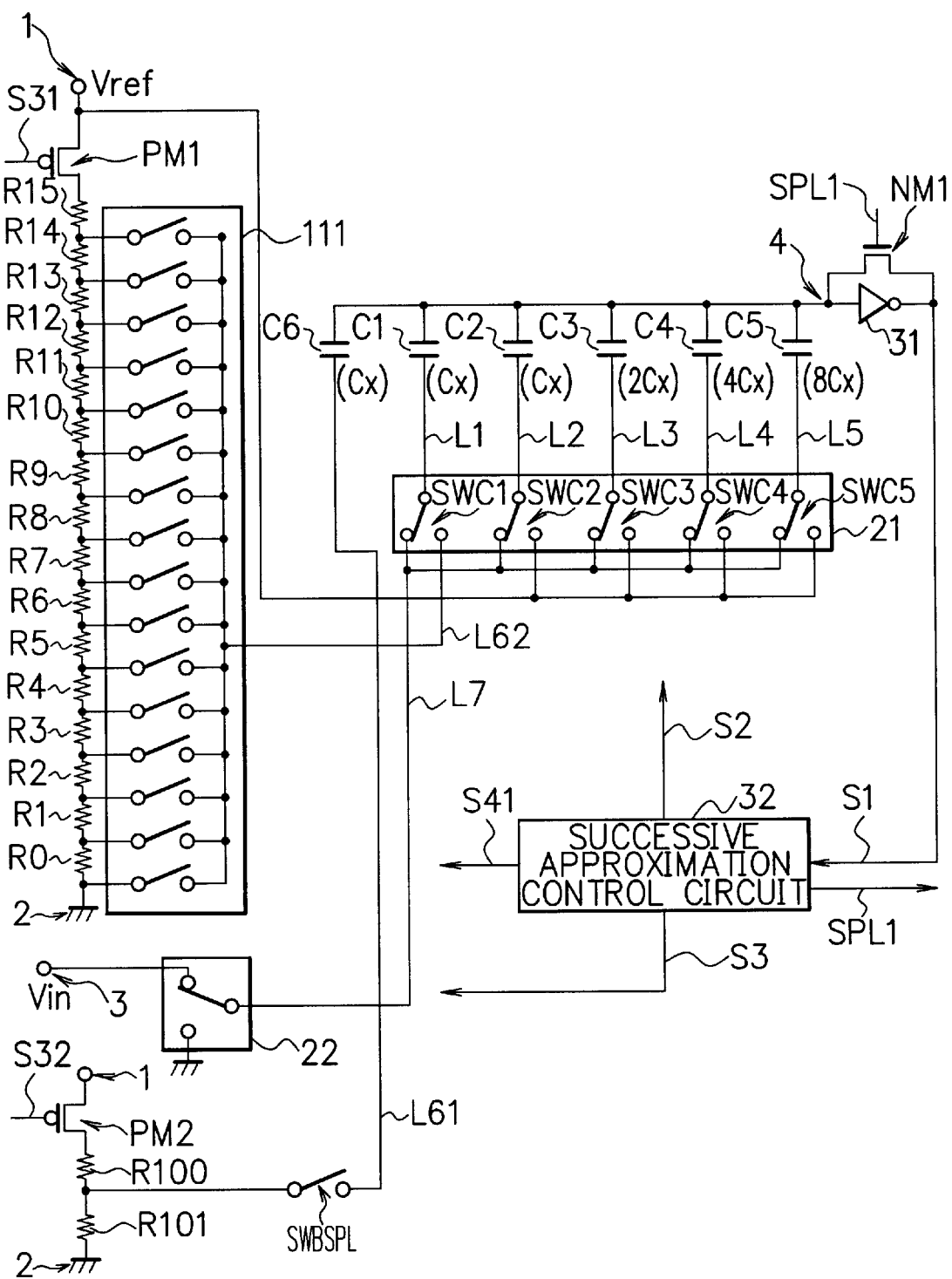
FIG. 30 is a circuit diagram showing another constitution example of the successive approximation type A/D converter according to the seventh embodiment.

FIG. 30 is a circuit diagram showing another constitution example of the successive approximation type A/D converter according to the seventh embodiment. In FIG. 30, the components and the like having the same function as the components and the like shown in FIG. 11 and FIG. 29 are given the same reference numerals and symbols, and the overlapping explanation will be omitted.

The successive approximation type A/D converter shown in FIG. 30 has the same function as the successive approximation type A/D converter according to the sixth embodiment, and has the circuit constitution of the successive approximation type A/D converter shown in FIG. 2, which is changed to make it possible to reduce the power consumption. The successive approximation type A/D converter shown in FIG. 30 is provided with the switch PM1 at the resistor type DAC used at the time of the comparison operation as in the successive approximation type A/D converter shown in FIG. 29. Thereby, during the period of the sampling operation, the control is conducted so as not to pass a current to the resistor type DAC which is used at the time of the comparison operation, and a necessary potential is supplied with a separately provided resistor type DAC with less current.

The successive approximation type A/D converter shown in FIG. 30 makes the resistance value of the resistor R100 31 times as large as the resistance value of the resistor R101, and supplies the potential Vref/32 to the one end of the capacitor C6 by the switch SWBSPL when the sampling operation is performed. It is the same as the successive approximation type A/D converter shown in FIG. 29 that the total resistance value of the resistors R100 and R101 is made larger (for example, by 8 times) than the total resistance value of the resistors R0 to R15.

The successive approximation type A/D converter shown in FIG. 30 brings the switch PM1 into the OFF (open) state and the switch PM2 into the ON (closed) state during the period of the sampling operation. Consequently, the current is not passed through the resistors R0 to R15, and the potential generated by the resistors R100 and R101 is supplied to the one end of the capacitor C6, in the sampling operation. Immediately before the comparison operation is started, the switch PM1 is brought into the ON state.

As constituted as above, the successive approximation type A/D converter having the transfer characteristic as shown in FIG. 27 can be constituted. Further, power consumption with the resistors in the sampling operation is reduced, and average current as the entire conversion operation can be reduced, thus making it possible to reduce power consumption.

In the first to the seventh embodiments, the successive approximation type A/D converter of 8 bits including the resistor DAC with 4-bit accuracy, and the 9-bit successive approximation type A/D converter including the resistor DAC with 5-bit accuracy are explained, but the present invention is not limited to them, and it can be applied to the successive approximation type A/D converter including the resistor DAC having arbitrary bit accuracy.

In the third to the seventh embodiments, the output node from the resistor string, switches and the like are not included between the resistors the interconnection points of which are at the potential which is not used as an output, but the output node, the switch and the like may be provided and they do not have to be used.

It should be noted that the above-described embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As explained thus far, according to the present invention, a plurality of resistor type D/A conversion circuits are respectively controlled so that the potential which is the result of adding the output potentials of the resistor type D/A conversion circuits by the coupling capacitors correspondingly provided becomes equal to the potential corresponding to the value of low-order M bits of the comparison digital data out of the potential which is the result of dividing the power supply voltage into $2^M$. As a result, a plurality of resistor type D/A conversion circuits are controlled so that the output potentials of a plurality of resistor type D/A conversion circuits avoid the potential area in which the ON resistance is large when it is outputted, and the output potentials in the potential area with small ON resistance are added, whereby the potential corresponding to the value of the low-order M bits of the comparison digital data can be obtained. Accordingly, as compared at the same ON resistance as the conventional successive approximation type A/D converter, the successive approximation type A/D converter can be operated at lower power supply voltage.

The initial potential supply circuit for outputting predetermined potential to one of a plurality of coupling capacitors during sampling of the input analog signal is included separately from the resistor type D/A conversion circuit used in the comparison operation, and in the sampling operation, the initial potential supply circuit with less consumption current is used, whereby power consumption can be reduced considering average in the entire A/D conversion period.

What is claimed is:

1. An A/D converter, comprising:
   a capacitor type D/A conversion circuit including a capacitor array composed of a plurality of capacitors for sampling an input potential and storing electric charge;
   a first resistor type D/A conversion circuit for generating a desired potential by potential division;
   a second resistor type D/A conversion circuit for generating a desired potential by potential division;
   a first signal path for connecting an output terminal of said first resistor type D/A conversion circuit to an output terminal of said capacitor type D/A conversion circuit by capacity coupling;
   a second signal path for connecting an output terminal of said second resistor type D/A conversion circuit to said output terminal of said capacitor type D/A conversion circuit by capacity coupling; and
   a comparing circuit for determining whether an output potential of said capacitor type D/A conversion circuit is higher or lower than the input potential.

2. The A/D converter according to claim 1, wherein out of all bits to be subjected to A/D conversion, said capacitor type D/A conversion circuit corresponds to a number of bits from the most significant bit, said first resistor type D/A conversion circuit corresponds to a previously decided number of bits following the number of bits, and said second resistor type D/A conversion circuit corresponds to a number of bits following the previously decided number of bits.

3. The A/D converter according to claim 1, wherein said first resistor type D/A conversion circuit is connected to the output terminal of the capacitor type D/A conversion circuit via a capacitor having a number times as much as minimum unit capacitance of said plurality of capacitors, and a range of an output potential of the first resistor type D/A conversion circuit exists only in either of an upper half or lower half among a range from a first potential to a second potential, said range from the first potential to the second potential being divided by a resistor string.

4. The A/D converter according to claim 1, further comprising:
   a resistor string shared by said first resistor type D/A conversion circuit and said second resistor type D/A conversion circuit for potential division; and
   a switch circuit for selectively outputting a potential divided by said resistor string.

5. The A/D converter according to claim 1, wherein said capacitor type D/A conversion circuit includes:
   a first switch circuit for selectively connecting one ends of said plurality of capacitors to any one of the input potential, a ground potential, and a reference potential; and
   a second switch circuit for switching connection or disconnection of the other ends of said plurality of capacitors to or from the ground, and the other ends of said plurality of capacitors are connected to an input terminal of said comparing circuit.

6. The A/D converter according to claim 1, further comprising a control circuit for controlling said capacitor type D/A conversion circuit, said first resistor type D/A conversion circuit, and said second resistor type D/A conversion circuit in accordance with an output of said comparing circuit.

7. The A/D converter according to claim 6, wherein said control circuit decides digital data being an output of A/D conversion in order from the most significant bit by controlling said capacitor type D/A conversion circuit, said first resistor type D/A conversion circuit, and said second resistor type D/A conversion circuit in sequence.

8. The A/D converter according to claim 1, wherein said first resistor type D/A conversion circuit and said second resistor type D/A conversion circuit share a resistor string,
   said first resistor type D/A conversion circuit includes a first switch for selecting one of potentials among a first group out of a plurality of potentials generated by the shared resistor string, and said second resistor type D/A conversion circuit includes a second switch for selecting one of potentials among a second group out of the plurality of potentials generated by the shared resistor string.

9. An A/D converter, comprising:

a capacitor type D/A conversion circuit for outputting a first comparison potential correspondingly to a value of high-order L bit (L is an integer) of inputted comparison digital data;

a plurality of resistor type D/A conversion circuits for outputting potentials obtained by dividing supplied power supply voltage in combination, respectively, correspondingly to a value of low-order M bit (M is an integer) of the comparison digital data;

a plurality of coupling capacitors provided correspondingly to said plurality of resistor type D/A conversion circuits, each of one ends of the plurality of coupling capacitors being connected to a corresponding output terminal of said resistor type D/A conversion circuit, and the other ends being commonly connected to an output terminal of said capacitor type D/A conversion circuit;

a comparing circuit for comparing a sum of a second comparison potential obtained by weighting and adding the output potentials of said plurality of resistor type D/A conversion circuits based on capacitance values of said corresponding coupling capacitors, and the first comparison potential, with a potential of an input analog signal inputted from the outside; and a control circuit for deciding a value of output digital data corresponding to the potential of the input analog signal by each bit and generating new comparison digital data, based on the comparison result by said comparing circuit, repeatedly performing control of said capacitor type D/A conversion circuit and said plurality of resistor type D/A conversion circuits based on sequentially generated comparison digital data, and converting the input analog signal into an output digital signal of (L+M) bits and outputting the output digital signal, wherein said control circuit controls said plurality of resistor type D/A conversion circuits so that a potential corresponding to the value of the low-order M bit of the comparison digital data out of potentials obtained by dividing the power supply voltage into $2^M$ and the second comparison potential become equal to each other.

10. The A/D converter according to claim 9, wherein when at least the potential corresponding to the value of the low-order M bit of the comparison digital data is at a potential of ½ of the power supply voltage, said control circuit controls said plurality of resistor type D/A conversion circuits so that potentials different from the potential of ½ of the power supply voltage are outputted from said plurality of resistor type D/A conversion circuits, respectively.

11. The A/D converter according to claim 9, wherein capacitance values of said plurality of coupling capacitors are capacitance values of a minimum capacitance value in capacitors constituting said capacitor type D/A conversion circuit multiplied by an integer.

12. The A/D converter according to claim 9, further comprising:

a first resistor type D/A conversion circuit, and a second resistor type D/A conversion circuit, as said plurality of resistor type D/A conversion circuits; and a first coupling capacitor corresponding to said first resistor type D/A conversion circuit, and a second coupling capacitor corresponding to said second resistor type D/A conversion circuit, as said plurality of coupling capacitors, wherein each capacitance value of said first and second coupling capacitors is equal to a minimum capacitance value in capacitors constituting said capacitor type D/A conversion circuit.

13. The A/D converter according to claim 12, wherein when at least the potential corresponding to the value of the low-order M bit of the comparison digital data is at a potential of ½ of the power supply voltage, said control circuit controls said plurality of resistor type D/A conversion circuits so that potentials different from the potential of ½ of the power supply voltage are outputted from said plurality of resistor type D/A conversion circuits, respectively.

14. The A/D converter according to claim 12, wherein said plurality of resistor type D/A conversion circuits output potentials in a range from 0 to a potential ⅓ times as much as the power supply voltage, and a range from a potential ⅔ times as much as the power supply voltage to the power supply voltage, respectively.

15. The A/D converter according to claim 9, further comprising:

a first resistor type D/A conversion circuit, and a second resistor type D/A conversion circuit, as said plurality of resistor type D/A conversion circuits; and a first coupling capacitor corresponding to said first resistor type D/A conversion circuit, and having a capacitance value equal to a minimum capacitance value in capacitors constituting said capacitor type D/A conversion circuit, and a second coupling capacitor corresponding to said second resistor type D/A conversion circuit and having a capacitance value double the minimum capacitance value in the capacitors constituting said capacitor type D/A conversion circuit, as said plurality of coupling capacitors.

16. The A/D converter according to claim 15, wherein when at least the potential corresponding to the value of the low-order M bit of the comparison digital data is at a potential of ½ of the power supply voltage, said control circuit controls said plurality of resistor type D/A conversion circuits so that potentials different from the potential of ½ of the power supply voltage are outputted from said plurality of resistor type D/A conversion circuits.

17. The A/D converter according to claim 15, wherein said resistor type D/A conversion circuits output only potentials in a range from 0 to a potential ¼ times as much as the power supply voltage, and in a range from a potential ¾ times as much as the power supply voltage to the power supply voltage.

18. The A/D converter according to claim 9, wherein a D/A conversion circuit with 4-bit accuracy is constituted by said plurality of resistor type D/A conversion circuits.

19. The A/D converter according to claim 9, wherein a D/A conversion circuit with 5-bit accuracy is constituted by said plurality of resistor type D/A conversion circuits.

20. The A/D converter according to claim 9, wherein said resistor type D/A conversion circuits do not output a potential of at least ½ of the power supply voltage.

21. The A/D converter according to claim 9, wherein said resistor type D/A conversion circuit comprising:

a plurality of resistors connected in series between a power supply terminal for supplying the power supply voltage and a ground terminal; and a plurality of switch circuits for selectively outputting potentials obtained by dividing by the plurality of resistors in accordance with a control from said control circuit, wherein said switch circuit is a transfer gate constituted of one P-channel transistor and one N-channel transistor.

22. The A/D converter according to claim 21, wherein said switch circuit is constituted of one N-channel transistor.

23. The A/D converter according to claim 9, wherein when the input analog signal is sampled, one of said plurality of resistor type D/A conversion circuits outputs a potential of ½ of a potential corresponding to the least significant bit of the comparison digital data to said coupling capacitor.

24. The A/D converter according to claim 9, further comprising an initial potential supply circuit for outputting a potential of ½ of a potential corresponding to the least significant bit of the comparison digital data to one of said plurality of coupling capacitors when the input analog signal is sampled.

25. The A/D converter according to claim 24, wherein said initial potential supply circuit has a plurality of resistors connected in series between a power supply terminal for supplying the power supply voltage and a ground terminal, and a sum of resistance values of the resistors included in said initial potential supply circuit is larger than a sum of resistance values included in said resistor type D/A conversion circuit.

26. An A/D converter, comprising:

a capacitor type D/A conversion circuit for outputting a first comparison potential correspondingly to a value of high-order L bit (L is an integer) of inputted comparison digital data;

a resistor type D/A conversion circuit for outputting a second comparison potential correspondingly to a value of low-order M bit (M is an integer) of the comparison digital data;

a coupling capacitor one end of which being connected to an output terminal of said resistor type D/A conversion circuit and the other end of which being connected to an output terminal of said capacitor type D/A conversion circuit;

a comparing circuit for comparing a sum of the first comparison potential and the second comparison potential, with a potential of an input analog signal inputted from the outside;

a control circuit for deciding a value of output digital data corresponding to the potential of the input analog signal by each bit and generating new comparison digital data, based on the comparison result by said comparing circuit, repeatedly performing control of said capacitor type D/A conversion circuit and said resistor type D/A conversion circuit based on sequentially generated comparison digital data, and converting the input analog signal into an output digital signal of (L+M) bits and outputting the output digital signal; and an initial potential supply circuit for outputting a potential of ½ of a potential corresponding to the least significant bit of the comparison digital data to said coupling capacitor when the input analog signal is sampled.

* * * * *